United States Patent
Anderson et al.

(10) Patent No.: US 11,360,135 B2
(45) Date of Patent: *Jun. 14, 2022

(54) ATOM-BASED ELECTROMAGNETIC FIELD SENSING ELEMENT AND MEASUREMENT SYSTEM

(71) Applicant: Rydberg Technologies Inc., Ann Arbor, MI (US)

(72) Inventors: David A. Anderson, Ann Arbor, MI (US); Georg A. Raithel, Ann Arbor, MI (US); Eric G. Paradis, Ann Arbor, MI (US); Rachel E. Sapiro, Ann Arbor, MI (US)

(73) Assignee: Rydberg Technologies Inc., Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/087,011

(22) Filed: Nov. 2, 2020

(65) Prior Publication Data
US 2021/0048465 A1 Feb. 18, 2021

Related U.S. Application Data

(63) Continuation of application No. 16/222,384, filed on Dec. 17, 2018, now Pat. No. 10,823,775.
(Continued)

(51) Int. Cl.
*G01R 29/08* (2006.01)
(52) U.S. Cl.
CPC ................. *G01R 29/0878* (2013.01)
(58) Field of Classification Search
USPC ....................................................... 324/300
See application file for complete search history.

(56) References Cited

U.S. PATENT DOCUMENTS

| 4,024,396 A | 5/1977 | Hill et al. |
| 4,600,840 A | 7/1986 | Chutjian |

(Continued)

FOREIGN PATENT DOCUMENTS

| CN | 107179450 A | 9/2017 |
| EP | 3588106 A1 | 1/2020 |
| WO | WO 2017/109475 A1 | 6/2017 |

OTHER PUBLICATIONS

International Searching Authority/KR, International Search Report and Written Opinion of the International Searching Authority, Application No. PCT/US2018/066006, dated Apr. 18, 2019, 15 pages.
(Continued)

*Primary Examiner* — Rodney E Fuller
(74) *Attorney, Agent, or Firm* — Sunstein LLP

(57) ABSTRACT

Methods and apparatus for sensing or measuring an electromagnetic field. The method entails excitation into a distribution of Rydberg states of atoms of a gas occupying a test volume coextensive with the electromagnetic field. Transmission along a path traversing the test volume of at least one probe beam of electromagnetic radiation is measured at one or more frequencies overlapping a spectral feature, and a physical characteristic of the electromagnetic field is derived on the basis of variation of the spectral feature. In various embodiments, the electromagnetic field may be place in interferometric relation with another electromagnetic field. Time-varying electric field amplitude, frequency, phase and noise spectral distribution may be measured, and thus AM and FM modulated fields, as well as magnetic fields of about 1 Tesla. The apparatus for measuring the electromagnetic field may be unilaterally coupled to a probe field and detector or array of detectors.

56 Claims, 28 Drawing Sheets

Related U.S. Application Data

(60) Provisional application No. 62/607,034, filed on Dec. 18, 2017, provisional application No. 62/727,764, filed on Sep. 6, 2018.

(56) References Cited

U.S. PATENT DOCUMENTS

| | | | |
|---|---|---|---|
| 4,983,844 | A | 1/1991 | Korevaar |
| 5,506,415 | A | 4/1996 | Parks et al. |
| 5,945,649 | A | 8/1999 | Scheibner et al. |
| 6,008,496 | A | 12/1999 | Winefordner et al. |
| 7,859,350 | B1 | 12/2010 | Schwindt et al. |
| 8,054,073 | B2 | 11/2011 | Tuchman |
| 8,212,556 | B1 | 7/2012 | Schwindt et al. |
| 8,331,869 | B2 | 12/2012 | Foegelle |
| 8,638,177 | B2 | 1/2014 | Nishida |
| 8,760,159 | B2 | 6/2014 | Tuchman |
| 9,970,973 | B2 | 5/2018 | Anderson et al. |
| 10,216,062 | B2 | 2/2019 | Kiffner et al. |
| 10,509,065 | B1 | 12/2019 | Shaffer |
| 10,823,775 | B2 * | 11/2020 | Anderson .......... G01R 29/0878 |
| 2003/0198271 | A1 | 10/2003 | Matveev |
| 2004/0012388 | A1 | 1/2004 | Pedersen |
| 2004/0156407 | A1 | 8/2004 | Beausoleil et al. |
| 2009/0074016 | A1 | 3/2009 | Mamer et al. |
| 2009/0256638 | A1 | 10/2009 | Rosenbluh et al. |
| 2011/0057737 | A1 | 3/2011 | Aoyama et al. |
| 2011/0057767 | A1 | 3/2011 | Ryu et al. |
| 2011/0279115 | A1 | 11/2011 | Tuchman |
| 2013/0270434 | A1 | 10/2013 | Nelson et al. |
| 2015/0192532 | A1 | 7/2015 | Clevenson et al. |
| 2016/0363617 | A1 | 12/2016 | Anderson et al. |
| 2019/0187198 | A1 | 6/2019 | Anderson et al. |

OTHER PUBLICATIONS

Jonathon A. Sedlacek et al., *Microwave electrometry with Rydberg atoms in a vapour cell using bright atomic resonances*, Nature Physics, vol. 8, Nov. 2012, pp. 819-824.
A.K. Mohapatra et al., *Coherent Optical Detection of Highly Excited Rydberg States Using Electromagnetically Induced Transparency*, PRL 98, 113003, Mar. 16, 2007, 4 pages.
M.G. Bason et al., *Enhanced electric field sensitivity of rf-dressed Rydberg dark states*, New Journal of Physics 12, 065015, Jun. 28, 2010, 11 pages.
Joshua A. Gordon et al., *Millimeter wave detection via Autler-Townes splitting in rubidium Rydberg atoms*, Applied Physics Letters 105, 024104, Jul. 17, 2014, 5 pages.
D.A. Anderson et al., *Two-photon microwave transitions and strong-filed effects in a room-temperature Rydberg-atom gas*, Physical Review A 90, 043419, Oct. 29, 2014, 6 pages.
Christopher L. Holloway et al., *Sub-wavelength imaging and field mapping via electromagnetically induced transparency and Autler-Townes splitting in Rydberg atoms*, Applied Physics Letters 104, 244102, Jun. 16, 2014, 5 pages.
Christopher L. Holloway et al., *Broadband Rydberg Atom-Based Electric-Field Probe for SI-Traceable, Self-Calibrated Measurements*, IEEE Transactions on Antennas and Propagation, vol. 62, No. 12, Dec. 2014, pp. 6169-6182.
J. Sedlacek et al., *Atom Based Vector Microwave Electrometry Using Rubidium Rydberg Atoms in a Vapor Cell*, arXiv:1304.4299v1 [physics.atom-ph], Apr. 15, 2013, 5 pages.
Geert Vrijsen, *Collective Quantum Behavior of Atomic Ensembles in High-Finesse Optical Cavities*, Dissertation, Stanford University, Dec. 2011, 112 pages.
https://cdn.rohde-schwarz.com/dk/seminars_workshops/BaseStationInstallationandAntennaTesting_2017_V1_Shared_DK.pdf retrieved Nov. 7, 2018, 40 pages.
*Analyzing RFoCPRI™ at Fiber-Based Cell Sites*, https://www.viavisolutions.com/en-us/Literature/analyzing-rfocpri-fiber-based-cell-sites-application-notes-en. Created Aug. 31, 2015, 2 pages.

Haoquan Fan et al., *Atom based RF electric field sensing*, J. Phys. B: At. Mol. Opt. Phys. 48 202001, Sep. 9, 2015, 16 pages.
H.Q. Fan et al., *Dispersive radio frequency electrometry using Rydberg atoms in a prism-shaped atomic vapor cell*, J. Phys. B: At. Mol. Opt. Phys. 49 104004, May 5, 2016, 7 pages.
Haoquan Fan et al., *Effect of Vapor-Cell Geometry on Rydberg-Atom-Based Measurements of Radio-Frequency Electric Fields*, Physical Review Applied 4, 044015, Oct. 22, 2015, 7 pages.
H.Q. Fan et al., *Sub-wavelength microwave electric field imaging using Rydberg atoms inside atomic vapor cells*, arXiv: 1403.3596v.1 [physics.atom-ph] Mar. 14, 2014, 5 pages.
Christopher L. Holloway et al., *Atom-Based RF Electric Field Measurements: An Initial Investigation of the Measurement Uncertainties*, IEEE International Symposium on Electromagnetic Compatibility, 2015, pp. 467-472.
Santosh Kumar et al., *Atom-Based Sensing of Weak Radio Frequency Electric Fields Using Homodyne Readout*, Scientific Reports 7:42981, Feb. 20, 2017, 10 pages.
Santosh Kumar et al., *Rydberg-atom based radio-frequency electrometry using frequency modulation spectroscopy in room temperature vapor cells*, Optics Express, Vo. 25, No. 8, Apr. 17, 2017, 13 pages.
Ulf Schnars, *Direct phase determination in hologram interferometry with use of digitally recorded holograms*, J. Opt. Soc. Am. A, vol. 11, No. 7, Jul. 1994, 5 pages.
J. Sedlacek et al., *Quantum Assisted Electrometry using Bright Atomic Resonances*, arXiv: 1205.4461v1 [physics.atom-ph], May 20, 2012, 15 pages.
J.P. Shaffer et al., *A read-out enhancement for microwave electric field sensing with Rydberg atoms*, Proc. of SPIE vol. 10674, 106740C-1, 2018, 11 pages.
David Alexander Anderson et al., *A self-calibrating SI-traceable broadband Rydberg atom-based radio-frequency electric field probe and measurement instrument*, arXiv:1910.07107v2 [physics.atom-ph], Oct. 18, 2019, 12 pages.
David H. Meyer et al., *Digital communication with Rydberg atoms and amplitude-modulated microwave fields*, Applied Physics Letters 112, 211108, 2018, 5 pages.
A.B. Deb et al., *Radio-over-fiber using an optical antenna based on Rydberg states of atoms*, Applied Physics Letters 112, 211106, 2018, 4 pages.
Christopher L. Holloway et al., *A quantum-based power standard: Using Rydberg atoms for a SI-traceable radio-frequency power measurement technique in rectangular waveguides*, Applied Physics Letters 113, 094101, 2018, 5 pages.
Matt T. Simons et al., *Fiber-coupled Vapor Cell for a Portable Rydberg Atom-based RF Electric Field Sensor*, Research Article, Applied Optics, Compiled Jun. 29, 2018, 5 pages.
V. Zhelyazkova et al., *Probing interactions between Rydberg atoms with large electric dipole moments in amplitude-modulated electric fields*, Physical Review A 92, 011402(R), Jul. 8, 2015, 5 pages.
Matt T. Simons et al., *Using frequency detuning to improve the sensitivity of electric field measurements via electromagnetically induced transparency and Autler-Townes splitting in Rydberg atoms*, Applied Physics Letters 108, 174101, 2016, 5 pages.
L. Ma et al., *Paschen-Back effects and Rydberg-state diamagnetism in vapor-cell electromagnetically induced transparency*, Physical Review A 95, 061804(R), 2017, 6 pages.
David A. Anderson et al., *Quantum-optical spectroscopy for plasma electric field measurements and diagnostics*, arXiv:1712.08717v1 [physics.atoms-ph], Dec. 23, 2017 23 pages.
D.A. Anderson et al., *Continuous-frequency measurements of high-intensity microwave electric fields with atomic vapor cells*, Applied Physics Letters 111, 053504 (2017), 5 pages.
D.A. Anderson et al., *An atomic receiver for AM and FM radio communication*, arXiv:1808.08589v1 [physics.atom-ph], Aug. 26, 2018, 6 pages.
D.A. Anderson et al., *A vapor-cell atomic sensor for radio-frequency field detection using a polarization-selective field enhancement resonator*, Applied Physics Letters 113, 073501, 2018, 5 pages.
S. George et al., *Pulsed high magnetic field measurement via a Rubidium vapor sensor*, arXiv:1704.00004v1 [physics.atom-ph] Mar. 31, 2017, 10 pages.

(56) References Cited

OTHER PUBLICATIONS

P. Paris et al., *Intensity ratio of spectral bands of nitrogen as a measure of electric field strength in plasmas*, J. Phys. D: Appl. Phys. 38, 2005, pp. 3894-3899.

D.A. Anderson et al., *Optical measurements of strong microwave fields with Rydberg atoms in a vapor cell*, arXiv:1601.02535v1 [physics.atom-ph] Jan. 11, 2016, 7 pages.

Manias Gustafsson et al. *OTA Methods for 5G BTS Testing—Survey of Potential Approaches*, $32^{nd}$ URSI GASS, Montreal, Canada, Aug. 19-26, 2017, 4 pages.

Simon Scott, *Three-Dimensional Microwave Imaging for Indoor Environments*, Dissertation, University of California, Berkeley, Dec. 1, 2017, 132 pages.

J.P. Marangos, *Topical review—Electromagnetically induced transparency*, Journal of Modern Optics, 1198, vol. 45, No. 3, pp. 471-503.

Joshua A. Gordon et al., *Quantum-Based SI Traceable Electric-Field Probe*, 2010 IEEE International Symposium on Electromagnetic Compatibility (*2010*): 321-324.

* cited by examiner

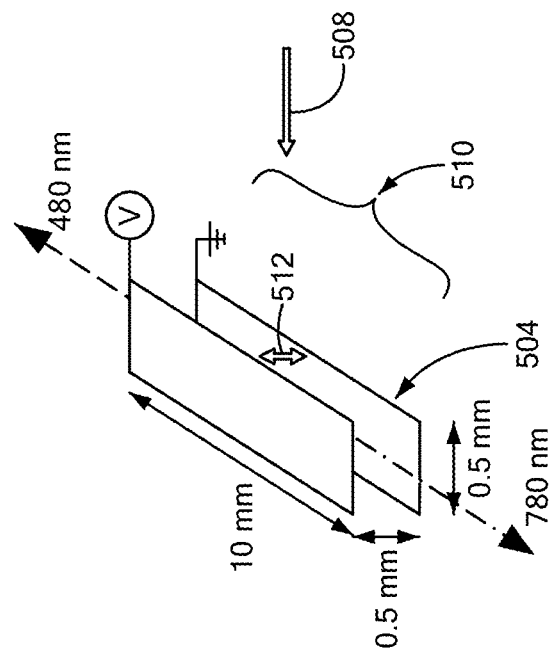
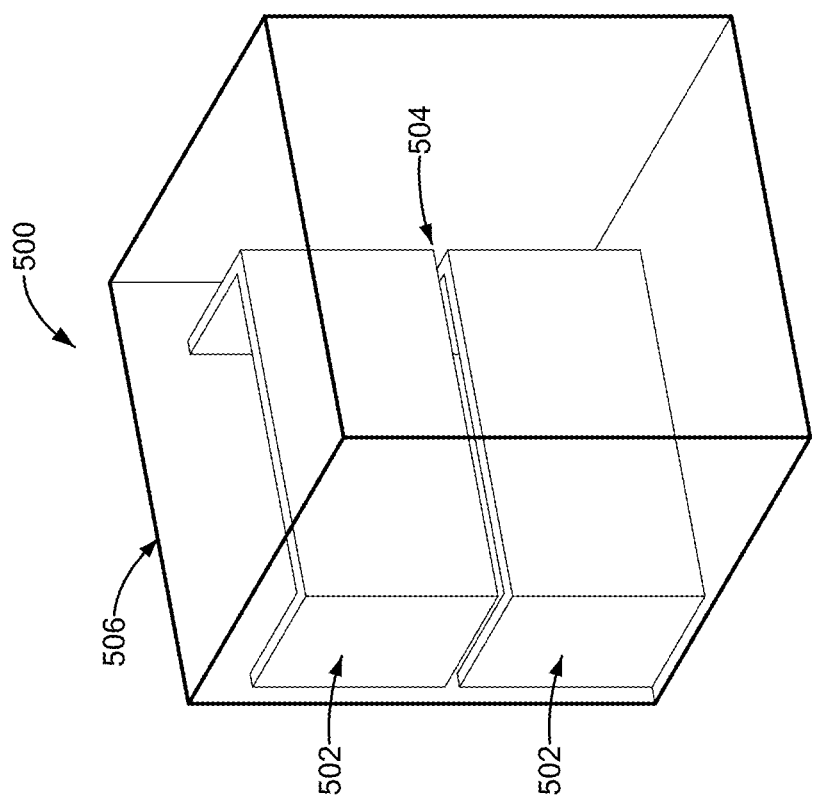
Fig. 5B
Fig. 5A

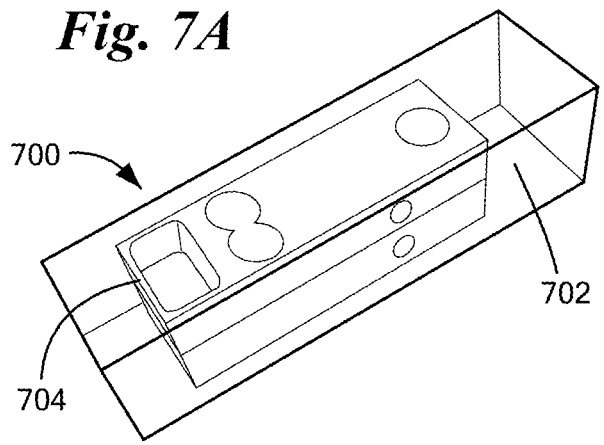
*Fig. 7A*
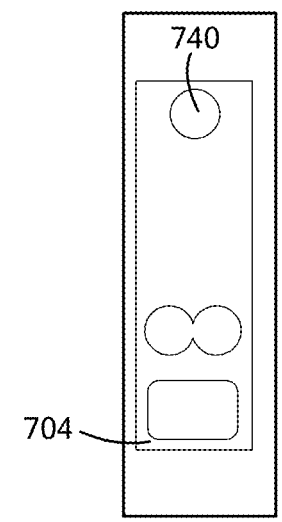
*Fig. 7B*
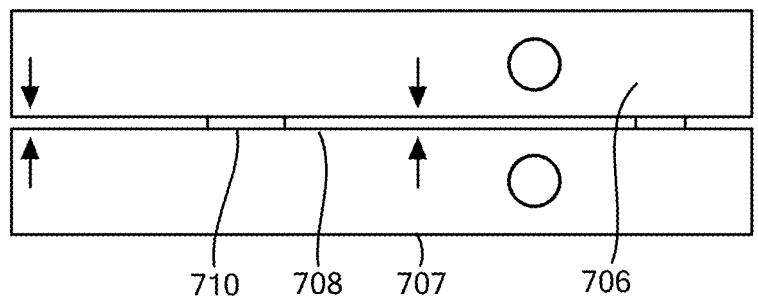
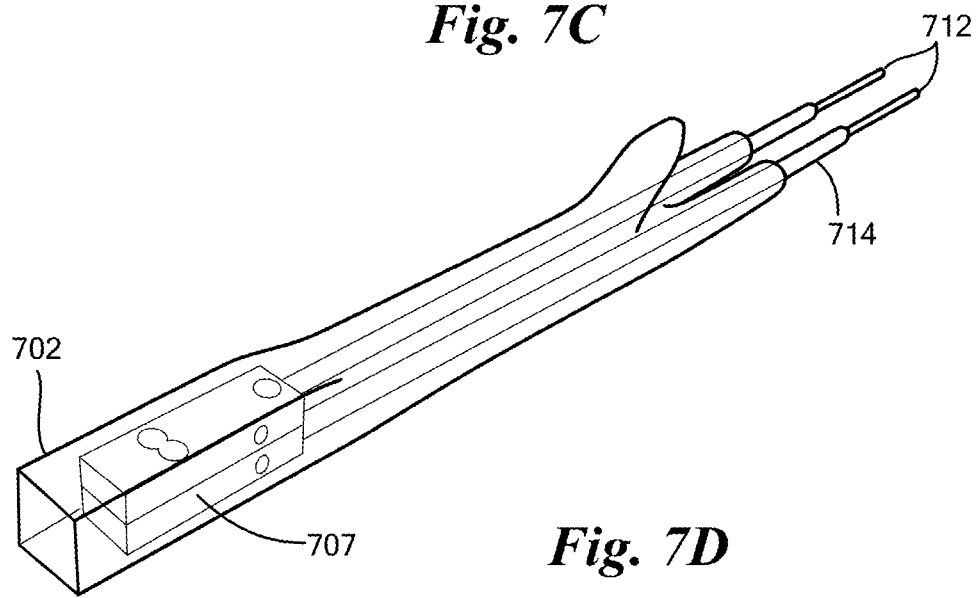
*Fig. 7C*
*Fig. 7D*

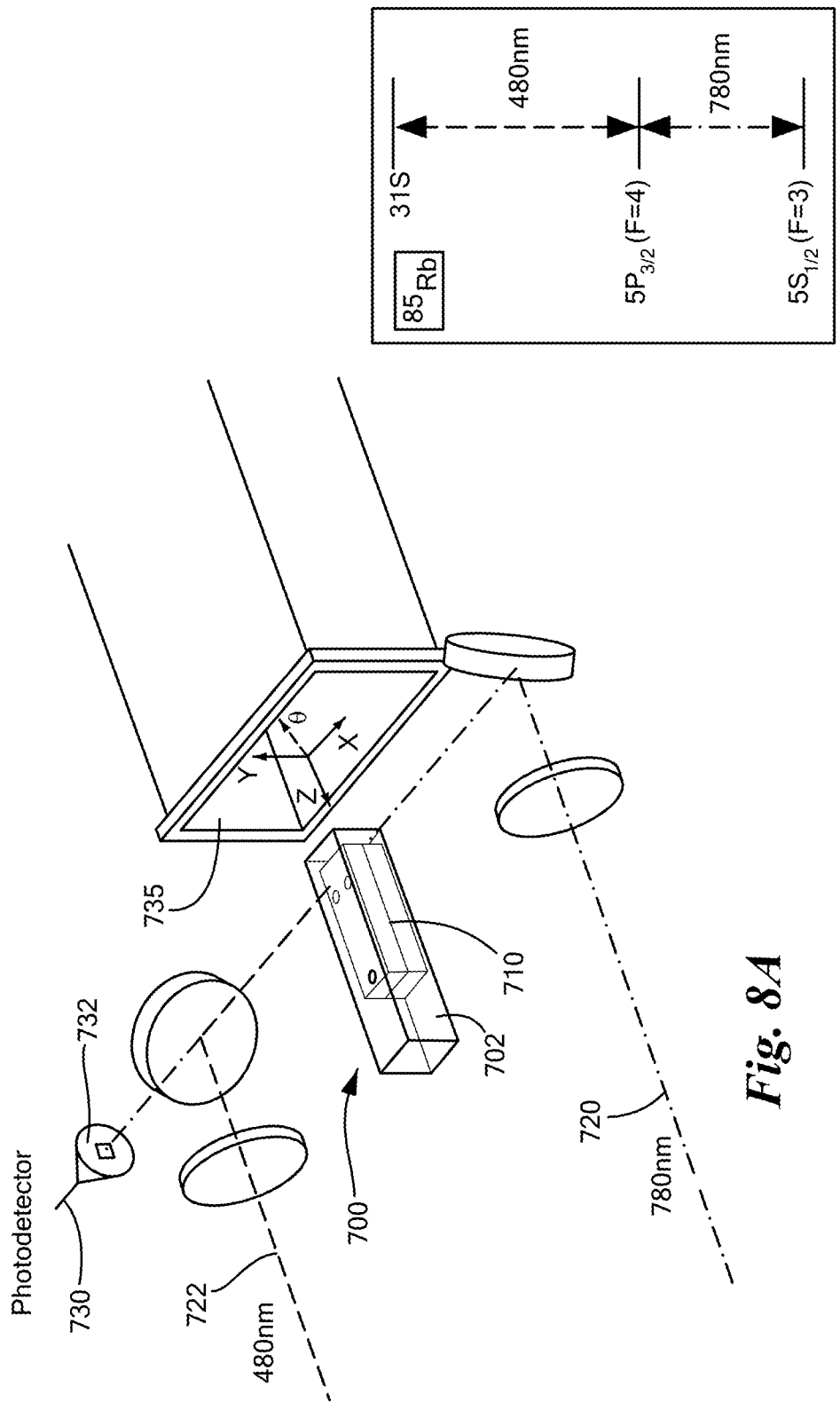

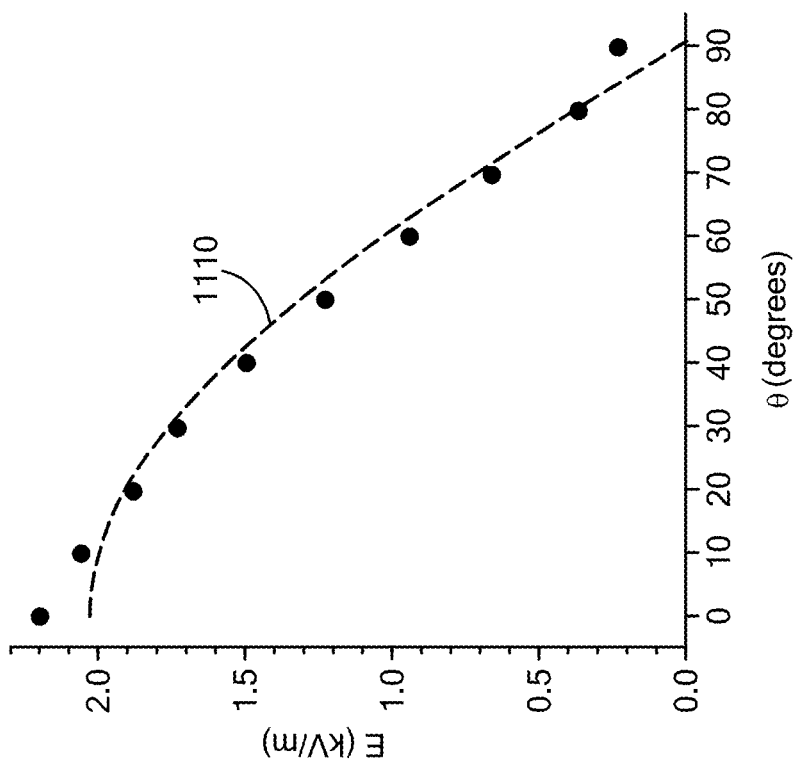
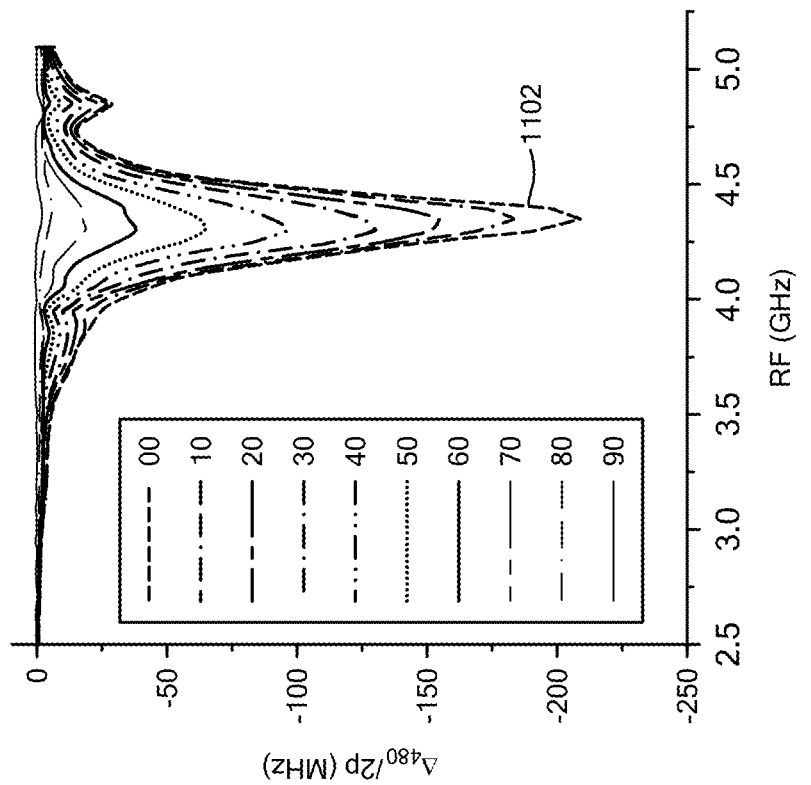
Fig. 11A
Fig. 11B

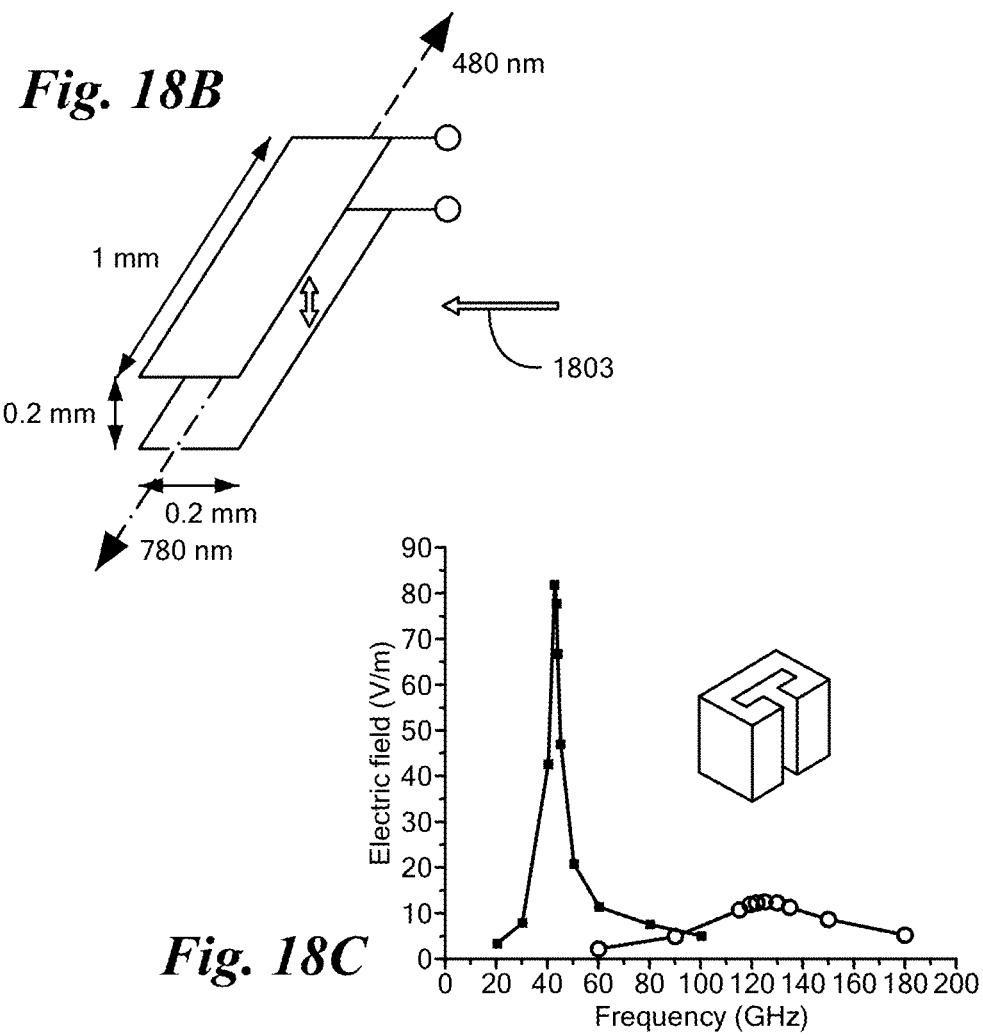
*Fig. 18B*
*Fig. 18C*
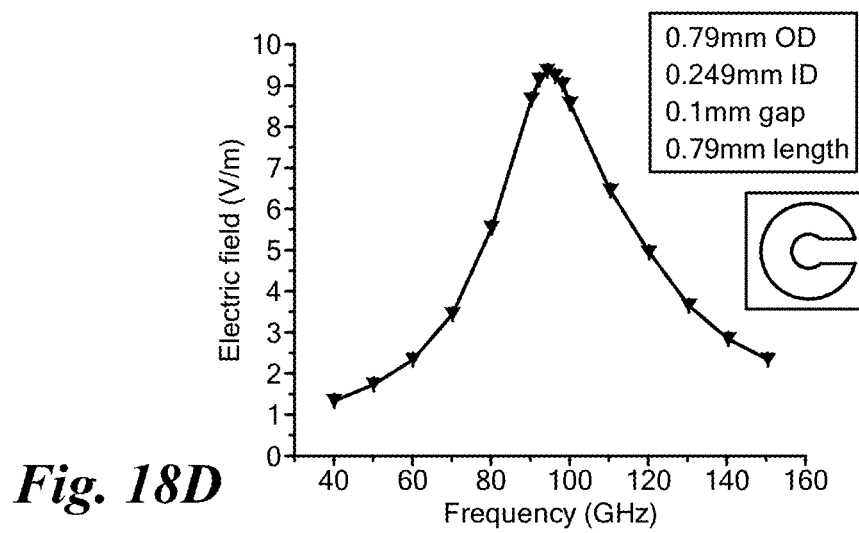
*Fig. 18D*

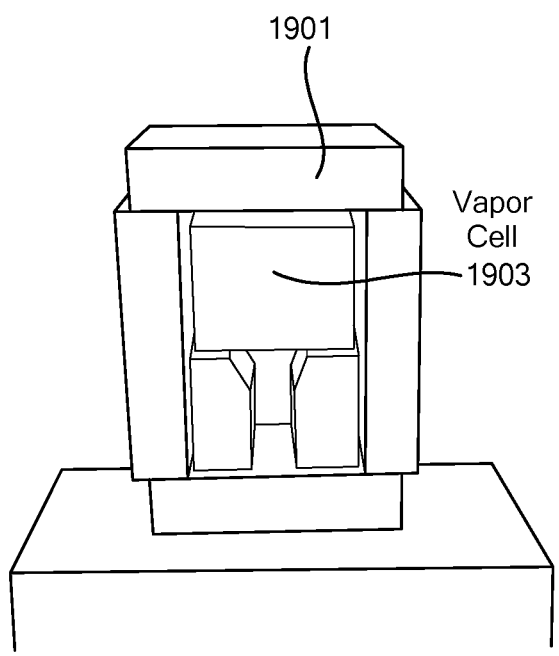
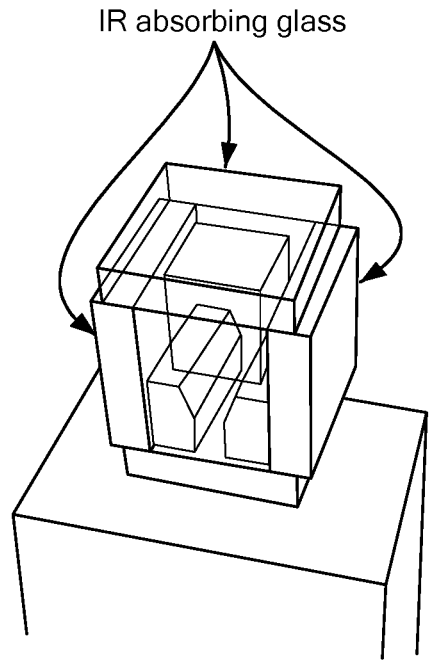
*Fig. 19A*  *Fig. 19B*
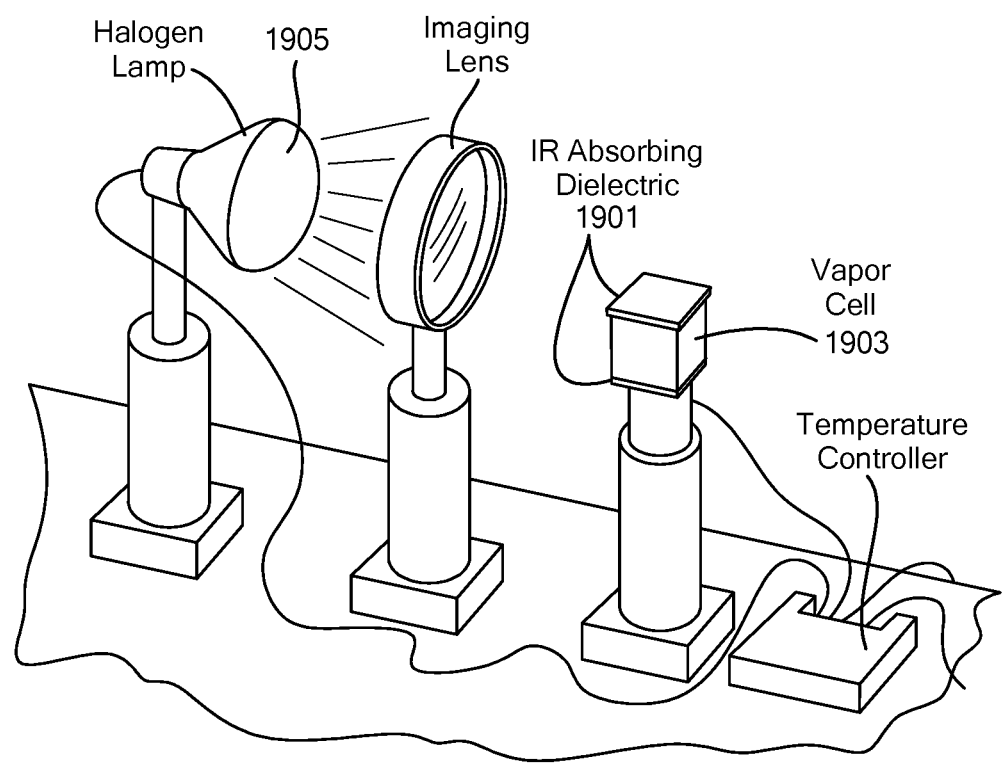
*Fig. 19C*

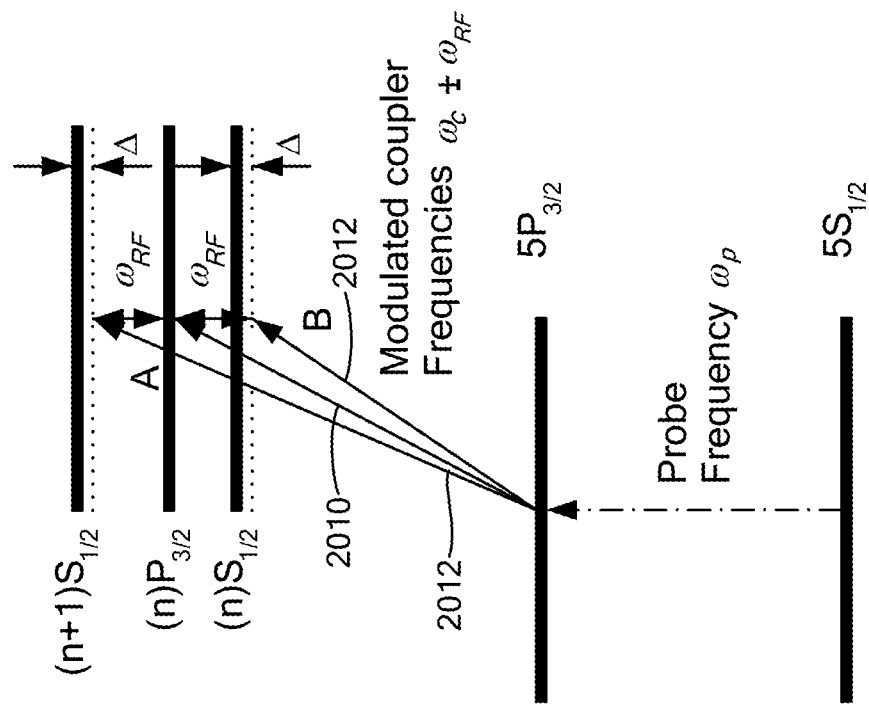
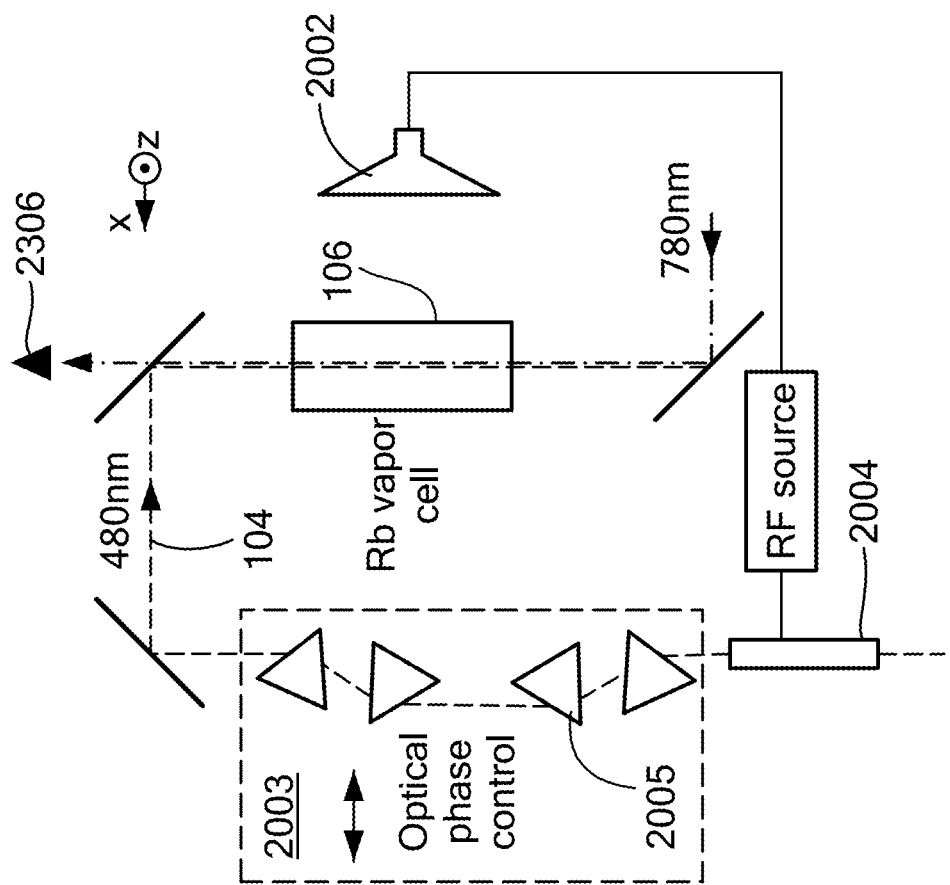
*Fig. 20B*
*Fig. 20A*

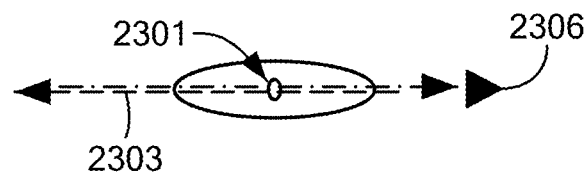
*Fig. 23A*
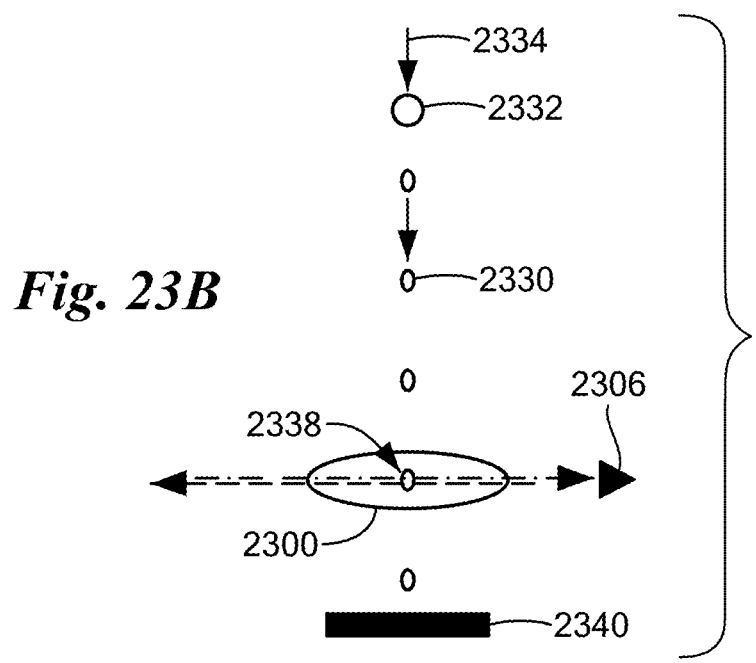
*Fig. 23B*
*Fig. 23C*
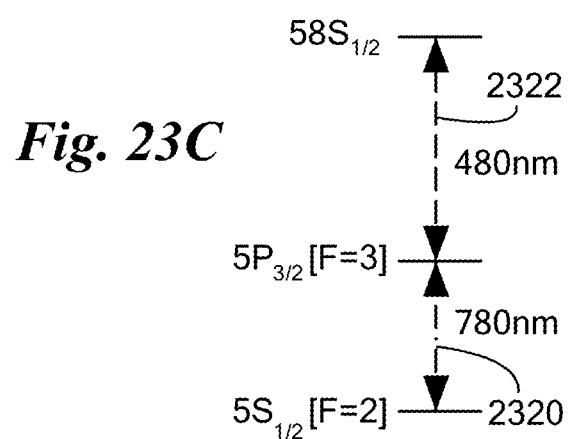

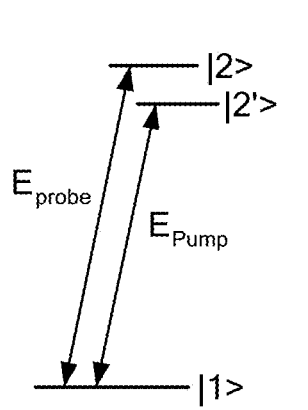 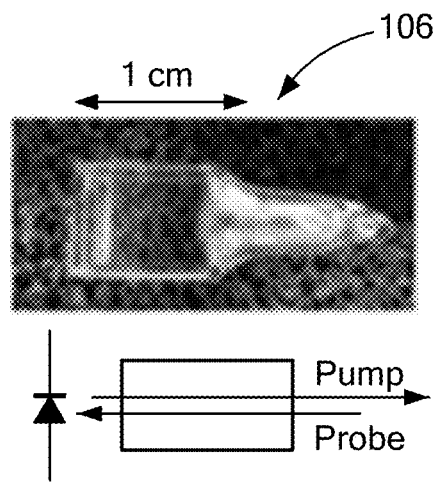
*Fig. 24A*  *Fig. 24B*
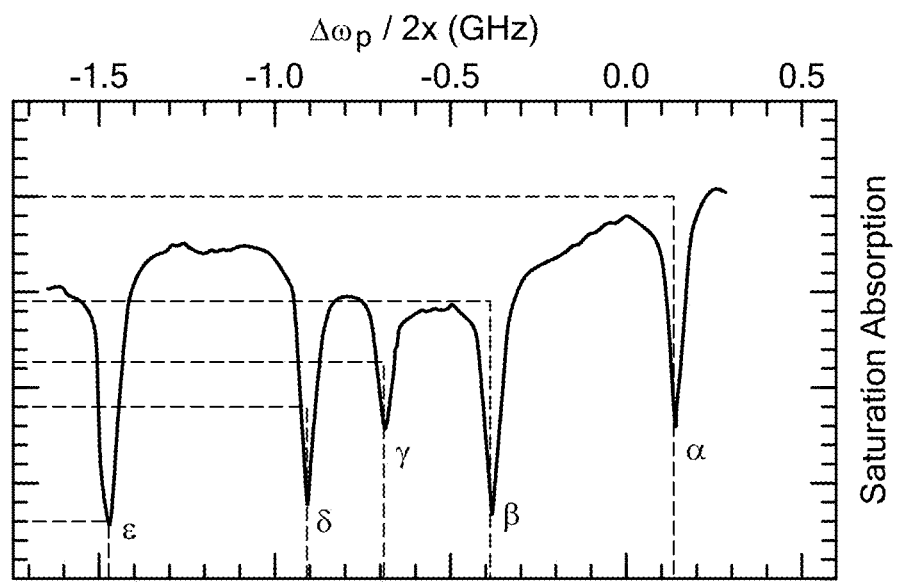
*Fig. 24C*

ATOM-BASED ELECTROMAGNETIC FIELD SENSING ELEMENT AND MEASUREMENT SYSTEM

CROSS-REFERENCE TO RELATED APPLICATIONS

The present application is a continuation of U.S. patent application Ser. No. 16/222,384, filed Dec. 17, 2018, which in turn claims the priority of U.S. Provisional Application No. 62/607,034, filed Dec. 18, 2017, and of U.S. Provisional Application No. 62/727,764, filed Sep. 6, 2018. Each of the above applications is hereby incorporated herein by reference in their entirety.

GOVERNMENT RIGHTS

This invention was made in part with Government support under Contract No. W911NF-17-C-0007, awarded by the Defense Advanced Research Projects Agency (DARPA) and the US Army. The Government may have rights in some aspects of the invention.

FIELD OF INVENTION

The present invention relates to an atom-based field sensing element and measurement system and methods, and, more particularly, to an element, system and methods that employ Rydberg atoms to measure, receive or image RF field amplitude, polarization, or phase, modulated RF signals, incoherent RF or RF noise, and to perform continuous-frequency RF field detection.

BACKGROUND OF THE INVENTION

Atoms with a quasi-free electron in a high-lying Rydberg state (characterized by a high principal quantum number, typically n>20) exhibit large polarizabilities and electric dipole moments that scale with principal quantum number n as $\sim n^7$ and $\sim n^2$, respectively, rendering them exquisitely sensitive to electric fields. In accordance with the convention of the present text, states of an atom which are not Rydberg states may be referred to herein as "low-lying states".

The concept of applying the spectroscopic response of Rydberg states in atomic vapors to the measurement of electric fields has been known at least since Mohapatra et al., "*Rydberg States using Electromagnetically Induced Transparency,*" *Phys. Rev. Lett.*, vol. 98, 113003 (2007), which is incorporated herein by reference. Earlier work relating to atom-based field sensing, all in the prior art, is the subject of U.S. Pat. No. 9,970,973, to Anderson et al., hereinafter, "the Anderson '973 Patent," incorporated herein by reference, as well as in references cited therein. More particularly, Floquet methods have previously been established as a suitable means to model Rydberg-atom microwave spectra in vapor cell experiments, as shown, for example in Anderson et al., "*Two-photon microwave transitions and strong-field effects in a room-temperature Rydberg-atom gas,*" *Phys. Rev. A*, vol. 90, 043419 (2014), incorporated herein by reference.

Electromagnetically induced transparency (EIT) is a quantum interference process in which two excitation pathways in a three-level atomic system destructively interfere and produce an increase in the transmission of a probe laser beam. In the Rydberg-EIT cascade scheme, depicted, for example, in FIG. 8B, the transparency is formed by a coherent superposition of the ground and Rydberg states. Rydberg-EIT has been implemented in both cold atomic gases and in room-temperature vapor cells. It has been widely used as a nondestructive optical detection technique for Rydberg spectra, quantum information processing, and measurements of both weak and strong microwave electric fields. AC Stark shifting of Rydberg levels using electrodes in a vapor cell is discussed by Bason et al., "*Enhanced electric field sensitivity of rf-dressed Rydberg dark states,*" *New J. Phys.*, vol. 12, 065015 (2010), which is incorporated herein by reference.

As the term is used herein, the word "sensor" shall refer to any device that detects or measures a physical quantity and may exclude wiring or waveguides that couple electrical or electromagnetic energy to or from the sensor, as well as controllers or processors used with the sensor. The term "monolithic sensor," as the term is used herein, refers to a sensor, the entirety of which is embodied on a singular substrate or whose components are permanently connected to form a single physical device. Examples of connections include microfabrication, fusing, anodic bonding, and gluing. To the best of the knowledge of the inventors hereto, a monolithic Rydberg sensor has never been suggested.

No method of Rydberg spectroscopy hitherto suggested, however, has ever been suited to measuring a phase of an electromagnetic field (relative to a fiducial phase reference). To that lacuna, among others, embodiments of the invention described below are addressed.

To realize a practical atom-based RF sensing, measurement, or imaging device, a suitable sensing element is required. All prior art sensing elements, described or suggested in earlier work, had limitations imposed by physical principles that were overcome by virtue of insights described below in accordance with the present invention. Prior art sensing elements are taught, for example, by Anderson et al., "*Optical measurements of strong microwave fields with Rydberg atoms in a vapor cell,*" https://arxiv.org/pdf/1601.02535.pdf, (11 Jan. 2016), which is incorporated herein by reference.

Other teachings of atom-based electromagnetic field sensing may be found in Gordon et al., "*Millimeter Wave Detection via Autler-Townes Splitting in Rubidium Rydberg Atoms,*" https://arxiv.org/pdf/1406.2936.pdf, (11 Jun. 2014), and in Simons et al., "*Using frequency detuning to improve the sensitivity of electric field measurements via electromagnetically induced transparency and Autler-Townes splitting in Rydberg atoms,*" *Appl. Phys. Lett.*, vol. 108, 174101 (2016), both of which publications are also incorporated herein by reference.

Performance limitations of existing Rydberg electromagnetically induced transparency (EIT) techniques include:

(1) Low sensitivity; the highest field sensitivity demonstrated to date is at the 1 mV/m level, limited primarily by EIT linewidths. Furthermore, this sensitivity level has only been achieved by monitoring small changes in the EIT peak line shape. Unlike measuring Rydberg energy-level spitting directly, where the field is traceable to fundamental constants and invariable atomic parameters, extracting the RF electric field from a detailed EIT line shape analysis requires a relatively complex model that depends on experimental parameters such as laser beam powers and vapor pressures, thereby precluding an absolute field measurement and making it unreliable in everyday operation. To date, the most sensitive measurement sensitivity in the prior art, a shot-noise limited sensitivity of about 3 $\mu$V/cm/Hz$^{1/2}$, has been demonstrated in work of Kumar et al., "*Rydberg-atom based radio-frequency electrometry using frequency modulation spectroscopy in room temperature vapor cells,*" Opt.

*Express*, vol. 25, 284263 (21 Jan. 2017), an improvement of half an order of order of magnitude over sensitivity reported earlier in Fan et al., "*Effect of Vapor Cell Geometry on Rydberg-Atom-Based Measurements of Radio-Frequency Electric Fields,*" *Phys. Rev. Appl.,* 044015 (2015), both of which papers are incorporated herein by reference. The latter work exploits minute RF-induced EIT enhancement of Rydberg-EIT lines by weak, resonant RF fields, a method expected to be somewhat unreliable in everyday field-measurement operation, because the minute changes depend on many details, such as laser powers and cell pressure. More robust means to enhance the sensitivity are desired.

(2) Inability to measure RF fields over a continuous frequency range. In weak RF fields, the method is limited to measurements of RF fields that are resonant with dipole-allowed transitions between Rydberg states. Weak RF fields that are off- and far-off-resonance from any transition cannot be measured easily, if at all.

(3) RF polarization measurements currently require a complex analysis of the atomic spectra.

(4) All prior art Rydberg-EIT measurements have necessarily been field amplitude measurement, while information on the phase of the RF field has never been possible to obtain in part because of physical constraints discussed herein.

(5) The form factor of measurement apparatuses used to date for Rydberg EIT measurements have necessarily require large components, assemblies that are not portable or have a large dielectric footprint, thereby precluding the ability to perform measurements in many practical applications or to be integrated into existing RF measurement and transmission systems.

(6) Prior to the invention described herein below, Rydberg EIT techniques have served solely for measurement of coherent fields. Prior methods were incapable of measuring either incoherent fields or noise.

An RF measurement method employing Rydberg EIT in vapor cells typically employs counter-propagation of laser beams through the atomic vapor to account for Doppler-shifts of the spectroscopic laser beams in the thermal atomic sample. This aspect has, to-date, posed a challenge in the implementation of Rydberg EIT in vapor cells in practical sensor designs for applications because it requires the laser beams to enter and exit the cells from opposing sides, either via free-space propagation or optical fibers on either side of the cell. This can lead to a sensor head with a large dielectric footprint and size that is undesirable for measurement applications. Further, for extensions to multi-pixel sensor arrays, entry of the optical beams from opposite sides of the cells can limit pixel packing density and resolution achievable in an array.

While single-sided optical coupling into vapor cells has been discussed, for example, in the context of an atomic magnetometer by George et al., "*Pulsed high magnetic Field Measurement via a Rubidium Vapor Sensor,*" https://arxiv.org/pdf/1704.00004.pdf, (31 Mar. 2017), which is incorporated herein by reference, separate fibers are employed there for input and output beams, and beams of the same or similar wavelength. Moreover, in the prior art, the probe beam always enters on one side of a vapor cell and exits on a different side.

While most of the matter in the observable universe exists in the plasma state, measurement or inference of characteristics of an electric field within a region of plasma poses particular challenge to science unless collective motion of the plasma may be observed, or unless a physical probe can be inserted into the plasma. An example of the former technique is the inference of radial electric fields in a tokomak, inferred from poloidal rotation velocities. Absent either of these probing modalities, certain assumptions need to be made where atomic probes are used. For example, where an intensity ratio of spectral bands of nitrogen is used, as discussed by Paris et al., "*Intensity ratio of spectral bands of nitrogen as a measure of electric field in* plasmas," *J. Phys. D*, vol. 38, pp. 3894-99 (2005), incorporated herein by reference, calculations require that the nitrogen molecules be predominantly excited from the ground state directly by electron impact.

To date, optical diagnostic techniques for measurements of plasma fields primarily involve the measurement of Stark shifts in plasma molecules by way of emission and absorption spectroscopy, laser-induced fluorescence, and Raman spectroscopy. While existing methods afford passive non-intrusive measurements, they may also require a priori knowledge of the optical absorption or emission spectra of the plasma constituents. This can make it difficult to distinguish collective plasma phenomena of interest from few-body processes involving constituent plasma particles in the diagnostic readout. It also requires the customization of a diagnostic tool specific to the plasma type under study, precluding a generalized technique capable of performing diagnostics on different plasma systems. Along these lines, some plasmas are expected to have emission profiles at frequencies and emission strengths that are difficult to detect using conventional detectors and spectrometers. Weak IR emissions from vibrational transitions in plasma constituents, for example, may in some instances provide useful information but detectors required for measuring these low IR intensity levels have not been readily available. Due to these restrictions, applications may require that the plasma be engineered with certain atomic/ionic particles to implement well-characterized optical diagnostics. This can pose a significant drawback in fundamental plasma studies, where the nature of the plasma is itself the subject of study.

Insofar as a priori knowledge of the aforesaid sort is not always available, science has awaited a more universal modality for remote measurement of electric fields within a plasma. Such a modality is described in detail below in accordance with an embodiment of the present invention.

Probes for high-resolution sensing, measurement and calibration of strong magnetic fields in the 1-100 Tesla range are becoming increasingly important in research and development, production, and maintenance of strong magnet systems in variety of industries. However, no atomic vapor or Rydberg-EIT system has provided for measurement of such fields, enabled, for the first time, by virtue of the invention described below. The maximum magnetic field strength that may be measured based on a model of Rydberg atoms using Zeeman splitting of hyperfine levels by Rydberg EIT analysis as previously practiced is at most ~$10^3$ Gauss. Measurement of stronger magnetic fields requires a new stratagem, as described herein in accordance with the present invention.

SUMMARY OF THE INVENTION

In accordance with an embodiment of the present invention, a method is provided for sensing or measuring a first electromagnetic field. The method has steps of:

exciting, into a distribution of Rydberg states, atoms of a gas occupying a test volume coextensive, at least in part, with the first electromagnetic field;

structuring the first electromagnetic field by placing it in interferometric relationship with at least one other electromagnetic field;

measuring transmission along a path traversing the test volume of at least one probe beam of electromagnetic radiation at one or more frequencies overlapping a spectral feature of the atomic gas; and on the basis, at least, of a change in the spectral feature, deriving a physical characteristic of the first electromagnetic field.

In accordance with other embodiments of the invention, the gas may be an atomic vapor, and atoms of the atomic vapor may be chosen from a group of atoms including rubidium, cesium and other alkalis. The step of exciting atoms into a distribution of Rydberg states may comprise optically exciting the atoms into a distribution of Rydberg states and at least one of electromagnetically induced transparency and electromagnetically induced absorption.

In accordance with further embodiments of the invention, the change in the spectral feature may include Autler-Townes splitting, and the physical characteristic of the first electromagnetic field may be field amplitude.

The first electromagnetic field may be monochromatic, and the physical characteristic of the first electromagnetic may be its phase relative to a fiducial phase.

In accordance with other embodiments of the present invention, structuring the first electromagnetic field may include modulation of the electromagnetic field prior to the step of measuring. Modulation may be at least one of frequency-, amplitude-, and step-modulation.

In still another embodiment of the present invention, the distribution of Rydberg states may include at least one pair of states with a non-zero dipole moment for the interaction between an atom and a radio-frequency field.

In accordance with yet a further embodiment of the present invention, there may be additional steps of:
calculating predetermined Rydberg atomic energy levels or Rydberg-EIT spectra in a presence of an incoherent RF noise field present in or constituting the first electromagnetic field;
propagating light into an atomic vapor cell;
measuring spectral features with the light propagated through the atomic vapor cell;
identifying a matched spectrum; and
deriving an attribute of the incoherent RF noise field.

In accordance with another embodiment of the present invention, there may be additional steps of:
calculating predetermined atomic energy levels or spectra for atoms in a first electromagnetic field that is identical to a strong static or low-frequency magnetic field;
propagating at least one other electromagnetic field as an optical probe into an atomic vapor cell;
measuring spectral features of the light propagated through the atomic vapor cell;
identifying a matched spectrum; and
deriving a physical property of the strong magnetic field.

The light may be amplitude or frequency modulated in conjunction with lock-in detection at the modulation frequency or a multiple of that frequency, and the predetermined atomic energy levels or spectra may be for low-lying atomic states.

In accordance with another aspect of the present invention, a monolithic sensor is provided for detecting and/or measuring a parameter characterizing an electromagnetic field. The sensor has an atomic vapor contained within an enclosure, a source of excitation for exciting atoms of the atomic vapor into a distribution of Rydberg states, and at least one waveguide for coupling a probe beam or more beams into the atomic vapor and for collecting the probe beam after interaction of the probe beam with the atomic vapor.

In accordance with other embodiments of the invention, the at least one waveguide may be an optical fiber. At least one of the at least one waveguide may couple radiation from both the source of excitation and the probe beam into the atomic vapor. The enclosure may include a dielectric material or a glass vapor cell. The enclosure may be compartmented, and, more particularly, may be linearly or arealy compartmented.

In further embodiments, a distinct probe beam may be coupled into each of an array of compartments, such as via an array of optical elements, and may be collected after interaction with the atomic vapor and coupled to a detector element via the array of optical elements. The enclosure may include a light-absorbing surface, and may also have a temperature regulator.

In accordance with a further aspect of the present invention, a unilaterally-coupled monolithic sensor is provided for detecting and/or measuring a parameter characterizing an electromagnetic field. The unilaterally-coupled monolithic sensor has an atomic vapor contained within a dielectric enclosure and a source of excitation for generating an excitation beam for exciting atoms of the atomic vapor into a distribution of Rydberg states. Additionally, the unilaterally-coupled monolithic sensor has a first prism for coupling the excitation beam into the atomic vapor and for coupling a probe beam out of the atomic vapor and a second prism for coupling the probe beam into the atomic vapor. The excitation beam and the probe beam may be incident on the respective first and second prisms in substantially parallel directions.

In yet a further aspect of the present invention, a sensor is provided for detecting and/or measuring a parameter characterizing an electromagnetic field. The sensor has at least one of a material or a structure for conditioning an electromagnetic field, and an atomic vapor contained within an enclosure disposed within the conditioning material or structure. The sensor also has a source of excitation for exciting atoms of the atomic vapor into a distribution of Rydberg states, a detector for detecting a probe beam after traversal of the atomic vapor and for generating a detector signal, and a processor for deriving a parameter characterizing the electromagnetic field based at least on the detector signal.

In other embodiments, the material or structure for conditioning an electromagnetic field may be an RF resonator or a waveguide. It may also be a metamaterial.

The material or structure for conditioning an electromagnetic field may include an antenna or one or more electrodes. The material or structure may be conductive and may condition the electromagnetic field by conversion of a current or voltage signal into an electromagnetic field within an atomic vapor cell. An attribute of the current or voltage signal may be derived from the detector signal.

In other embodiments of the invention, the source of excitation for exciting atoms of the atomic vapor into a Rydberg state may have one or more light beams to establish an electromagnetically induced transparency or electromagnetically induced absorption in the atomic vapor. The enclosure containing the atomic vapor may be a glass vapor cell.

In yet other embodiments of the invention, the material or structure for conditioning an electromagnetic field may include a filter or reflector for electromagnetic fields that are entering or exiting the atomic vapor enclosure. The detector may be used to detect an electromagnetic field generated by the excitation of and emission from the atomic vapor. The electromagnetic field may be associated with at least one of a standing electromagnetic wave and a traveling electromagnetic wave.

In accordance with another aspect of the present invention, a sensor is provided for detecting and/or measuring a parameter characterizing an electromagnetic field. The sensor has an atomic vapor contained within an enclosure that, in turn, has a light-absorbing surface. The sensor also has a source of a heating beam incident upon the light-absorbing surface as well as a source of excitation for exciting atoms of the atomic vapor into a distribution of Rydberg states. The sensor also has a detector for detecting a probe beam after traversal of the atomic vapor and for generating a detector signal, and a processor for applying the heating beam to the light-absorbing surface in such a manner as to regulate a temperature characterizing the atomic vapor.

In further embodiments of the invention, the light-absorbing surface may be a film, a polymer or a glass.

In accordance with another aspect of the present invention, a method is provided for measuring an electric field within a region of a plasma contained within an enclosure. The method has steps of:
  incorporating tracer particles of a specified species into the plasma;
  exciting the tracer particles into a specified Rydberg state;
  applying at least a probe beam and coupler beam to derive an EIT transmission spectrum of the plasma; and
  comparing the EIT transmission spectrum of the plasma with a spectral model to infer the electric field with the region of the plasma on the basis of at least one of field-induced spectral shape changes and field-induced spectral shifts.

In accordance with more embodiments of the invention, the method may have a further step of applying a magnetic field or RF field to the plasma. The tracer particles may be atoms, including, more particularly, Rubidium atoms. The method may also include generating the tracer particles from a cold-atom source.

DESCRIPTION OF DRAWINGS

The foregoing features of the invention will be more readily understood by reference to the following detailed description, taken with reference to the accompanying drawings, in which:

FIGS. 5A and 5B show a type of hybrid atom-cavity structure in accordance with an embodiment of the present invention.

FIGS. 7A-7D show a hybrid atom-resonator device, in accordance with an embodiment of the present invention. FIG. 7A shows a resonator electrode/cavity inside a spectroscopic cell; FIG. 7B is a top view of the resonator showing the ceramic pins for electrode alignment and stabilization; FIG. 7C is a side view of the resonator with a glass spacer and gap indicated; and FIG. 7D shows the resonator electrode/cavity structure inside a rubidium vapor cell with wire leads connected for external voltage/current control, or to ground/short the electrodes.

FIG. 8A shows an experimental setup for measurement of field characteristics in accordance with an embodiment of the present invention, while FIG. 8B shows the pertinent Rydberg EIT energy level diagram.

FIG. 9A plots a measured 31S Rydberg EIT spectrum as a function of RF/microwave frequency at a fixed −10 dBm injected power. FIG. 9B plots a calculated Stark map centered on the $31S_{1/2}$ Rydberg state for an applied root-mean-square electric field $E_{RMS}$. FIG. 9C plots microwave $E_{RMS}$ versus frequency obtained using FIGS. 9A and 9B, while FIG. 9D plots measured EIT lines for 2.5 and 4.35 GHz microwaves, respectively.

FIG. 11A shows experimental 31S Rydberg AC-Stark shifts as a function of applied microwave frequency at a fixed injected power for different angular positions Θ relative to a vertical axis. FIG. 11B plots microwave electric field at 4.35 GHz as a function of Θ for the data shown in FIG. 11A.

FIG. 18B illustrates a measurement channel within the gap of the split-ring cavity structure, in accordance with an embodiment of the present invention. FIGS. 18C and 18D show simulated resonance curves for split-ring resonators with geometries that lead to resonances in the vicinity of 100 GHz.

FIGS. 19A and 19B show an IR-glass capsule 1901 enclosing a 4 mm inner diameter atomic vapor cell 1903. FIG. 19C shows an all-optical heating test platform.

FIG. 20A schematically depicts a sensing element back-end and operating principle for phase-sensitive measurements of RF electric fields, in accordance with an embodiment of the present invention. FIG. 20B depicts a quantum mechanical level scheme and optical/RF excitation pathways used in the phase-sensitive RF electric-field measurement.

FIGS. 23A-23C schematically depict probing electromagnetic fields within a plasma employing EIT of Rydberg atom tracers, in accordance with an embodiment of the present invention.

FIGS. 24A-24C schematically depict measuring a strong magnetic field using saturation absorption spectroscopy of a two-level Rydberg quantum system, in accordance with an embodiment of the present invention.

EMBODIMENTS OF THE INVENTION

Figure 1:
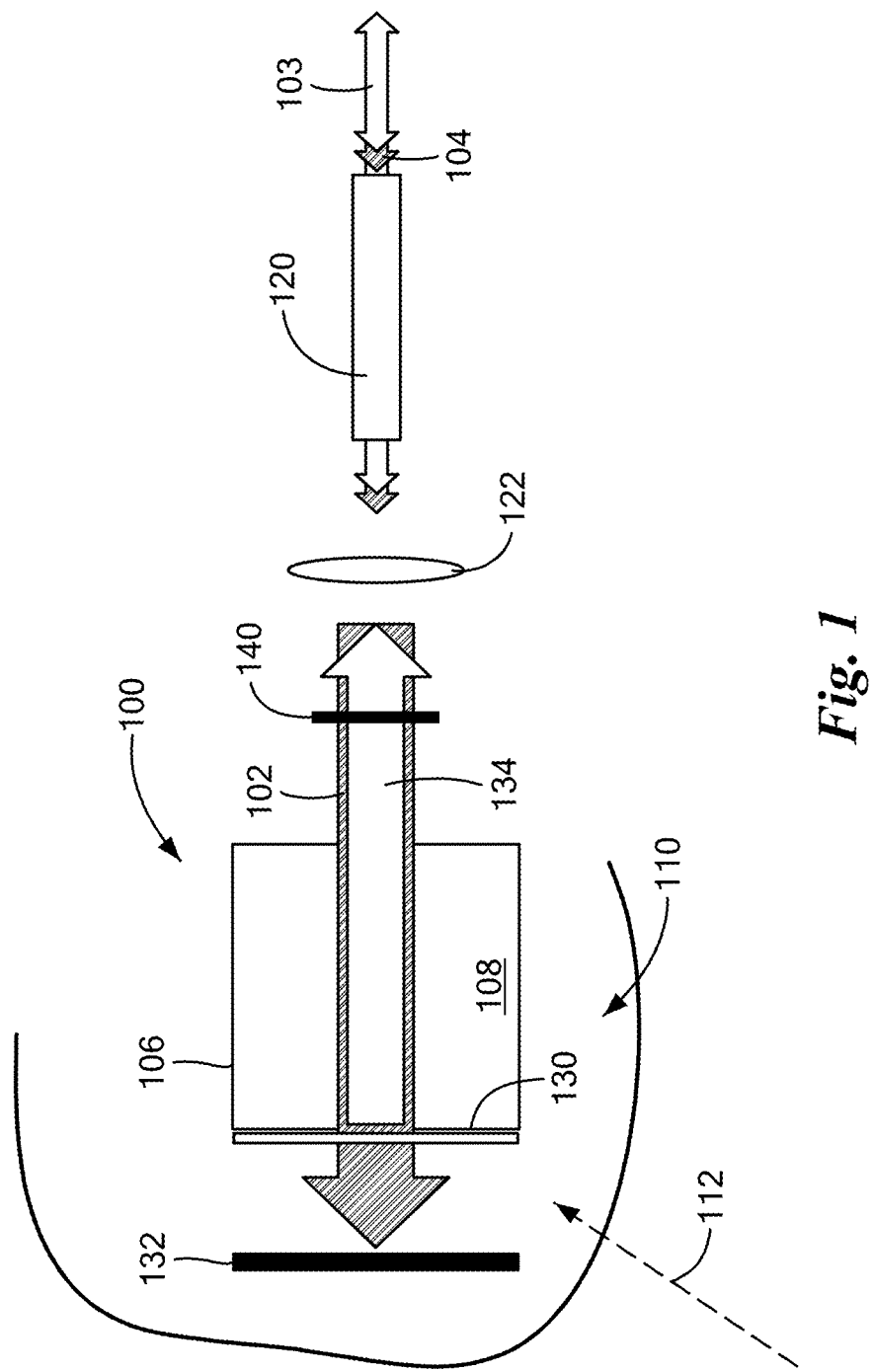
FIG. 1 schematically depicts a single-sided optically-coupled RF sensing element in accordance with an embodiment of the present invention.

Definitions: The following terms shall have the meanings indicated, unless otherwise dictated by context:

Certain embodiments of the present invention relate to an atom-based field sensing element that may also be referred to herein, synonymously, as a "sensing element," a "field sensing element," and as a "sensor."

"Conditioning" shall, herein and in any appended claims, refer to the confinement, guiding, manipulation, or filtering of an electromagnetic field or a physical attribute of the EM field including its mode, electric field amplitude, polarization, frequency, phase, and spectral content.

The term "enhancement," as it refers to an electromagnetic wave, shall be defined as the conditioning of that electromagnetic wave in such a manner as to increase the value of any physical attribute of the electromagnetic wave.

A "monochromatic field" shall refer either to a static field or to an electromagnetic field characterized by a range of frequencies no greater than 1% of a central frequency.

An electromagnetic field shall be referred to as "structured" if and only if it is a monochromatic field and is in an interfering relation with at least one other electromagnetic field. Thus, to "structure" an electromagnetic field is to place the field in interferometric relationship with one or more other electromagnetic fields.

An atom-based field sensing element shall be referred to herein as "integrated" if and only if it contains at least one material or a structure that acts to condition an RF field, where the term "condition" is as defined above. The RF field that is conditioned may be referred to herein as an "RF field of interest."

As used herein, the word "distribution," when referring to a set, whether continuous or discrete, shall include the case of a single element. Thus, a distribution of atomic population among Rydberg states, for example, encompasses a single state, as well.

As used herein, in a spectrum, which term refers herein to any function of frequency v, a "spectral feature" shall refer to the behavior of that function over a defined contiguous frequency subdomain wherein values of the function at the boundaries of the subdomain constitute local minima or maxima of the function.

"Splitting" of a spectral feature shall refer to diminution of a local maximum of the function due to a physical effect, causing the appearance of two new local maxima, one at a frequency above that of the original local maximum, and one at a frequency below that of the original local maximum. The term "splitting," where appropriate in context, may also designate the difference in frequency between the loci of the new local maxima that appear in place of the original local maximum.

The term "electromagnetic encompasses both DC and AC fields.

"RF" may refer synonymously herein to "microwave," "millimeter-wave," "terahertz," or any electromagnetic radiation with frequency from above DC to THz.

A magnetic field shall be designated as "strong" if it exceeds ~$10^{-3}$ Tesla (10 G), at which point the m-degeneracy of some atomic hyperfine levels, broken by the magnetic field, begins to transition from the weak-field (linear Zeeman) regime into the Paschen-Back regime.

"Electromagnetically induced transparency" (EIT) refers to a physical phenomenology in which coherent optical fields tuned to interact with (at least) three states of an optical system give rise to transparency at a wavelength corresponding to an otherwise absorbing quantum transition in a medium. The physics and terminology of EIT are reviewed by Marangos, "*Topical review: Electromagnetically induced transparency,*" *J. Mod. Opt.*, vol. 45, pp. 471-503 (1998), which is incorporated herein by reference.

A "dielectric," as the term is used herein, is defined as a material or substance that transmits electric force without conduction; an insulator.

An Atom-Based Electromagnetic Field Sensing Element and Measurement System

In accordance with certain embodiments of the present invention, a single-sided optically-coupled RF sensing element (otherwise referred to herein as a "sensor" and as a "pen-like configuration") is provided, and designated generally by numeral 100 and is described with reference to FIG. 1. The pen-like linear sensor design depicted in FIG. 1 affords the use of a single entrance port 102 to fiber-optically couple the required laser beams 103, 104 into and out of the vapor cell volume 108 contained within enclosure 106, otherwise referred to herein as a "vapor cell" or an "atomic vapor cell." Vapor cell volume 108 contains an atomic or molecular gas. A region of gas within vapor cell volume 108 that is probed by beams 103 and 104 may be referred to herein, and in any appended claims, as a "test volume."

With sensor 100 entering an active measurement volume 110 from a single side, the configuration of FIG. 1 leaves the active measurement volume 110 unobstructed with respect to incident RF/microwave fields 112 from all sides except one. In the implementation depicted in FIG. 1, linearly-polarized probe 103 and coupler 104 beams are sent through a single polarization-maintaining fiber 120 and collimated by a lens 122 to a full-width-at-half-maximum (FWHM) of approximately 200 µm in vapor cell 106. The probe and coupler beams 103, 104 co-propagate through the atomic vapor cell 106, where the probe 103 is then selectively retro-reflected back through the cell by a short-pass dichroic mirror coating 130 while the coupler passes through and is blocked by a thin dielectric absorber beam block 132. The retro-reflected probe beam 134 retraces its path, overlapping the outgoing coupler beam, and is re-coupled back into fiber 120 by lens 122. A quarter wave plate 140 positioned before the retro-reflection (between the lens and vapor cell in FIG. 1), ensures that the linearly polarized in-going probe beam is rotated by 90 degrees on the retro-reflected out-going beam so that it can be selectively split off with a polarization-selective element (not shown) for readout after the polarization-maintaining (PM) fiber.

Sensor 100 as depicted in FIG. 1 may provide several advantages in comparison to other implementations of vapor-cell EIT that preceded the present invention. First, the linear single-sided design allows for small, low-profile probe tips and sensor elements that have a small dielectric footprint. The design also eliminates the need for any optical elements to redirect the optical beams out of the fiber and into the cell. Utilizing a single lens for input and output coupling of larger beam diameters as compared to typical implementations of vapor cell EIT may advantageously improve the measurement precision and sensitivity by affording less interaction-time broadening and therewith higher achievable spectroscopic resolution, as well as improved operational stability by reducing the device sensitivity to misalignment by back-coupling the readout probe beam into the same fiber.

Figure 2B:
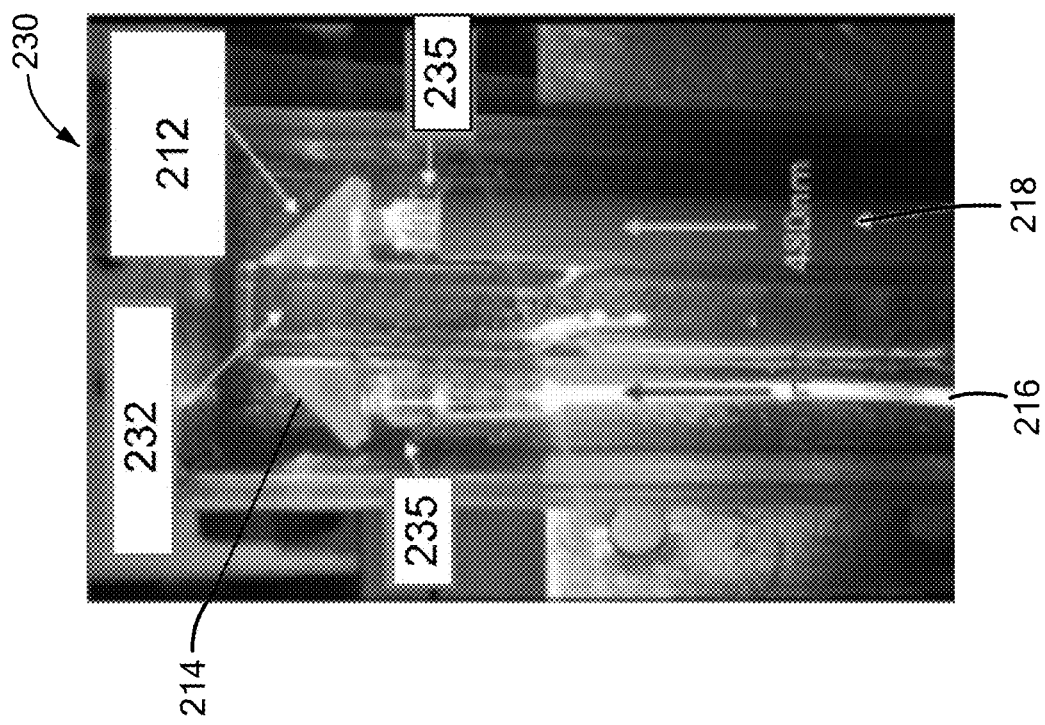
FIG. 2B shows a single-sided atomic vapor sensor in which excitation and probe beams are coupled to a vapor cell via prisms, in accordance with an embodiment of the present invention.
Figure 2A:
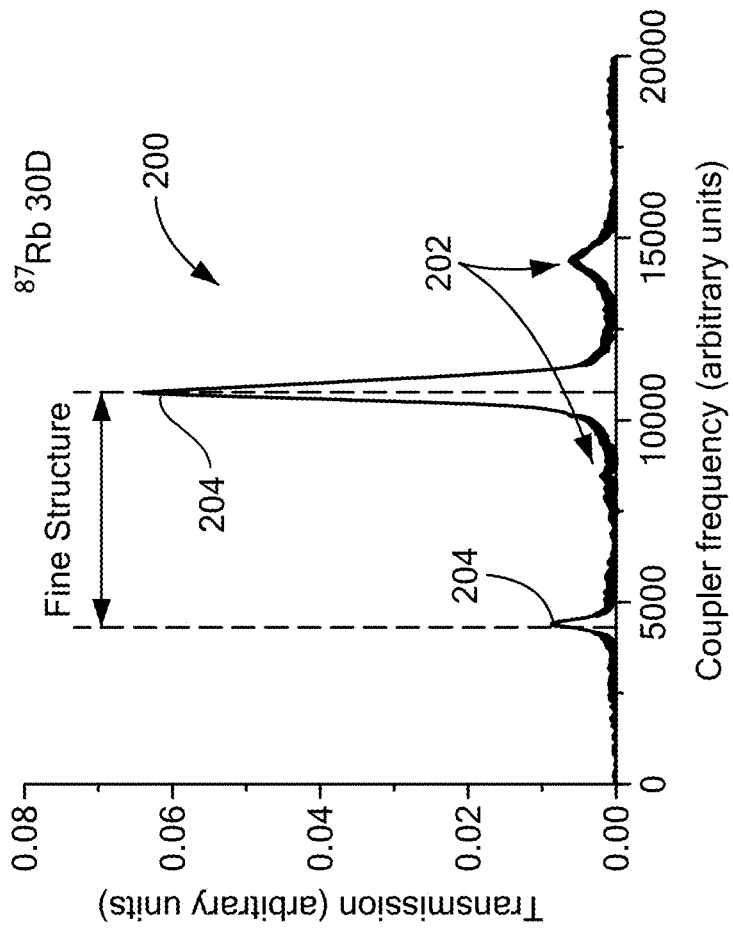
FIG. 2A shows an EIT spectrum of the 30D Rydberg state of $^{87}$Rb obtained using a pen-like retro-EIT configuration in accordance with an embodiment of the present invention.

FIG. 2A shows an EIT spectrum, designated generally by numeral 200, of the 30D Rydberg state of $^{87}$Rb using the pen-like retro-EIT configuration 100 of FIG. 1. Single-sided EIT configurations may be referred to herein as "retro-EIT configurations." The splitting of fine-structure features 204 is evident. Internal reflections of the coupler beams 104 from the inner cell walls lead to a duplicate EIT spectrum 202. The spectra are taken without lock-in detection of the signal of a Si photodiode.

The duplicate spectrum 202 is blue-shifted from the primary EIT line 200 by an amount equal to the frequency detuning of the probe 103 relative to velocity v=0 atoms at the center of the Doppler profile. Duplicate spectra due to internal reflections in vapor cells are commonly observed in vapor-cell EIT experiments. These can be avoided by placing the cell at an angle from normal incidence of the EIT beams or having the cell windows at an angle relative to the incident optical beam.

FIG. 2B shows an embodiment of sensing element, designated generally by numeral 230, with single-sided fiber coupling through a rubidium vapor capsule 232. An implementation of a sensing element in accordance with another embodiment of the present invention, with a first prism 212 and second prism 214 redirecting single-sided fiber-coupled excitation beam 216 and a single-sided fiber-coupled probe beam 218 into vapor capsule 232. Prisms 212 and 214 are couple to respective fibers guiding beams 216 and 218 by lenses 235.

In accordance with other embodiments of the present invention, the single-sided optically-coupled vapor-cell RF/microwave sensing element may be extended to multi-sensor arrays, where the single-sided coupling of an array of cells is achieved collectively using large single beams for the coupler and probe that impinge on a microarray of lenses. One such embodiment is now described with reference to FIG. 3. Again, the one-sided entry of the coupler 104 and probe 103 beams allows for dense packing of the single-elements in arrays and leaves the active measurement volume/surface unobstructed to the incident RF/microwave radiation to be measured or imaged. For lower-density arrays, a grid of individual single-sided elements such as those shown in FIGS. 1 and 3 may be employed within the scope of the present invention.

Figure 3:
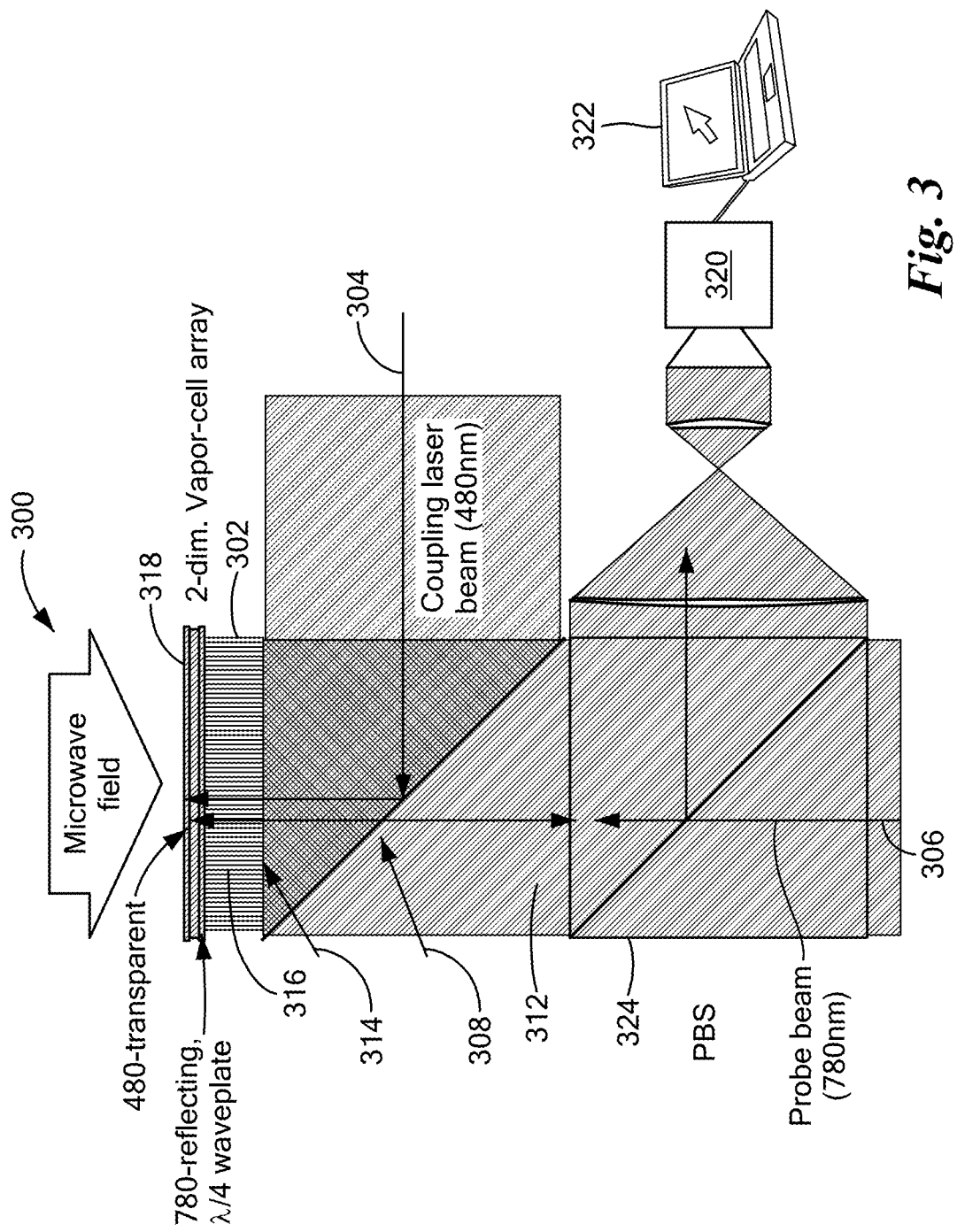
FIG. 3 shows a microwave imaging array comprised of single-side-coupled individual vapor-cell sensor elements, in accordance with an embodiment of the present invention.

FIG. 3 shows a microwave imaging array designated generally by numeral 300. Microwave imaging array 300 consists of single-sided coupling of individual vapor-cell sensor elements 302 arranged in a linear or areal (two-dimensional) array. Optical coupler 304 and probe 306 EIT beams are split from each other using dichroic mirrors 308. Laser-beam arrays 310 are derived from large-diameter laser beams 312 that are passed through an array of micro-lenses (ML array) 314. Micro-lens arrays are commercially available. The laser-beam arrays are matched with a planar array of sub-cells 316 containing an atomic vapor (layer thickness on the order of a fraction of the RF wavelength of interest, with a sub-cell period less than 1 mm). A dielectric coating 318 on the vapor-cell array reflects the 780-nm probe laser beam and transmits the 480-nm coupler and the microwave field. The probe-beam image reflected by the polarizing beam splitter contains the microwave information. It is recorded using a CCD camera 320 and analyzed with an image processor 322. A polarizing beam splitter (PBS) 324 is also shown.

Cavity-Enhanced Field Sensitivity

A concept of hybrid atomic detectors, as defined above, for RF detection, in which an atomic Rydberg vapor is integrated with different resonant materials or structures to condition the RF field of interest, is now presented. Hybrid atomic detectors in accordance with the present invention may advantageously achieve detection capabilities.

Figures 4A, 4B:
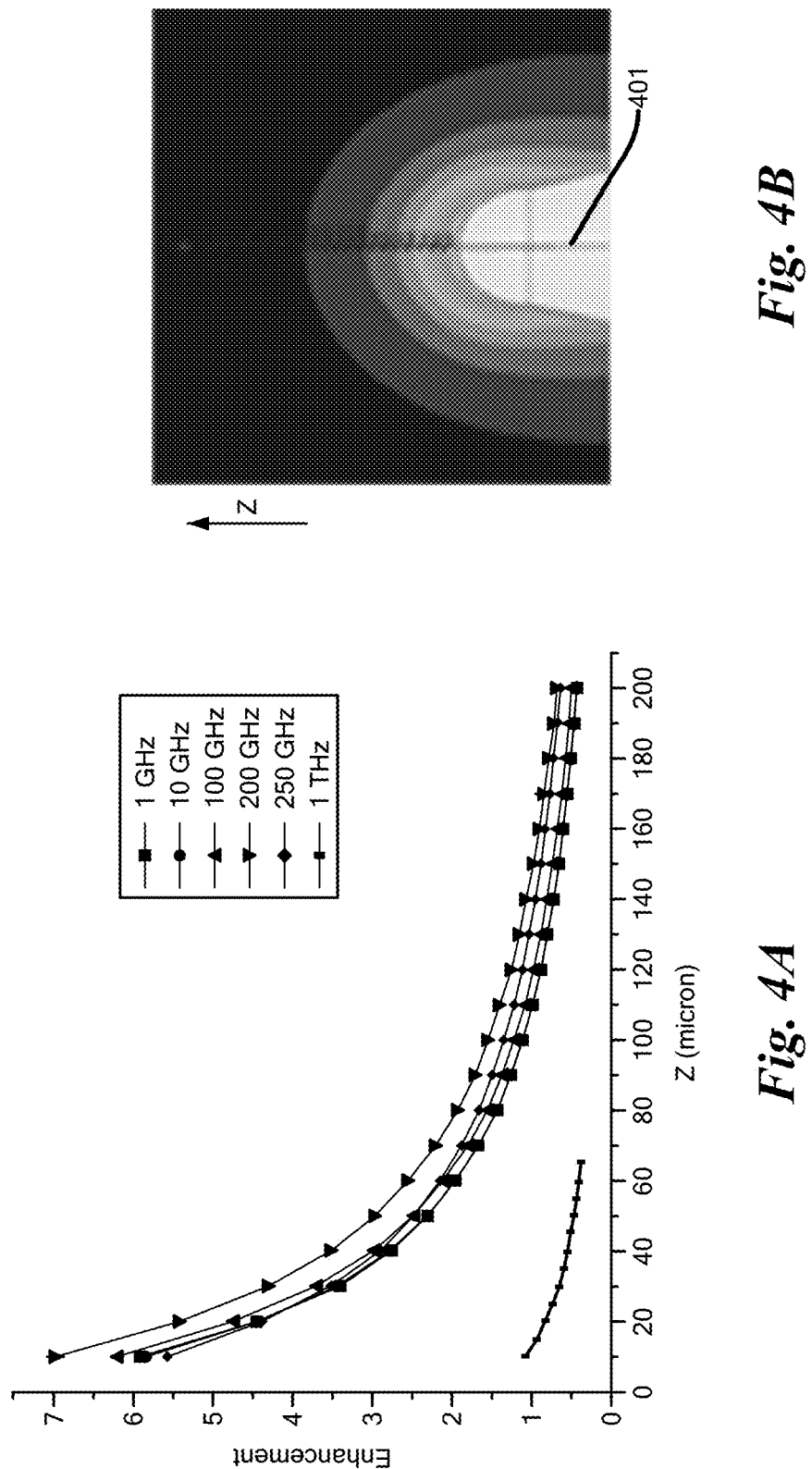
FIG. 4A shows a calculation of an RF-field enhancement factor along the axis of a tip of 125 um diameter for several frequencies, in accordance with an embodiment of the present invention.
FIG. 4B shows the skin depth associated with a conducting tip.

Near-field effects are well-known to generate regions of enhanced electric fields. The foregoing concept of hybrid atomic detectors, described for the first time in accordance with the present invention, may be used advantageously, for instance, in plasmonic resonances in nano-particles. One example of a hybrid atomic detector in accordance with the present invention employs a split-ring resonator. A simple near-field field enhancement device is a metal tip of sub-wavelength diameter. The tip enhances an RF electric field, akin to a lightning rod that enhances the electric field near the rod in a thunderstorm. FIG. 4A shows a calculation of the RF-field enhancement factor along the axis of a tip 401 of 125 um diameter for several frequencies. The illustration and plot shows that a simple structure such as a metal tip integrated into an atomic vapor cell can enhance the field by about a factor of three, corresponding to 9.5 dB in intensity. For enhancement, it is important that the tip diameter exceeds the skin depth depicted in FIG. 4B, which for cases of interest (Cr, Beryllium-Copper, etc.) is on the order of 1 um in the 10 to 100 GHz range (and which scales as $1/\text{frequency}^{0.5}$). It follows that hybrid devices such as metal tips implanted into atomic vapor cells enhance the field sensitivity via localized near-field enhancement.

Cavity structures that are resonant with an RF field provide another means for local enhancement of the field. A cavity structure can readily provide added control over RF field parameters such as RF field polarization and frequency. Within the scope of the present invention, cavities may be engineered to reduce field inhomogeneity in an atom-RF field interaction volume, which can be desirable in applications and is difficult to achieve when exploiting near-field effects with tip-like structures.

The novel concept of a hybrid atom cavity structure employed for Rydberg EIT sensing is now described with reference to FIGS. 5A and 5B where an exemplary type of hybrid atom-cavity structure, designated generally by numeral 500, and its operating principle for RF field enhancement, are shown. The structure 500 consists of two solid metal frames 502, which may also be referred to herein as "electrodes," separated by a gap 504 at the front of a rubidium vapor cell 506. Referring to FIG. 5B, the gap 504 between the two metal frames 502 forms a cavity 510 that resonantly couples to an impinging RF field 508, compressing a corresponding RF electric field 512 locally within the cavity volume. The word "cavity," is used herein in a general sense, to refer to any structure that imposes boundary conditions of any sort on solutions to Maxwell's equations over a specified spatial volume. A "cavity" may also be referred to synonymously herein as a "resonator" or as "resonant structure"

Figure 6:
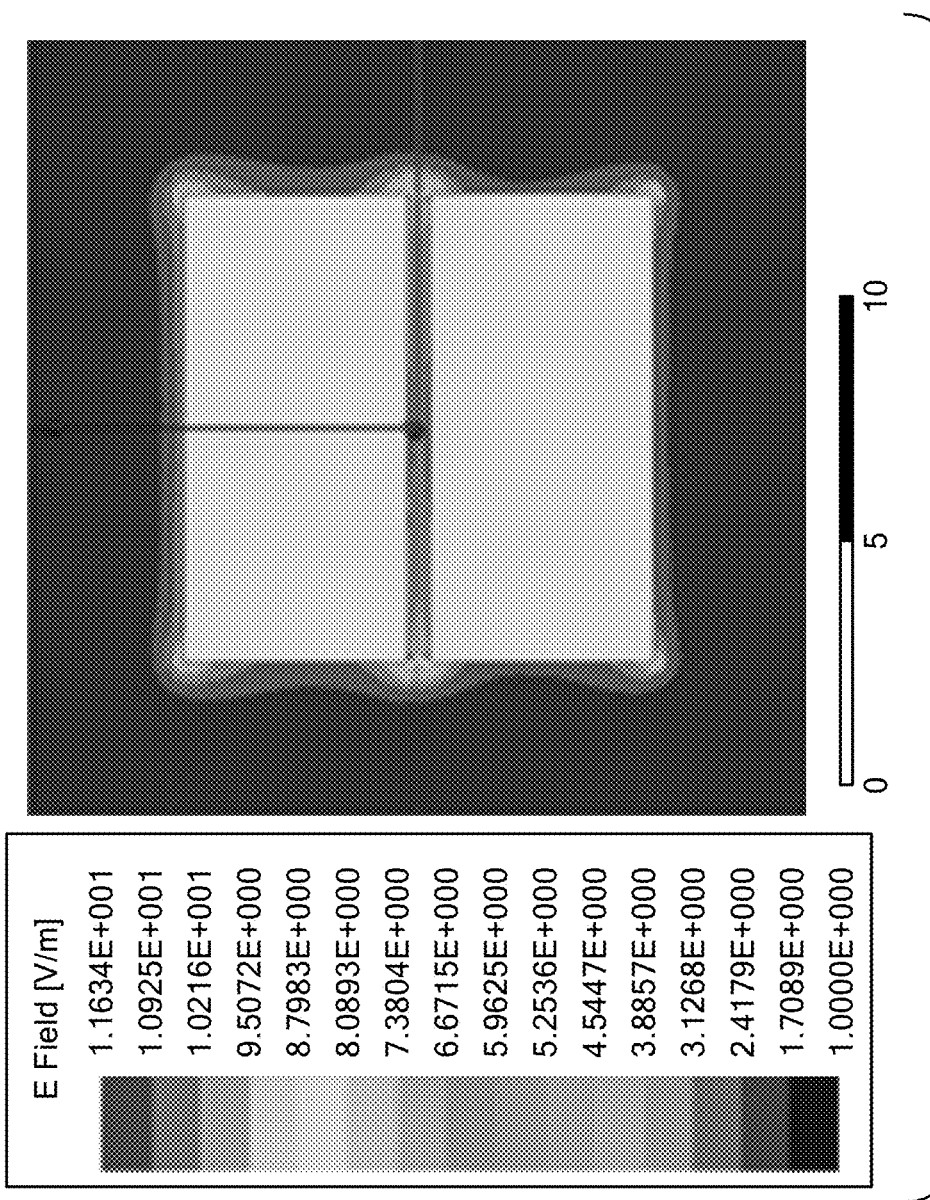
FIG. 6 shows a calculation of electric field in the hybrid atom-cavity structure shown in FIGS. 5A-5B for a near-resonant 4 GHz incident RF field of 1 V/m.

A Rydberg-atom vapor inside cavity 510 is optically interrogated for measurements of the field 512. FIG. 6 shows a calculation of the field enhancement provided by the hybrid atom-cavity structure 500 with traditionally machined electrodes inside a rubidium vapor cell, shown and described with reference to FIGS. 5A and 5B and FIGS. 7A-7D. The structure 500 has a gap size of 460 um that locally enhances the electric field 512 of 4-GHz microwaves linearly polarized along Y (vertical direction in FIG. 5B) by about a factor of 10 within the gap 504, corresponding to 20 dB in intensity. With EIT laser beam waists in the range of 50 to 100 microns, the enhanced electric field remains quite homogeneous within an active measurement volume inside a measurement channel with dimensions on the order of 0.46×0.5×9 mm. The 9 mm-long "cavity channel" (a term used herein as synonymous with both "gap" and "cavity") provides a sufficiently long interaction volume for higher optical absorption during measurement, and also advantageously provides improved signal-to-noise in the EIT spectra.

A hybrid atom-resonator device, designated generally by numeral 700, is now described with reference to FIGS. 7A-7D in accordance with an embodiment of the present invention. A perspective view, shown in FIG. 7A, highlights spectroscopic cell 702 (otherwise referred to as "atomic vapor capsule" of "vapor capsule") with internal structure corresponding to Stark tuner/compressor 704. FIG. 7B is a top view of the hybrid atom-resonator device 700. The side view in FIG. 7C shows top electrode 706 and bottom electrode 707 separated by spacer 708 to form gap 710, also referred to as a "cavity." The perspective view of hybrid atom-resonator device 700 depicted in FIG. 7D shows electrode wire leads 712 coupled via electrode connections 714 into vapor capsule 702.

To demonstrate field enhancement with a hybrid atom-cavity device for high-sensitivity atom-based RF field measurements, the hybrid atom-resonator device 700 of FIGS. 7A-7D may be deployed in the experimental setup shown in FIG. 8A. The RF field in the cavity 710 is measured using Rydberg EIT as a high-efficiency non-destructive optical probe of field-induced level shifts of high-lying Rydberg states of $^{85}$Rb atoms within the cavity 710. The relevant rubidium Rydberg EIT energy-level diagram in shown in the inset of FIG. 8B. Two laser beams with λ=780 nm (720) and 480 nm (722) are counterpropagating and overlapped through the center of the cavity 710 as illustrated in FIGS. 5B and 8A. In an exemplary embodiment of the present invention, the 780 nm beam 720 is focused to a half-width of 70 micron at the center of the cell 702 and has a power of 8 µW, while the 480 nm beam 722 is focused to a half-width of 70 micron and has a power of 40 mW. Rydberg EIT spectroscopy is performed by monitoring the 780 nm transmission through the vapor with the laser frequency stabilized to the $^{85}$Rb $5S_{1/2}$(F=3) to $5P_{3/2}$(F=4) transition while the frequency of the 480 nm laser is scanned linearly across a chosen Rydberg level at a repetition rate of a few Hz. An optical frequency reference is derived from the 480 nm laser beam 720 to calibrate the Rydberg EIT spectra.

For improved signal-to-noise in the EIT spectra, modulation spectroscopy may be implemented, in accordance with an embodiment of the present invention. As used herein, modulation encompasses any of frequency-, amplitude-, and step-modulation, or combinations thereof. For example, the 480 nm beam 720 may be amplitude modulated with a ~20 kHz square pulse at a 50/50 duty cycle and a 780 nm signal 730 derived by detection of the 780 nm beam with a photodetector 732 may be demodulated, using a lock-in amplifier (not shown) for example. The hybrid atom-cavity structure 700 is maintained at an ambient temperature of about 45° C. for increased rubidium vapor density and 780 nm absorption. The two electrodes 706 and 707 forming the cavity 710 are both electrically coupled outside the cell 702 to ground. In one example, RF fields are generated using a signal generator amplified by 20 dB feeding into a WR229 open-ended waveguide (2.577 to 5.154 GHz) 735 (otherwise referred to herein as a "guide." The measurement channel/cavity 710, with the Rydberg EIT laser beams 720, 722 passing though, is placed approximately 1 cm away from the front face of the guide 735. In the example shown, the RF and optical beams are linearly polarized, with polarizations directed in parallel along the short axis (Y) of the cavity 710.

Figure 9B:
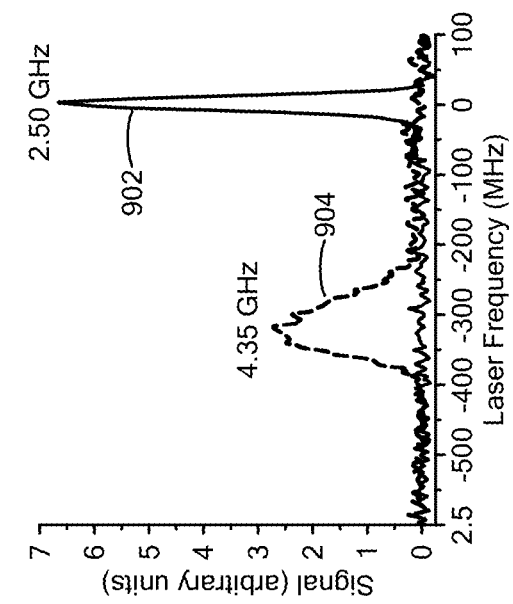
FIGS. 9A-9D demonstrate hybrid atom-cavity field enhancement in accordance with an embodiment of the present invention.
Figure 9D:
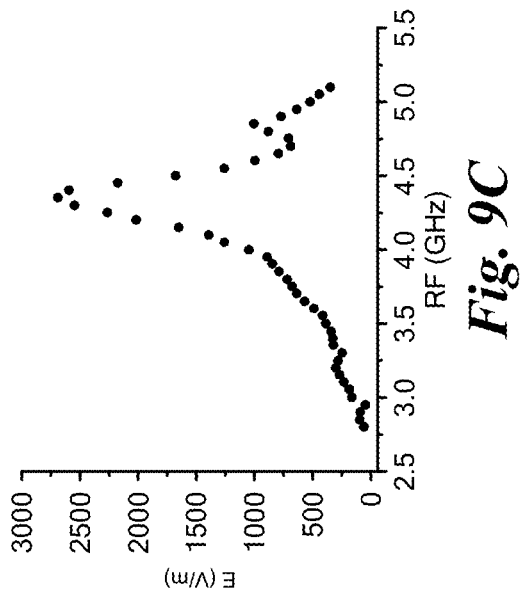
Figure 9A:
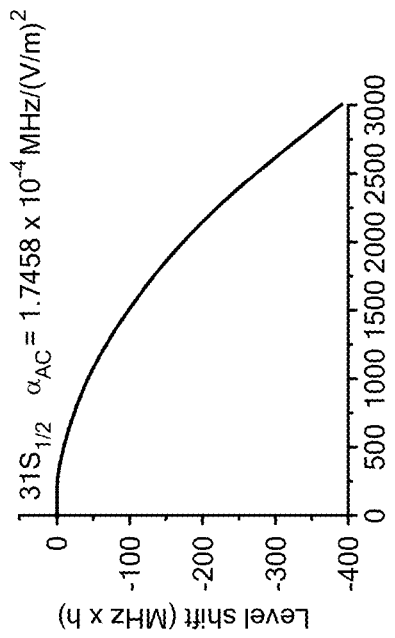

FIG. 9A shows the relative 31S Rydberg EIT spectral line shift as a function of RF/microwave frequency for a fixed −10 dBm of injected microwave power. The 31S Rydberg level is chosen such that for the 2.5 to 5.2 GHz microwave frequency range spanned in the experiment, the applied microwaves are far-off-resonance from any Rydberg transition, and the 31S state exhibits an AC-Stark shift proportional to the microwave electric-field amplitude. At the far left of the plot shown in FIG. 9A, the laser frequency axis is centered on the 31S line with an applied 2.5-GHz microwave field. For increasing microwave frequency, the 31S level begins to substantially shift around 3.5 GHz into a large microwave-cavity-induced field resonance at 4.35 GHz (4.37+/−0.01 GHz in higher-resolution scans, not shown here). Other features are evident in the spectra, including a prominent resonance at 4.85 GHz. Multiple resonances are not unexpected from this device due to the complexity of the bulk cavity structure (e.g., three holes 740 (shown in FIG. 7B) containing alumina rods for electrode/cavity alignment, and long electrode wires 712 at the back of each electrode 706, 707.

Figure 9C:
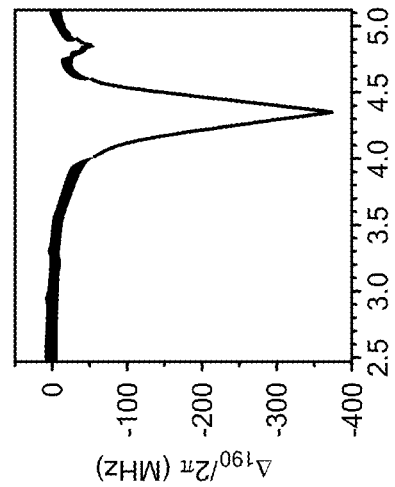

FIG. 9B plots a calculated Stark map centered on the $31S_{1/2}$ Rydberg state for an applied root-mean-square (RMS) electric field $E_{RMS}$. FIG. 9C plots microwave $E_{RMS}$ versus frequency obtained using FIGS. 9A and 9B, while FIG. 9D plots measured EIT lines for 2.5 (trace 902) and 4.35 GHz (trace 904) microwaves, respectively.

The example discussed herein illustrates the adaptability, as a matter of design choice by persons skilled in the art, of the geometry of hybrid devices for high electric-field measurement sensitivity at desired application-specific RF/microwave frequencies. In this example, microwave electric field amplitudes are obtained by fitting the microwave-induced AC-Stark-shifted lines measured spectroscopically to Gaussian functions and converting the peak frequency shifts to electric field values using calculated Stark shifts of the rubidium 31S Rydberg state. FIG. 9B shows a calculated Stark map centered on the field-free $31S_{1/2}$ Rydberg state for an applied electric field. FIG. 9C shows the resulting microwave electric field measured inside the cavity as a function of microwave frequency. At the 4.35+/−0.05 GHz resonance, a cavity-enhanced microwave field $E_{RMS}$>=13.5 V/cm was measured with a relative uncertainty <0.3 V/cm, given by the <0.1 MHz fitting uncertainty of the peak positions.

In FIG. 9A, the EIT linewidth increases from 21.7 MHz at 2.5 GHz to 84.0 MHz at 4.35 GHz (see also FIG. 9D). This increase is attributed to field inhomogeneities in the measurement volume, which occur because the EIT beams 720, 722 and the cavity channel 710 are comparable in size, and near-field effects at the cavity edges are sampled by the optical beams. The edges and corners at the ends of the 9-mm long cavity channel 710, where the EIT beams enter and exit the cavity in the atomic vapor, may also contribute. For measurement applications requiring narrower spectroscopic line widths, inhomogeneous field broadening may be mitigated by implementing cavity structures with larger cavity volumes and/or by using smaller beam sizes for more spatially-localized measurements.

To estimate the cavity enhancement factor for the electric field, a cavity-enhanced 4.35 GHz field measurement described above with reference to FIGS. 9A-9D may be compared to the field measured outside of the cavity 710. For this, the EIT beams 720, 722 are moved by $\Delta z=-0.9$ mm towards the front of the vapor cell 702 and waveguide 735 from the center of the cavity 710. To obtain a measurable line shift at this position outside of the cavity, the injected microwave power is increased from −10 to −5 dBm. This is a factor of 3.16 higher in power (and 1.78× higher in field) compared to that used in the discussion of FIGS. 9A-9D. Under these conditions, a 4.35 GHz microwave-field-induced AC-Stark shift of −3.80 MHz is measured, corresponding to an $E_{RMS}=1.47$ V/cm. Using this value for the RF field outside of the cavity, accounting for the increased injected power and neglecting the change in field emitted from the waveguide over the small $\Delta z$ ($|\Delta z|/d=0.03<<1$, where $|\Delta z|=0.9$ mm is the beam position relative to the cavity and d=29.1 mm is the short axis of the waveguide), a cavity field-enhancement factor of $$\frac{13.5 \text{ V/cm}}{1.47/1.78 \text{ V/cm}} = 16.3$$

is obtained, equivalent to a 24 dB increase in sensitivity.

Simulations are discussed below with reference to FIG. 12, simulating the field inside the hybrid atom-cavity structure for an incident 4.37 GHz microwave field with an amplitude of 1 V/m that is linearly polarized along y. This simulation yields an enhancement factor of 18.6, which is about 14% higher than the measured value for 4.35 GHz fields. The difference may be explained by the 0.02 GHz difference in frequency between the measured and simulated fields. The simulations do not account for microwave losses due to the dielectric cell 702 that depend on the exact cell geometry including wall dimensions and material dielectric constant for the microwave frequencies of interest.

In a complementary implementation of a hybrid device, instead of inserting resonant structures 510 into a cell containing the atomic vapor, an atomic vapor may also be incorporated within a resonant structure, within the scope of the present invention. This may be desirable, for example, in applications where the atomic measurement needs to be incorporated into existing RF systems (horn receivers, waveguides, etc.) for absolute leveling of RF power and field. As an example, a sensing element 100 discussed with reference to FIG. 1, a similar narrow dielectric capsule 232 containing an atomic vapor, could be incorporated within the measurement channel 710 of a resonant structure 510 like the one shown in FIGS. 5A-5B or 7A-7D. Within the scope of the present invention, resonant structure 510 may be any type of RF resonator or component.

Figure 10A:
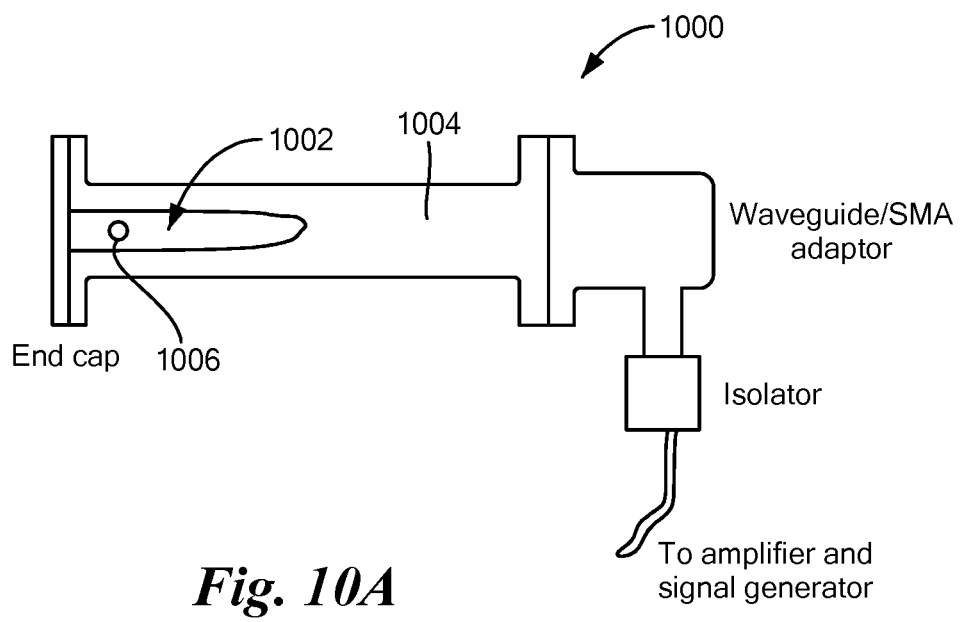
FIGS. 10A and 10B show side and end views of a field measurement system with an atomic vapor cell internal to a waveguide, in accordance with an embodiment of the present invention.
Figure 10B:
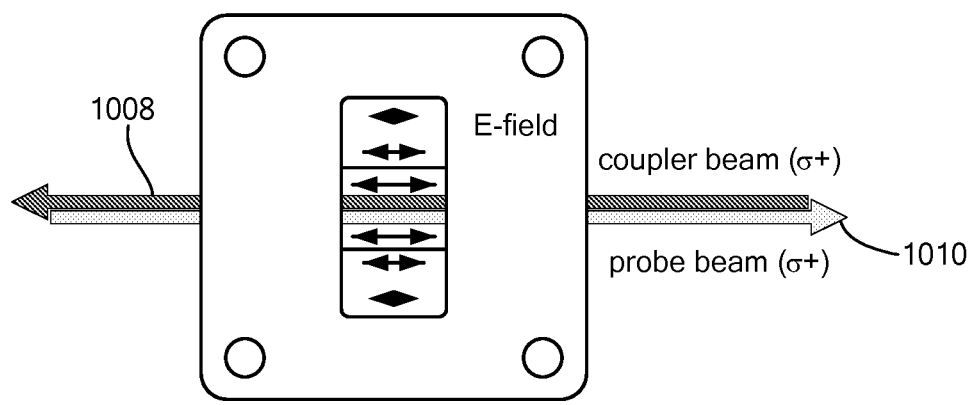
Figure 12A:
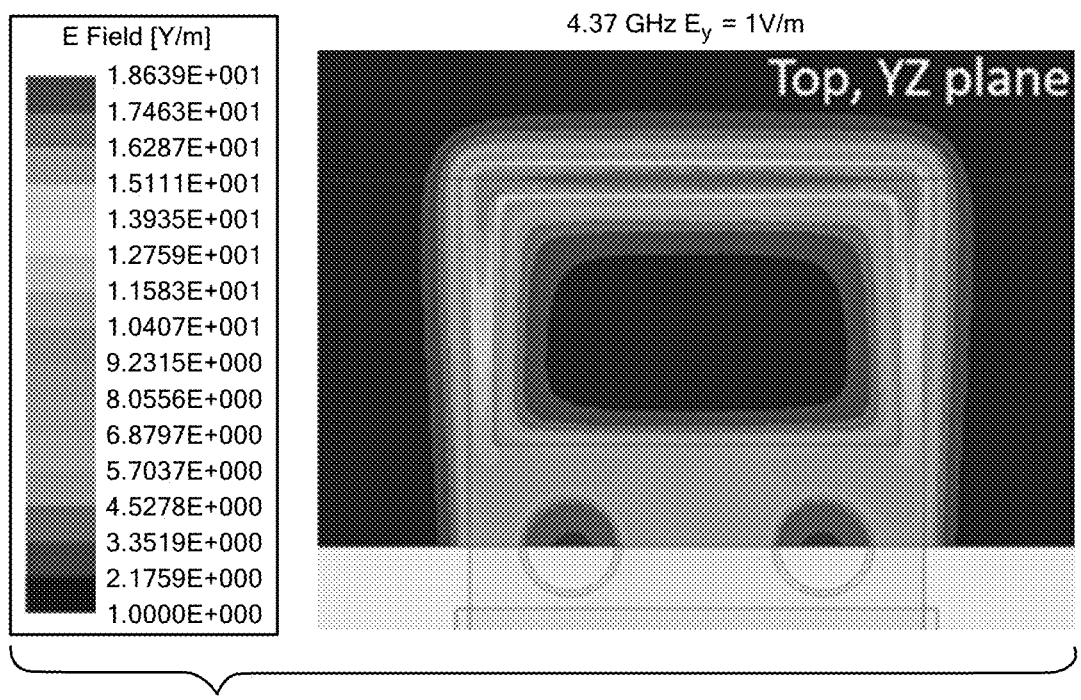
FIG. 12A shows results of calculations of electric field amplitude, and FIGS. 12B-12D, of electric field vector direction, in the hybrid atom-cavity structure of FIGS. 7A-7D, in accordance with an embodiment of the present invention.
Figure 12B:
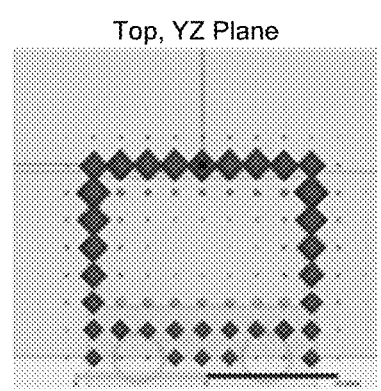
Figure 12C:
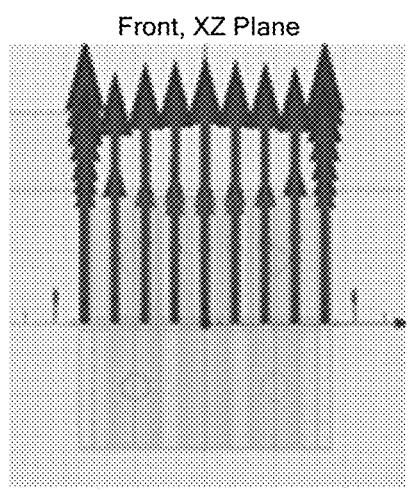
Figure 12D:
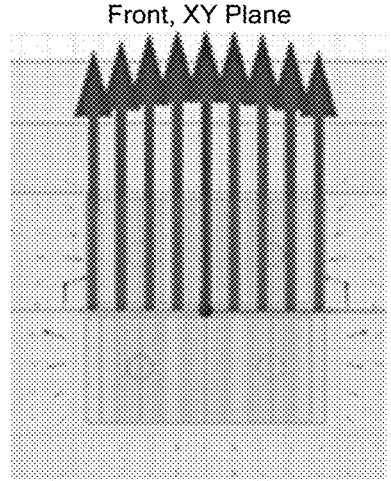

Another implementation, within the scope of the present invention, having a vapor cell 1002 inside a waveguide 1004 is now described with reference to FIGS. 10A and 10B wherein, respectively, side and end views of a field measurement system designated generally by numeral 1000 are shown. A hole 1006 in the waveguide 1004 provides for passage of EIT coupler 1008 and probe 1010 beams. This system has been used for high-intensity field measurements inside the waveguide. Such a hybrid system may be advantageously inserted into an existing RF circuit for absolute leveling of the power through the circuit. A hybrid device incorporating an atomic vapor in a horn, diode, waveguide structure, or coaxial cable, as examples, provides a versatile compact internal module for measurement, calibration, or power leveling etc. in microwave sources, transmission systems and other instruments in land, sea, air and space-based applications.

The absolute sensitivity achievable using a hybrid atom-resonator device 700 as described herein may be tailored and further increased by implementing Rydberg levels with higher principal and/or orbital quantum numbers, as well as Rydberg states that are resonantly coupled to the cavity-enhanced RF field, all within the design capacity of a person of ordinary skill in the art. All such enhancements are within the scope of the present invention. The field enhancement and sensitivity may be further customized, for example, by engineering the hybrid devices with resonant structures other than those heretofore described and with metamaterials that are known in the art or discovered in the future. Complementary implementations in which the atomic vapor is incorporated within a resonant structure, also within the scope of the present invention, may be of particular advantage when integrating an atomic measurement capability into existing RF systems (horn receivers, waveguides, etc.) and DC circuits/components.

Polarization Selectivity in a Hybrid System

Another feature of hybrid devices like the one described above is their ability to discriminate between different RF/microwave polarizations to achieve polarization-sensitive atom-based field measurements. For the cavity structure shown in FIGS. 5A-5B and 7A-7D, the cavity 710 acts as a RF-polarization filter in which only RF fields with a linear polarization component along the cavity axis Y are coupled into the cavity and field-enhanced within the active measurement volume.

FIG. 11A shows experimental 31S Rydberg AC-Stark shifts as a function of applied microwave frequency at a fixed injected power for different angular positions Θ of the microwave field polarization vector relative to vertical (Y axis). This is done by rotating the waveguide 735 (shown in FIG. 8A) in the XY-plane counter-clockwise about the Z axis from Θ=0° (short waveguide axis along Y) to 90° degrees (short axis of waveguide along X) in 10° steps. At Θ=0°, the microwave polarization is aligned with the cavity axis of cavity 710 for maximal coupling into the cavity, as evident from curve 1102 shown in FIG. 11A. As Θ increases, the signal decreases as the linear (Θ=0°) component of the microwave field parallel to the cavity axis decreases. FIG. 10B plots microwave electric field at 4.35 GHz (obtained from the 31S line shifts and calculated Stark map as described previously) as a function of Θ for the data shown in FIG. 10A. As Θ is increased, the field decreases because the Θ=0°—component of the microwave field vector (the component that couples into the resonance) decreases with a cos Θ-dependence. A cosine-fit to the data, given by the dashed curve 1110 in FIG. 10B, confirms this expectation, though the 4.35 GHz field in the cavity does not reach zero at Θ=90° due to cavity imperfections such as slight electrode misalignment and surface quality. It follows that the power of a linearly-polarized, resonant electromagnetic wave coupled into the resonator and detected by the atoms within the resonator gap has a $\cos^2$ Θ-dependence, where Θ is the microwave polarization angle defined above. It is therefore seen that such cavity resonators emulate the functionality of an integrated microwave polarizer.

DC Field Tuning Capability Utilizing Electrode-Integrated Vapor Cells

A major limitation of Rydberg-atom-based measurements of weak RF fields is that they generally require the RF field to be resonant with dipole-allowed Rydberg transitions, which afford large electric dipole moments and a strong atomic response to electric fields. Consequently, weak-field measurements can only be made for discrete sets of RF frequencies that are resonant with one of the finite number of discrete transitions within a given atom. To overcome this limitation, it is desirable to tune atomic level energies and transitions using external fields into or near resonance with the RF field of interest to afford sufficient atomic sensitivity for a measurement. Hybrid atom-resonators, suggested for the first time in accordance with the present invention, provide a practical means to apply local fields to the atoms using cavity/antenna/electrode structures themselves for this purpose.

Figures 13A, 13B:
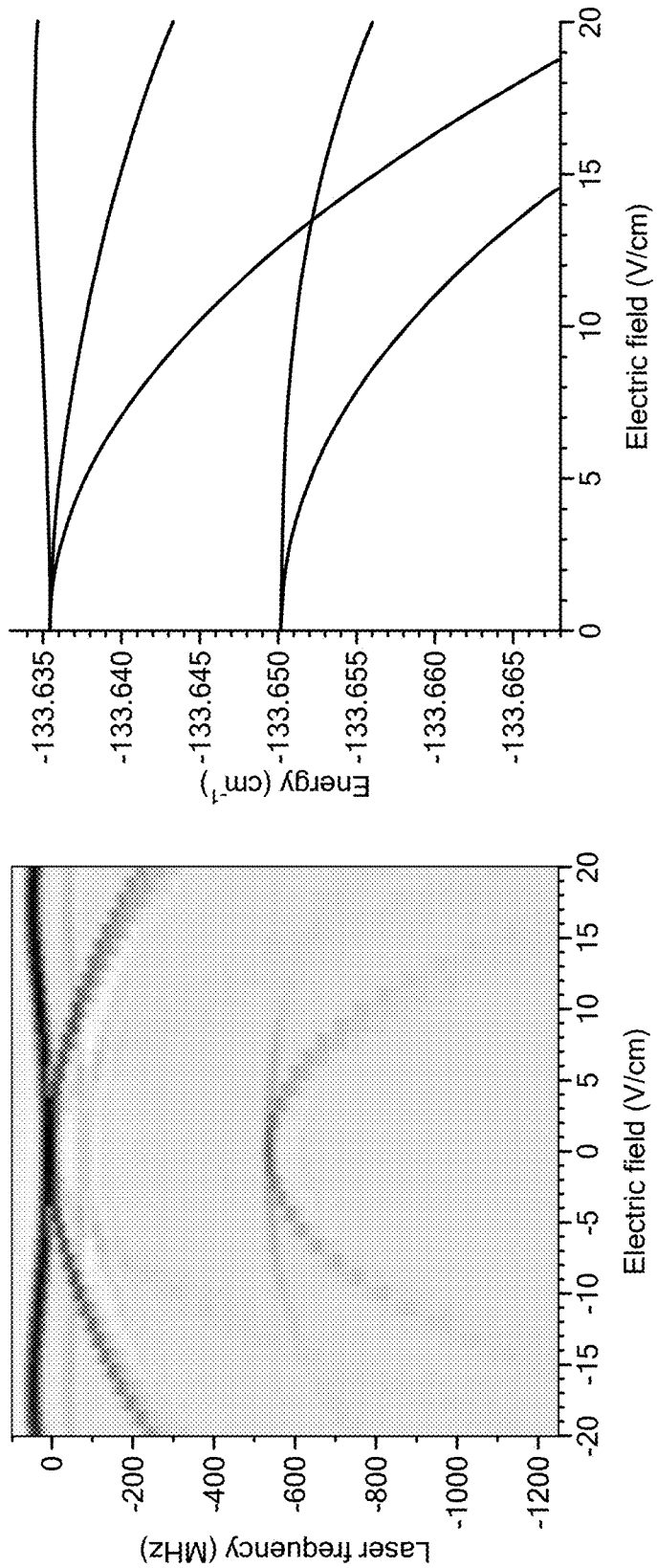
FIGS. 13A and 13B show experimental and calculated DC Stark maps, respectively, of the 30D Rydberg state for an applied DC electric field.

Using the hybrid atom-resonator 700 described above, and in accordance with further embodiments of the present invention, the same electrodes described above in the context of RF-field enhancement are used, simultaneously or separately, to apply DC electric fields to Stark-tune Rydberg transition frequencies into resonance with weak RF fields. FIGS. 13A and 13B show experimental and calculated DC Stark maps, respectively, of the 30D Rydberg state for an applied DC electric field. Note, the Stark maps are symmetric about zero field. The experimental spectral map in FIG. 13A is obtained using the cavity by grounding one electrode and applying a voltage on the other electrode to generate a DC field within the measurement channel 710 (shown in FIG. 5B). The map of FIG. 13A shows the three |mj|=0.5, 1.5, 2.5 sublevels of the j=2.5 fine structure component and both |mj|=0.5, 1.5 sublevels of the j=1.5 fine-structure component. With zero field and linearly polarized optical beams, the rubidium EIT ladder scheme illustrated in FIG. 5B optically excites |mj|=0.5 and 1.5 Rydberg sublevels due to m-mixing by the 5P3/2 hyperfine structure. The appearance of the weak j=2.5, |mj|=2.5 Rydberg level in the experimental spectrum may be due to slight misalignments or ellipticity of the optical-beam polarizations.

FIGS. 13A and 13B provide a demonstration of tuning Rydberg levels and transitions using DC electric fields in a hybrid atom-cavity or similar structure with electrodes integrated with an atomic vapor or gas. As an example, a two-RF-photon transition between the $30D_{5/2}$ and $30D_{3/2}$ mj=1.5 levels may be considered. With an electric field of 0 V/cm applied, this amounts to a transition that is resonant at ~540 MHz, and that is dipole allowed in second order using two ~270 MHz RF photons. At an electric field of +/−10V/cm, the energy difference between the states increases to ~h*700 MHz (where h is the Planck constant in appropriate units), and the transition that is dipole-allowed using two ~350 MHz RF photons. By application of a DC field from 0 to +/−10 V/cm, one can continuously tune the transition to be resonant with RF photons anywhere between ~270 and 350 MHz. The range of tunability can be extended, within the scope of the present invention, using, for example, higher field values, different atomic states with different polarizabilities and electric dipole moments, and multi-photon excitation processes.

AC-Stark-Tuning Using External Electrodes

Figure 14:
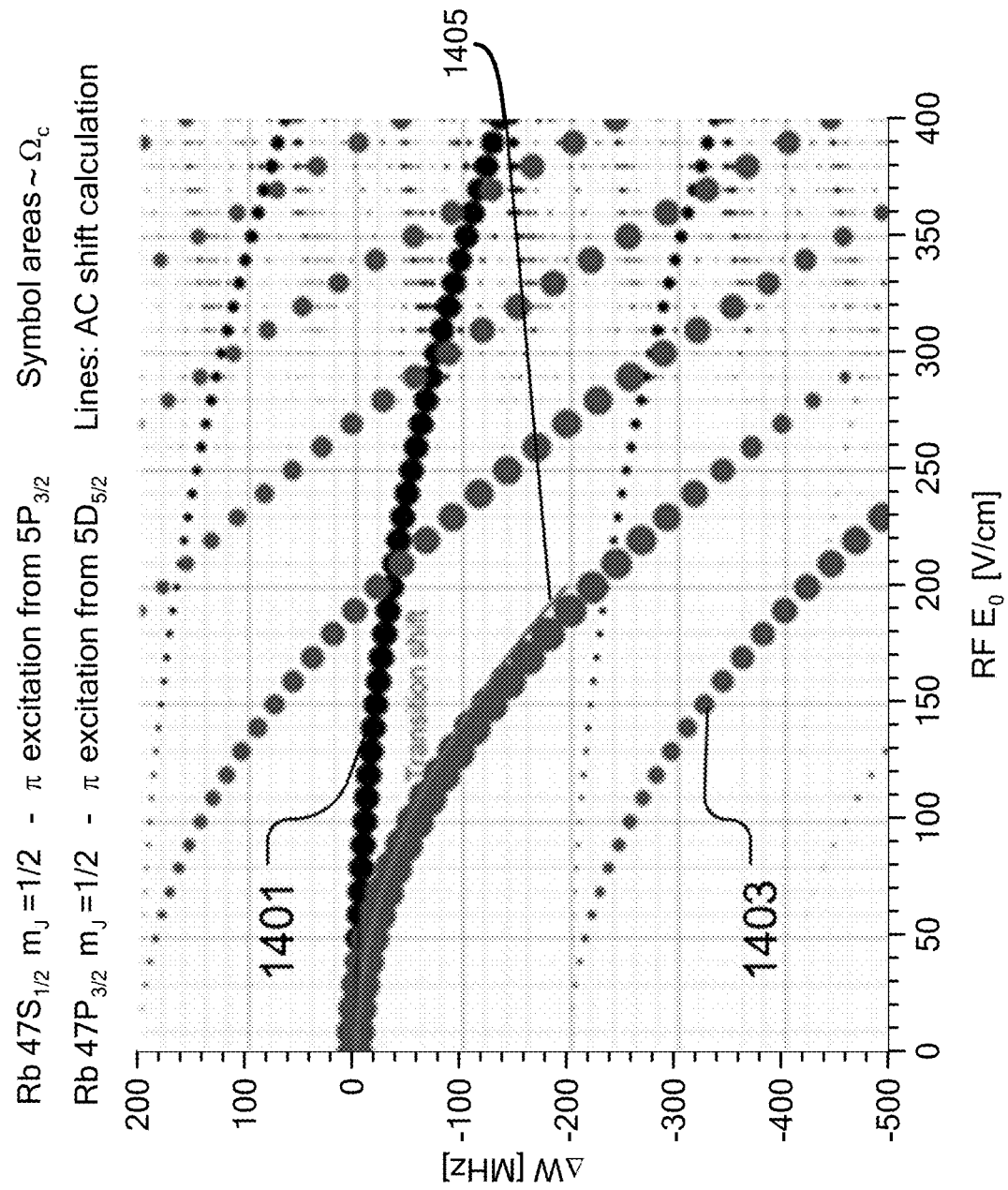
FIG. 14 depicts Floquet calculation of AC Stark shifts of the rubidium 47S and 47P levels in a 100 MHz RF field.

Continuous-frequency measurements of weak Ka-band microwave electric fields can similarly be accomplished by AC-Stark-tuning Rydberg transitions using low-frequency RF applied with internal or external tuning electrodes, both as described above. In one embodiment of the invention, an AC-Stark-tuning 100 MHz RF field is applied to a vapor cell using external electrodes to Stark-tune the transition into resonance with microwaves off-resonant from the RF-field-free transition. FIG. 14 shows calculated Floquet spectral maps for both the 47S state (1401) and 47P state (1403) modulated by the 100 MHz RF field. The 47S and 47P maps are overlaid and referenced to the same zero-field frequency to show the RF-induced differential shift of the 47S1/2 to 47P3/2 transition. Thus, it may anticipated that from 0 to 200 V/cm of applied 100 MHz RF the resonant microwave transition is continuously tuned down by about 200 MHz.

Figure 15:
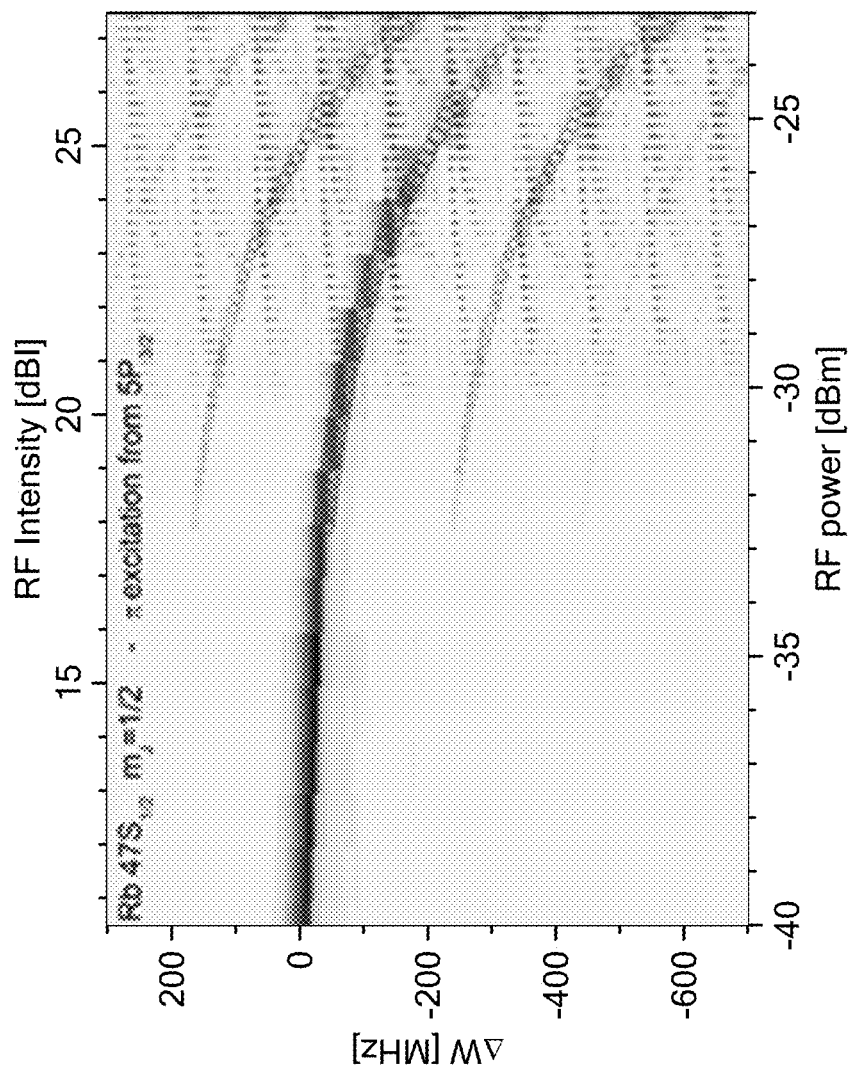
FIG. 15 plots an RF intensity and electric field calibration on the rubidium 47S state.

An RF intensity and electric field calibration on the 47S state is shown in FIG. 15, mapping incident RF power to shifting of the 47S state at different Stark detunings of the excitation beam. The experimental and calculated maps are in excellent agreement, yielding a dBI to dBm conversion of dBI=dBm+50.5 and electric ($E_0$) field calibration using $I=I_0*10^{dBI/10}=\frac{1}{2} \varepsilon c E_0^2$, where $I_0=1$ W/m², ε is the free-space permittivity, and c the speed of light. The calibration in FIG. 15 is then employed to set the RF electric field for a desired differential shift of the 47S to 47P transition (curve 1405 in FIG. 14) at which the $K_a$-band microwaves are tuned into resonance.

Figure 16:
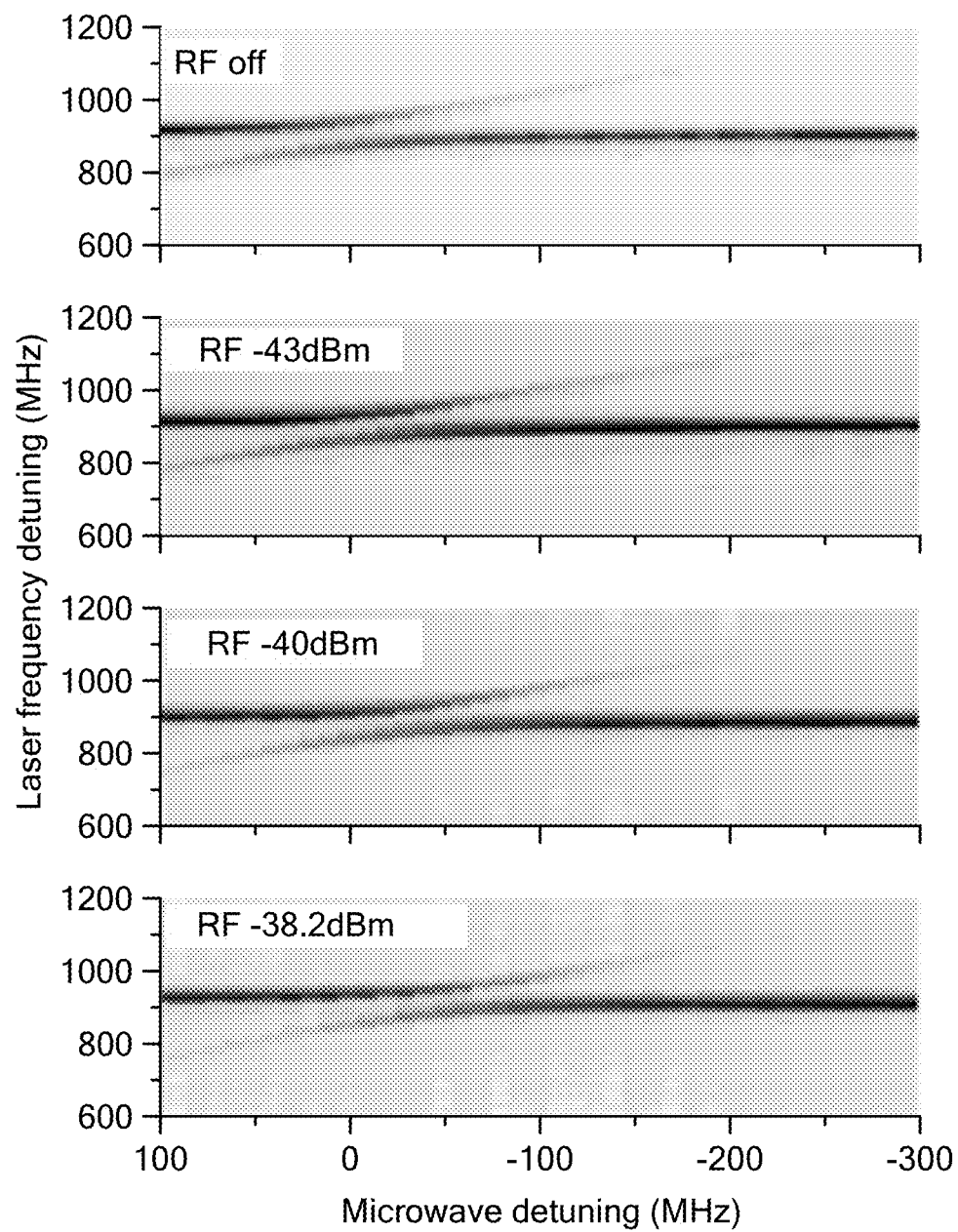
FIG. 16 plots measured EIT spectra of the 47S state versus microwave frequency detuning from 37.51663492 GHz) at a fixed −14 dBI microwave intensity (separate calibration) for 4 different injected RF powers.

Avoided crossings have been used in the interpretation of electric-field induced l-mixing population in high-l states, as reported, for example, by Zhang et al., "Stark-induced L-mixing interferences in ultracold cesium Rydberg atoms," *Phys. Rev. A*, vol. 87, 033405 (2013). In FIG. 16, measured EIT spectra of the 47S state versus microwave frequency detuning from 37.51663492 GHz (RF-free transition frequency) at a fixed −14 dBI microwave intensity (separate calibration) for 4 different injected RF powers/field strengths in the cell. With no RF applied (top plot in FIG. 16), the 47S line exhibits the expected Autler-Townes behavior as the microwave frequency is scanned across the RF-field-free resonant transition. The center of the avoided crossing lies at 0 MHz detuning, where the Autler-Townes-split peaks are split symmetrically. As the RF power/field is increased (lower plots in the figure), the avoided crossing shifts to greater microwave detunings, tracking the AC-Stark-tuned transition frequency. At an applied −38.2 dBm of RF (bottom plot in FIG. 16) the microwaves are resonant with the transition at a detuning of about 60 MHz.

Figure 17:
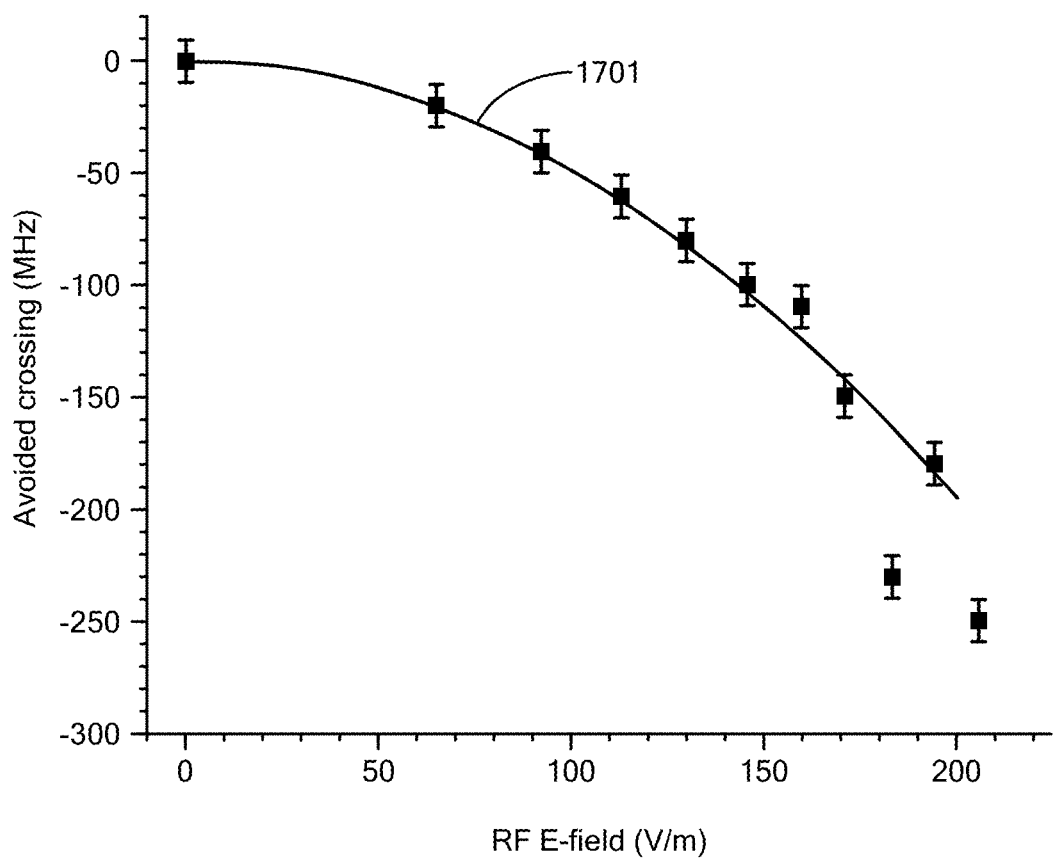
FIG. 17 plots the center of the measured avoided crossing as a function of applied RF electric field for a series of values out to about 200 V/cm.

In FIG. 17 the center of the measured avoided crossing is plotted as a function of applied RF electric field for a series of values out to about 200 V/cm. Uncertainty bars are set to the approximate EIT linewidth of +/−10 MHz. The calculated differential shift shown in FIG. 14 is plotted here again by curve 1701 for comparison with the experimental shift. The match between experiment and calculations is excellent over nearly the entire range, with the measured AC-Stark-shift exhibiting the expected quadratic dependence on the applied RF field. At the highest RF fields, couplings between modulated side bands of the 47S and 47P states along with variations in the atom-microwave-field coupling strength, make it difficult to discern the center of the avoided crossings in the spectra under certain experimental conditions (large optical Rabi frequencies and EIT line widths), leading to deviations between the plotted measured and calculated values. Continuous AC-Stark tuning beyond the ~200 MHz microwave detuning measured here is possible, where transitions between modulated side bands and other Floquet states in strong fields may also be used.

It is to be understood that, within the scope of the present invention, AC-Stark tuning may also use electrodes in the sensing element but external to the vapor cell for continuous-frequency microwave electric field measurements.

Integrated Split-Ring Resonators

One example of a field-conditioning structure, within the scope of the present invention, is provided by split-ring resonators 1801, described with reference to FIGS. 18A-18D. Split-ring resonators 1801 are simple resonant structures commonly used for metamaterials in the microwave, mm-wave fields, and THz regions of the electromagnetic spectrum. Split-ring field amplifiers share conceptual similarities with plasmonic resonances of microspheres used in the optical and infrared spectral ranges for spectroscopy and light harvesting applications. Atomic vapor cells in quantum RF sensing elements that have integrated split-ring structures engineered to achieve low-noise field amplification, high sensitivities, and polarization selectivity in atom-based RF electric-field sensing applications constitute another embodiment of atom-cavity structures for advanced sensing capabilities.

Figure 18A:
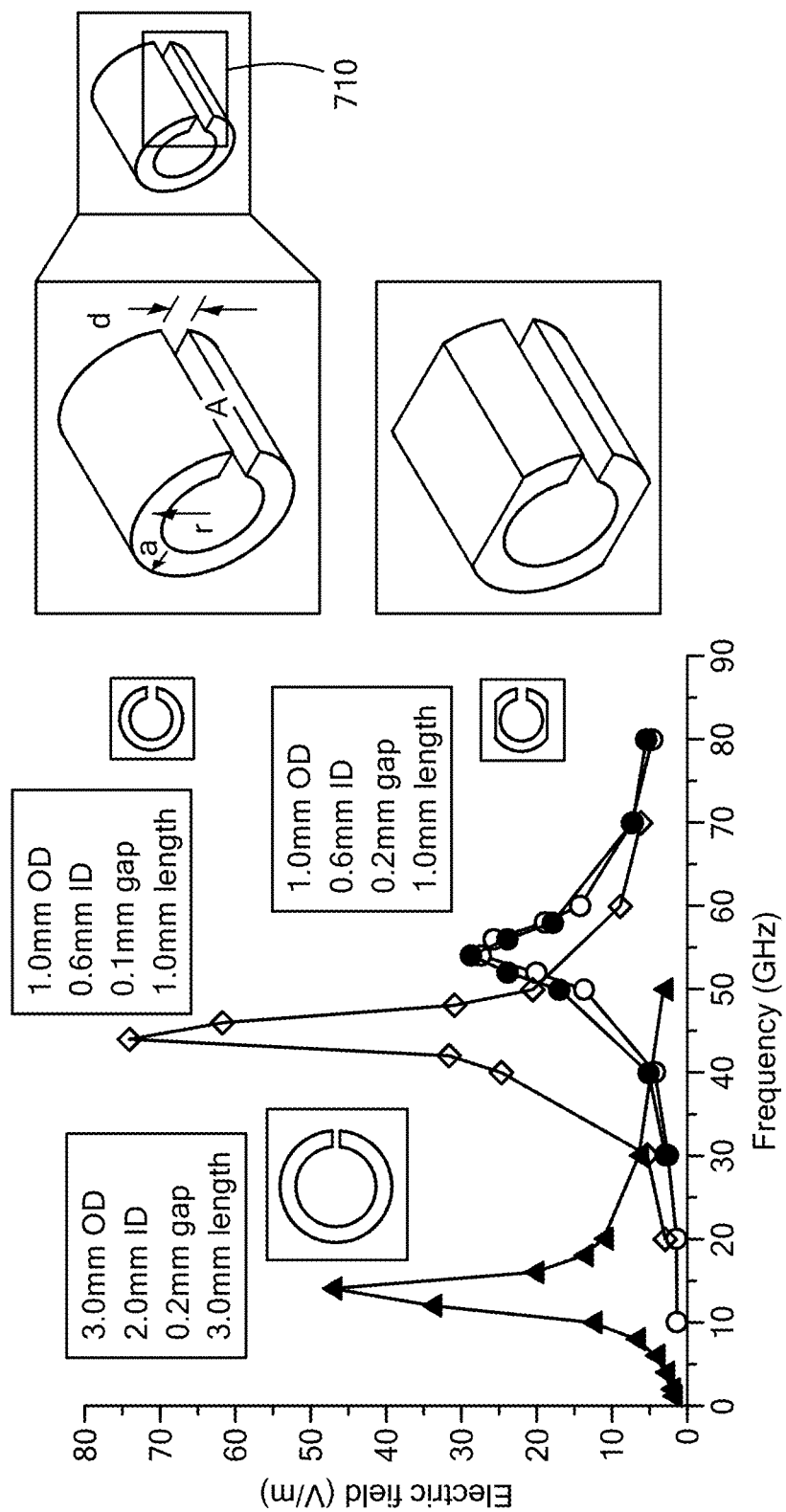
FIG. 18A shows simulated electric field generated inside four different split-ring cavity structures for a 1 V/m incident field as a function of applied frequency.

FIG. 18A illustrates the structure of one basic type of split-ring structure: a tubular ring with a single slit. At resonance, an electric field of an incident mm-wave field 1803 becomes compressed at a slit (or "gap") 1805. The gap 1805 also defines the measurement channel 710 where the atomic vapor is optically probed for a measurement of the amplified field. This operating principle is illustrated in FIG. 18b for a slit/gap with dimensions of 1×0.2×0.2 mm for the split-ring shown in the inset, and a vertically polarized microwave field incident on the cavity from the right. In FIG. 18a, we plot the simulated electric field value inside the slit of this resonator type for three different gap sizes and geometries as a function of incident microwave field frequency (fixed 1V/m incident field amplitude). These split-rings exhibit resonances at 14, 44, and 54 GHz, with field amplification factors of 46.8×, 74.1×, and 27.3×, respectively. The resonance frequencies can be engineered with simple geometrical parameters of the split-rings. In FIGS. 18C and 18D, simulated resonance behaviors of other split-ring resonator structures are plotted, including square tubular structures, which provide amplification at 42.5, 125, and 94 GHz, with respective amplification factors of 81.9×, 12.5×, and 9.4×. These amplification factors correspond to intrinsic, non-electronic gains ranging from about 20 dB to 35 dB. Using 1 mV/m as an upper limit to the target field measurement sensitivity without amplification, a hybrid device affording 81.9× field amplification of 42.5 GHz microwaves could achieve an effective sensitivity at the 0.01 mV/m level (for the incident field).

Other split-ring resonator structures as well as other types of resonators, such as concentric high-Q microwave cavities, applied to field enhancement in vapor cells are within the scope of the present invention.

Non-Contact Optical Heating of Vapor Cells for Temperature Stabilization

Contact-free, all-optical vapor cell heating, as now described with reference to FIGS. 19A-19C may be an essential component as an active vapor pressure control system for Rydberg RF sensors and hybrid-devices, for which the temperature control hardware (electronics, metal wires) must not alter the detector's RF field response. In accordance with embodiments of the present invention, one or more optically-absorbing materials are incorporated into the cell. The optically-absorbing material is heated via absorption or inelastic scattering of an incident light beam, which in turn heats the atomic vapor (or solid metal) within the cell for higher atomic vapor densities. The atoms may be in conductive thermal contact with the optically-heated element by, for example, using cells constructed out of IR-absorbing glass, or indirectly heated by an optically-absorbing material element that is in thermal contact with the vapor enclosure.

In addition to heating, it is important to stabilize the temperature of the cell during operation. This can be important when measurements are performed in environments where external air temperatures can significantly alter the cell temperature. This is of concern particularly when using small cells (on the order of mm of less), whose atom temperatures and densities are more susceptible to environmental temperature fluctuations due to their smaller volumes. To address this, active stabilization may be implemented, within the scope of the present invention, by actively monitoring changes in the atomic vapor temperature or density via the optical absorption through the cell of a second laser beam that is resonant with an atomic transition. This absorption signal provides an active feedback to the amount of optical heating power that is required to reach a desired temperature and density. Further, the cell can be thermally insulated from its environment by, for example, incorporating an insulating vacuum layer between the optically-heated cell and the environment.

Referring to FIGS. 19A-19C, in accordance with an all-optical vapor cell heating method integrated into a Rydberg RF sensor, an IR-absorbing glass capsule is illuminated by a bright light source to raise the inside temperature, where an atomic vapor cell is located. FIGS. 19A and 19B show an IR-glass capsule 1901 enclosing a 4 mm inner diameter atomic vapor cell 1903. FIG. 19C shows an all-optical heating test platform. A light source 1905, such as a 50-Watt halogen bulb, is imaged onto the capsule, and the temperature of the IR glass capsule 1901 is monitored using a temperature sensor, such as a thermistor (not shown), placed in the IR glass capsule volume. A feedback loop between the thermistor and light source intensity is implemented to regulate the temperature inside the capsule, providing a stabilized operating temperature for uniform heating of an atomic vapor cell. A steady-state temperature of up to 130° C., uniformly distributed within the capsule, is achieved in one embodiment. Active temperature stabilization of the capsule temperature at 50° C. (a typical operating temperature when using small 4 mm inner-diameter Rb cells) has also been realized.

RF Phase Measurement Capability Using Modulated Laser Fields

Methods for employing a sensing element to extract the phase of an RF field are now described. In accordance with embodiments of the present invention, a phase-sensitive recording of a coherent electromagnetic field on a surface may advantageously allow the reconstruction of the field in all space. Applications of this reconstruction principle abound and include holography in optics, radars based on interferometric schemes, such as SAR and InSAR, and far-field characterization of antenna radiation patterns based on near-field measurements of amplitude and phase of the field emitted by the antenna under test. In the last application listed, the measurement is performed on a surface, and a near-field to far-field transformation is applied to calculate the field in all space.

To achieve phase sensitivity in a field measurement, a holographic method is typically employed. There, a reference wave interferes with the waves emitted by the object. In the present case, the object considered is an antenna under test that emits an RF field that needs to be fully characterized. The reference wave, with a well-defined amplitude and phase, is preferably a plane RF field that interferes with the object waves within the atomic vapor cell or hybrid atom-cavity cell structure. Here, the cell is manufactured such that the atom-field interaction volume measures less than one RF wavelength across, in any given direction. The atom-field interaction volume is given by the overlap between the atomic vapor, the probe laser beam, and the coupler laser beam. The magnitude of the coherent electric-field sum of the object and reference mm-wave or microwave fields is then measured using well-established methods.

The measured magnitude depends on the phase difference between the reference and the object waves. In principle, such readings can be obtained on a surface surrounding the object. This may be achieved, for example, by moving a vapor-cell sensor unit on a suitable grid with a spatial resolution much smaller than the RF wavelength. The phase-sensitive electric-field values measured on the grid then allow for a full three-dimensional reconstruction of the object wave. To obtain the far field of an antenna under test one can use known algorithms for the near-field/far-field transformation. This measurement method can be readily extended to include full polarization sensitivity for the electric-field vector utilizing hybrid atom-cavity structures (see above) or other spectroscopic techniques.

In RF field phase measurements, the generation of a well-characterized reference wave presents a considerable problem. For comparison, we first consider optical holography. There, the reference wave typically is an expanded, near-perfect plane-wave laser beam that interferes with the object scatter within a layer of photographic emulsion (or an equivalent substance). It is well known in optical holography that the purity of the reference wave is important. The system should be largely free of diffraction rings caused by dust particles and other imperfections. Spurious reflections of the reference wave from smooth glass surfaces are an even greater problem. In the context of an RF measurement, this condition is very hard to meet, even when using state-of-the-art anechoic chambers. For quantitative work, it would also be important that the reference wave has fixed amplitude or, at least, a well-known, slowly varying amplitude function. The preparation of a defect-free RF reference wave that has a smooth amplitude behavior over a large surface presents a great challenge and is not always possible.

FIG. 20A schematically depicts a sensing element back-end, designated generally by numeral 2000, and an operating principle for phase-sensitive measurements of RF electric fields, in accordance with an embodiment of the present invention. A microwave horn 2002 (MW) stands for any antenna under test or other object wave of interest. A fiber modulator 2004, driven by RF source 2006, phase-coherently imprints an RF reference beat onto a coupler beam 104 sent to the atoms in the vapor cell 106. The RF reference beat replaces the reference beam that is normally needed in phase sensitive (holographic) field measurement. The vapor cell 106 in the atom-based RF sensing element is of dimensions ~1 mm, and is fiber-coupled to the 780 nm and 480 nm laser beams. The single-sided fiber-coupled sensing element 100 is mounted on a sensor stick (not shown) with minimal dielectric profile. The sensing element and stick is the only part of the detector that is actually in the RF field. The fiber modulator and the optical phase control element are integrated with a remote-control station (not shown) of the sensor external to the sensing element 100, and it includes the lasers, signal readout electronics, and a computational unit for analysis. FIG. 20B depicts a quantum mechanical level scheme and optical/RF excitation pathways used in the phase-sensitive RF electric-field measurement.

To address these practical measurement needs, a solution is integrated into the atom-based RF sensing element and measurement. The operating principle is to imprint a phase-coherent RF reference onto the optical coupling laser beam via an electro-optic modulation technique. Using a fiber-optic high-frequency modulator, which is commercially available, the coupler beam is frequency- or amplitude-modulated at a frequency $\omega_{RF}$ that is identical with the frequency of the RF field to be measured. In one implementation, the field frequency is chosen such that it also is identical with half the separation between two neighboring S-type Rydberg levels. The level energies and their separations are known to very high precision. There are many choices for such transitions. Further, the carrier frequency of the coupler laser beam 104 is adjusted such that it is resonant with a transition 2010 to the $nP_{3/2}$ Rydberg level in-between the S-levels. The Rydberg nP level is not exactly at the midpoint between the two S Rydberg levels, leading to detunings $\Delta$ of the modulated coupler frequencies 2012 from the S-state resonances. In rubidium, these detunings are on the order of 100 MHz and are typically larger than the Rabi frequencies of any of the involved transitions. Hence, the two-photon Rabi frequencies that describe the transitions from 5P into nP via the absorption of one coupling laser photon and the absorption (channel B in FIG. 20B) or the stimulated emission (channel A in FIG. 20B) of an RF photon are given by $$\Omega_A = \frac{\Omega_{5P(n+1)S}\Omega_{RF(n+1)SnP}}{2\Delta}[\exp(i(\varphi_{5P(n+1)S} - \varphi_{RF}))]$$

$$\Omega_B = \frac{\Omega_{5PnS}\Omega_{RFnSnP}}{-2\Delta}[\exp(i(\varphi_{5PnS} + \varphi_{RF}))]$$

There, $\Omega_{5PnS}$ and $\Omega_{5P(n+1)S}$ are the Rabi frequencies of the optical coupler-laser transitions into the S Rydberg levels, $\Omega_{RF*}$ are the Rabi frequencies of the RF transitions from the S Rydberg levels into the $nP_{3/2}$ Rydberg level, and $\varphi_{RF}$ is the phase of the RF field. Also, $\varphi_{5PnS}$ and $\varphi_{5P(n+1)S}$ are the phases of the modulation sidebands of the coupling laser. Note there is an important difference in sign in front of the $\varphi_{RF}$ in the above equations. Further, the RF field amplitude $E_{RF}$ is included in $\Omega_{RF*}$ because $\Omega_{RF*}=E_{RF}d_*/\hbar$, where $d_*$ are the well-known RF electric-dipole transition matrix elements for the RF Rydberg-to-Rydberg transitions. The net coupling, $\Omega_C$, between the 5P state and the nP Rydberg state is then given by the coherent sum of channels A and B in FIG. 20B), $$\Omega_C = \frac{\Omega_{5P^*S}\Omega_{RF^*}}{2\Delta}[\exp(i(\varphi_{5P(n+1)S} - \varphi_{RF})) - \exp(i(\varphi_{5PnS} + \varphi_{RF}))],$$

where it has been assumed, for simplicity, that $\Omega_{5PnS}$ and $\Omega_{5P(n+1)S}$ are the same, and that both RF Rabi frequencies are the same (both of which are true to good approximation). These assumptions are not critical but help elucidate the math. The optical phases $\varphi_{5PnS}$ and $\varphi_{5P(n+1)S}$ are well defined and are not prone to drift, because all frequency components of the modulated coupling laser beam follow the exact same geometrical path. As a useful optical component, a four-prism phase control element or equivalent in the modulated coupler laser beam is used to control the difference between the optical phases $\varphi_{5PnS}$ and $\varphi_{5P(n+1)S}$. It is seen from the previous equation that the net coupling takes the form $$\Omega_C = \Omega_{C0}\cos(\varphi_{RF}+\Phi)$$

where $\Omega_{C0}$ is a (complex) phase-independent pre-factor and $\Phi$ is an offset phase that can be adjusted with the dispersion control element 2003 in the coupler beam (in FIG. 20A, this is done by shifting the prisms unit 2005 left/right). Since the strengths of the Rydberg-EIT lines observed in the spectra are generally proportional to $|\Omega_C^2|$, the EIT line strength is proportional to $\cos^2(\varphi_{RF}+\Phi)$. The EIT line strength therefore carries the phase information on the RF field. We note that the 5P to nP transition is forbidden; therefore, the coupler-beam carrier (thin blue line in FIG. 24b) does not introduce an additional term in the analysis. In more general cases, such a term could, of course, be included. Further, the magnitude of the pre-factor $\Omega_{C0}$ can be determined by finding the peak EIT line strength while varying $\Phi$ with the dispersion control element in the coupler beam. The obtained peak value for $\Omega_c$ then reveals $\Omega_{C0}$, which in turn yields the RF electric-field magnitude. In this way, $E_{RF}$ and $\varphi_{RF}$ can both be measured.

In this description, RF field phase (and amplitude) measurement capability is accomplished by introducing an RF reference wave via optical frequency modulation. The novelty of this approach lies in that it eliminates the need for an external RF reference wave by substituting it with an optical modulation of laser beams directly applied to the atoms in the quantum RF sensing element. In practice, a reference wave could also be introduced at the location of the sensing atoms in the atom-based RF sensing element using cell-integrated electrodes or cavity structures (a hybrid system) as illustrated in FIGS. 5A and 5B, or by using an external reference wave.

Modulated RF Detection in Atomic Vapor Cells

For telecommunications applications, the detection of modulated RF fields is desired. Due to the EIT response time of <100 ns, amplitude and frequency modulations of high-frequency fields can be directly detected using the atom-based sensing element as an RF/optical transducer without resorting to quantum interference. Similarly, RF phase-modulation detection follows from the phase-detection capability described above. In the following, typical scenarios are described.

AM modulation at acoustic frequencies: Most Rydberg states in the Floquet map, at any carrier frequency between ~100 MHz and several 100 GHz, exhibit a differential dynamic dipole moment, with magnitudes ranging into thousands of Debye. An EIT line on the map has a linewidth given by coupler and probe Rabi frequencies. For modulation purposes, a moderate probe and a large coupler Rabi frequency may be used, so as to maintain a rapid EIT response time to the AM, and to broaden the EIT line to several 10 s of MHz. With the carrier RF applied to the EIT test cell, and choosing an operating point of the coupler-laser frequency on one of the inflection points of the Rydberg-EIT line, an AM of the RF signal will lead to a direct response in the photodiode readout of the EIT sensing element. For a differential dipole moment d, the AM depth in field, dE, must be dE<hxdL/d, where dL is the EIT linewidth. Hence, the relative modulation depth dE/E<hxdL/(E d). This value may range from several 10% down to 1%, depending on exact conditions and sensitivity requirements.

In accordance with one embodiment of the invention, one may convert an acoustic signal using a microphone, linear amplifiers, and a voltage-controlled RF attenuator to produce an AM-modulated RF test field. The EIT test signal is transmitted using an antenna or a microwave horn. An EIT cell is used as receiver. Choosing an operating point as described, the EIT probe photodiode signal is sent through a band-pass that transmits the acoustic frequency range. The detected signal is amplified and sent to a recording device and/or loudspeaker. Note that in this method on the receiver side (the EIT cell and the processing of the EIT probe laser signal) no demodulation is required. The EIT physics serves as demodulator. The same receiver principle can be applied when detecting an AM-modulated transmission from elsewhere. Since the EIT sensor cell worked into the antenna receiver is optically coupled, an AM receiver based on it is highly EMI and EMP-proof and can withstand high-voltage spikes, while constituting a sensitive AM radio receiver under regular operating conditions. Modulation of FM fields can be implemented in a similar fashion.

Incoherent RF Fields and RF Noise Measurement Capability

Figure 22:
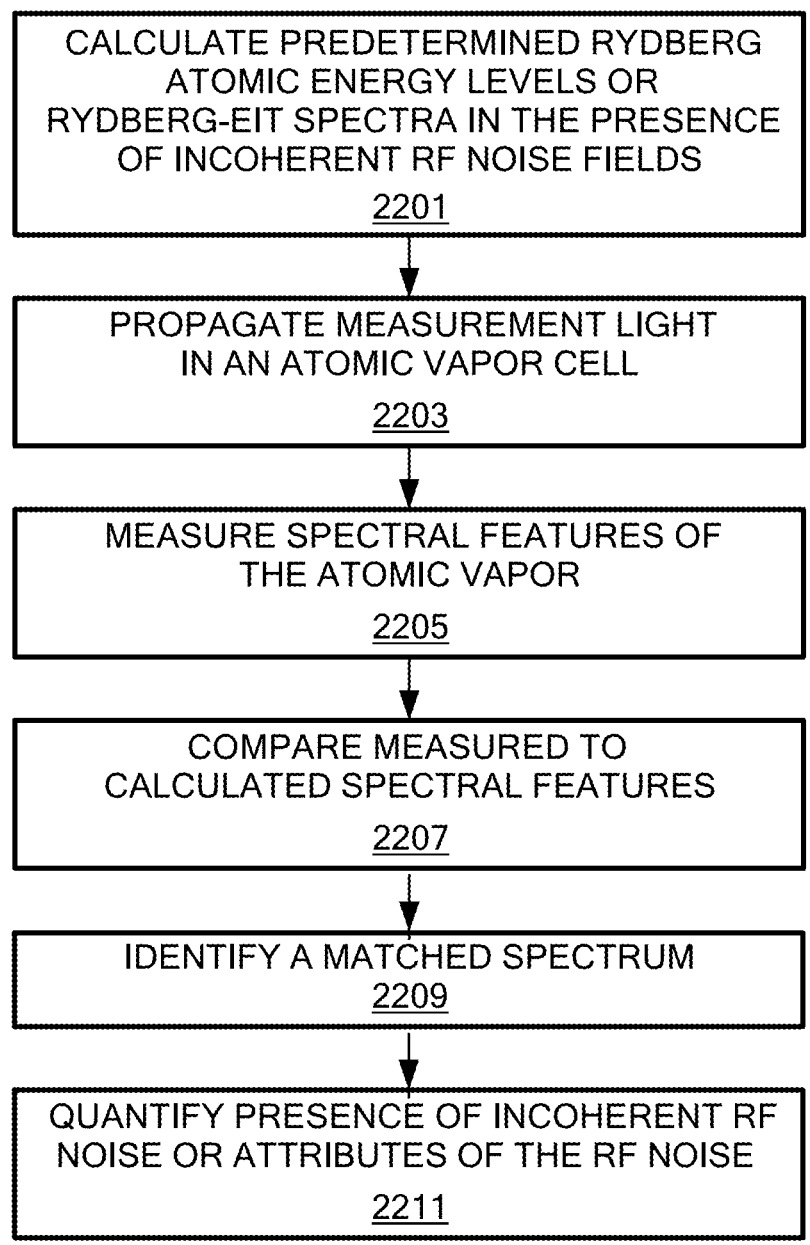
FIG. 22 is a flowchart depicting steps in the Rydberg-EIT measurement of attributes of RF noise over a specified spectral range, made possible for the first time in accordance with an embodiment of the present invention.

Prior to the present invention, Rydberg-EIT systems were capable of characterizing only coherent RF fields, since Autler-Townes splitting requires the interaction of coherent fields. That physical constraint has been lifted for the first time in accordance with the present invention as now described. Steps in quantifying RF noise attributes in accordance with an embodiment of the present invention are now described with reference to FIG. 22. In a first step 2201, predetermined Rydberg atomic energy levels or Rydberg-EIT spectra in the presence of incoherent RF noise fields are calculated. A model of the Rydberg-EIT under the presence of noise is presented in the following sections. Measurement light is propagated 2203 in an atomic vapor cell, and spectral features of the atomic vapor are measured 2205. Measured to calculated spectral features are compared 2207 and a matched spectrum is identified 2209. This provides for quantifying 2211 the presence of incoherent RF noise and attributes of the RF noise, including spectral noise density, spectral power, electric field amplitude, polarization, RF noise fields propagation direction, and source characteristics such as the gain of a horn antenna that may emit such RF noise.

In RF electric-field measurements with Rydberg EIT and Autler-Townes in atomic vapors, an EIT probe beam couples two atomic levels |1> and |2>, the EIT coupling beam couples level |2> to a Rydberg level |3>, and the RF field to be measured couples level |3> to another Rydberg level |4>. The Rabi frequency of the RF-driven transition, $\Omega_{RF}$, then becomes apparent in an Autler-Towns (AT) splitting of two lines, observed in the EIT spectrum, which in turn leads to the electric field via a basic atomic-physics calculation. To account for the effect of broadband RF field noise in this type of atom-based RF electric field measurement, a quantitative description of the effects of broadband microwave noise is required. The situation considered may be fairly common, because microwave amplifiers typically add broadband noise to the amplifier's output; the noise will then affect the atom-based electric field measurement.

To conform with a generic experimental test situation, in this treatment it is assumed that both the coherent microwave signal, the amplitude of which is to be measured, and the noise signal are transmitted from a common microwave horn that is located at a distance greater than the horn's far-field limit. The basic theory described here is sufficient to lay out the physics of the noise-induced effects. The theory can later be expanded to cover more general types of field geometries, opening up a wider range of uses (without adding substantially new basic-physics insights).

The effect of broadband noise on the Rydberg-atom system consists of two main parts. The Rydberg levels |3> and |4>, which are populated by the coherent sources (lasers, coherent microwave radiation), can transition into other Rydberg levels due to the frequency components of the noise spectrum that are resonant with transitions between Rydberg states. This process is akin to decays driven by blackbody radiation. The usual treatment, in which the radiation field is quantized and the transition rate is obtained from Fermi's golden rule and summing over the possible field polarizations and accessible final angular-momentum states needs to be modified so that it applies to a noise field that has a well-defined polarization and propagation direction (given by the microwave horn's geometry). Also, the black-body energy density of the field must be replaced by the situation-specific noise characteristics. At the location of the atoms, the noise has a spectral intensity, i.e. a noise intensity per frequency interval, measured in W/(m² Hz), that may either be known or may actually be a subject of study, $$I_v = \frac{dI}{dv}(v).$$

To model the assumed RF field testing scenario, in which the coherent microwave field to be measured and the noise are applied to the atoms via the same microwave horn, and that the atoms are located in the far field of that horn, we quantize the field in one dimension only (the propagation direction of the microwave fields emanating from the horn) and assume a fixed field polarization. For the noise-induced transition rate, $R_{fi}$, from an initial state |i> into a final state |f>, analysis indicates that $$R_{fi} = \frac{e^2}{2\epsilon_0 \hbar^2 c} |n \cdot \langle f|\hat{r}|i\rangle|^2 I_v(|v_{fi}|),$$

where n is the field-polarization unit vector and $v_{fi}$ the transition frequency, $(E_f - E_i)/h$, with $E_f$ and $E_i$ denoting the energies of the initial and final Rydberg levels. These rates are in SI units and have the unit "per atom and per second". Note $R_{if} = R_{fi}$. For the given states of interest (which, in the present case, are labeled |3> and |4>) we calculate the rates, $R_{fi}$, for a known noise spectrum $I_v(|v|)$.

In the assumed measurement scenario, the coherent microwave field to be measured drives the transition between Rydberg states |3> and |4>. If the noise spectrum covers the transition |3> and |4>, the noise-induced transitions must be included in the Master equation in the form of two noise-induced bi-directional decay terms with equal rates, $R_{34} = R_{43}$. It further is necessary to include $R_{34}$ and $R_{43}$ in the coherence decay rates of any off-diagonal density matrix elements that involve levels |3> or |4>, or both.

For transitions |3>→|f> and |4>→|f> different from the coherently driven |3>↔|4> transition, the noise drives transitions at rates per atom of $R_{f3} = R_{3f}$ and $R_{f4} = R_{4f}$. Note that the noise-populated levels |f> have no coherences between each other and with any of the levels |1>-|4>, because the noise-induced transitions have a random quantum phase. Hence, all levels |f> that become populated from level |3>, due to the noise, may be lumped into a fictive level |d>. Similarly, all levels |f> that become populated from level |4>, are lumped into a fictive level |e>. Due to electric-dipole selection rules, there is no overlap between the levels lumped into the fictive level |d> (which becomes populated by the noise from |3>) and the levels lumped into the fictive level |e> (which becomes populated by the noise from |4>).

The net rates into the fictive levels are $$R_{d3} = \sum_{f \neq 3,4} R_{f3}$$

$$R_{e4} = \sum_{f \neq 3,4} R_{f4}$$

It also is $R_{d3} = R_{3d}$ and $R_{e4} = R_{4e}$. The noise also induces AC shifts that are calculated based on the same field quantization model, and using second-order perturbation theory. The shifts of levels |i>=|3> or |4> are found to be $$\Delta E_i = \sum_{f \neq i} \left[ \frac{e^2 v_{fi}^3 |n \cdot \langle f|\hat{r}|i\rangle|^2}{hc\epsilon_0} \int_{v_{min}}^{v_{max}} \frac{I_v(v)}{v^2(v^2 - v_{fi}^2)} dv \right].$$

The integration limits $v_{min}$ and $v_{max}$ are chosen wide enough that the entire noise spectrum is covered. Note that due to the $v_{fi}^3$ term the signs of the transition frequencies are important (as expected). The AC shifts of levels |3> and |4> will need to be added into the Master equation as noise-induced detuning terms. The noise-induced AC shifts of all other Rydberg levels that are included in the model via lumping them into the fictive levels |d> and |e> are not important.

Comparing the above three equations it is seen that the AC shifts are harder to calculate than the decays. For the decays, only transitions with frequencies that lie within the noise band have effects, and the noise spectral density is only required at these frequencies. Typically, only a few—sometimes even no—Rydberg-Rydberg transitions involving levels |3> or |4> are within the noise band. In contrast, all allowed transitions involving levels |3> or |4>, including transitions with frequencies outside the noise band, are in principle relevant in the equation above. Also, for each of these transitions, an integral over the entire noise band needs to be evaluated. For transitions within the noise band some care needs to be exercised because of the pole.

To evaluate the above equations, one requires the noise spectral intensity function, $I_v(v)$. In many scenarios, it will be possible for the user to measure the power spectral density function, dP/dv, of the noise injected into the horn using a spectrum analyzer. Propagation equations available in textbooks then yield an equation for $I_v$ (v), $$I_v(v) = \frac{c\epsilon_0 \times 59.96}{2x^2} g_L(v) \frac{dP}{dv},$$

where dP/dv is inserted in units W/Hz and the distance from the horn, x, in meters. The spectral power, dP/dv, is normalized such that it integrates to the total noise power that is injected into horn (in Watt). The linear gain for the horn, $g_{L(v)}$ is typically provided by the manufacturer's specifications of the horn. The result for $I_v$ (v) is then entered into the above equations to get the noise-induced decay rates and AC level shifts.

With results of the above equations, the four-level Master equation of the problem can be extended to include the effects of noise up to second order. The state space of the Master equation is amended by the fictive "levels" |d> and |e> that will hold the net populations, $\rho_{dd}$ and $\rho_{ee}$, that are transferred by the noise out of the respective levels |3> and |4> (the levels coupled by the coherent microwave signal whose electric field is to be measured). The amended Master equation includes additional terms in the equations for the level populations of the Rydberg states |3> and |4>, $$\dot{\rho}_{33} = \text{(other terms)} + R_{d3}(\rho_{dd} - \rho_{33})$$

$$\dot{\rho}_{44} = \text{(other terms)} + R_{e4}(\rho_{ee} - \rho_{44}).$$

The equations for the decay of the coherences that involve levels |3> and/or |4> also need to be amended so that they include all $R_{3d}$-, $R_{3e}$- and $R_{34}$-terms. The new equations for the fictive levels |d> and |e> are $$\dot{\rho}_{dd} = -R_{d3}(\rho_{dd} - \rho_{33})$$

$$\dot{\rho}_{ee} = -R_{e4}(\rho_{ee} - \rho_{44}).$$

The modified Master equation includes no equations for any coherences for the fictive levels (the coherences involving the fictive levels are always identical zero). After amending the standard four-level Master equation with all these terms, it is solved using standard methods yielding the coherence $\rho_{12}$ as a function of coupler-laser frequency, which is needed to extract the EIT spectrum.

The model EIT spectrum can be obtained, for instance, by computing the Beer's absorption coefficient in the medium as a function of coupler-laser detuning, $\alpha(\Delta_C)$, for a given atomic vapor and cell temperature used. Note this involves an integral over the Maxwell velocity distribution in the cell, because each velocity class has its own Doppler shifts of coupler and probe beams. The ratio of input and output probe powers is then given by $e^{-\alpha L}$, where L is the cell length. It is noted that, after using all experimentally available input and the computed atom-specific matrix elements for all noise-driven transitions, <f|r|i>, there is no fit parameter left to adjust the model results. This results in absolute, fit-free agreement when comparing measured and modeled spectra of the Rydberg-EIT-AT spectra under the influence of broadband noise.

Continuous-Frequency RF Electric Field Measurement Capability Using Strong Atom-Field Interaction Regime As the term is used herein, the term "strong atom-field interaction regime" refers to microwave fields characterized by electric field intensities exceeding those of an Autler-Townes regime in which a two-level treatment suffices to describe observed spectral line splittings. In order to measure RF electric fields in a strong atom-field interaction regime Floquet states are considered that exhibit a high density of states, varying differential dynamic dipole moments throughout and multiple avoided crossings. Such a treatment is suggested for the first time in accordance with an embodiment of the present invention.

Plasma Diagnostic

Certain methods in accordance with embodiments of the present invention may be referred to as a plasma diagnostic using electromagnetically-induced transparency on plasma-embedded particles or plasma constituents for measurements of plasma fields, particle interactions, and parameters. A method is described for plasma field measurements and diagnostics that employs electromagnetically induced transparency (EIT) or electromagnetically induced absorption (EIA) as a high-resolution quantum-optical probe of energy-level shifts of plasma-embedded Rydberg atoms that serve as highly-sensitive local electric-field sensors with a large dynamic range.

One embodiment of an EIT-based plasma diagnostic is now described with reference to FIGS. 23A-23C. Tracer particles of rubidium or another species suitable for EIT are incorporated into a plasma 2300 during its generation. The tracer atoms are optically interrogated using EIT with the EIT beams 2303 overlapped spatially with the tracer atoms within the plasma as shown. The relevant atomic level structure and Rydberg-EIT configuration is illustrated for rubidium atoms in FIG. 23C, which consists of a 780 nm probe laser beam 2320 whose frequency is resonant with the 5S1/2 to 5P3/2 D2 transition, and a counter-propagating 480 nm coupler beam 2322 whose frequency is scanned around the 5P3/2 to Rydberg-state transition. In this example, the 58S Rydberg state is chosen. The EIT beams are overlapped and focused to a beam waist to optimize EIT signal strength and desired spatial resolution within the plasma 2300 (typically ~100 micrometers). The probe transmission is detected on a photodetector 2306 for readout. As the coupler beam is scanned across Rydberg-state resonances, the tracer atoms become transparent to the probe light when the coupler frequency matches a 5P to Rydberg-state resonance and a reduction in the probe transmission is detected. In this way, Rydberg-EIT spectroscopy is performed on the tracer atoms within the plasma that are susceptible to the plasma environment (field, particles). From the EIT spectra, information on the plasma fields and particles is then obtained from plasma-induced Rydberg line shifts and line-shape changes, which can be calculated to high precision.

The polarizability of low-angular-momentum Rydberg states scales as $\sim n^7$, where n is the principal quantum number. This strong scaling affords a wide field measurement and sensitivity range for the diagnostic by tuning the coupler laser frequency to target the desired Rydberg level for the measurement.

In plasma science and applications, the plasma can be confined using magnetic fields which have a direct influence on the characteristics of the plasma. Further, magnetic fields arising from charge currents inside plasmas are themselves of interest. The EIT plasma diagnostic can also be used for measurements of plasma magnetic fields following the same methodology. Calculated spectra of Rydberg atoms in magnetic fields as well as spectra in combined magnetic and electric fields allow measured EIT spectra from tracer atoms in, say, a magnetically-confined plasma to be mapped onto its corresponding electric and or magnetic field.

In another embodiment of the diagnostic, described with reference to FIG. 23B, tracer atom bunches 2330 are generated from a cold-atom source 2332, such as atoms collected in a magneto-optically trap, and injected into the plasma of interest using a pulsed pusher beam 2334. Similarly, a pulsed beam of hot atoms or molecules could be used. The atoms are seeded into the plasma where they can interact with the plasma and its environment. The atoms are then optically interrogated using a Rydberg-EIT optical probe 2336 that is overlapped spatially and temporally with the atom bunch within the plasma. The optical probe transmission is similarly detected on a photodetector 2306 for readout and analysis. In this configuration, a particle collector/detector 2340 such as a microchannel plate (MCP) may also be integrated and used to measure the atom bunch flux that passes through the plasma and provide additional information on plasma density via collision-induced losses from the atom bunch as it interacts with the plasma, or similarly by detection of charges/molecules resulting from interactions between the atoms and plasma constituents.

Atomic High Magnetic Field Sensor and Measurement Method

In accordance with further embodiments of the present invention, a method is disclosed that underlies a new probe technology for high magnetic field sensing and measurement.

The field measurement method described herein is based on atomic spectroscopy of a low-density atomic vapor encapsulated in a small (about 1 cm diameter or less) glass cell. In the atom-based field measurement method, laser beams are used to measure magnetic-field-induced atomic energy level shifts caused by the Zeeman effect. In advanced implementations, we propose to also harness the exaggerated diamagnetic response of highly excited Rydberg atoms to the magnetic field in order to reach higher sensitivity in strong fields. Magnetic fields exceeding a few times 0.1T split hyperfine levels of Rydberg states into multiple Zeeman sublevels and transition from the weak-field (linear Zeeman) regime into the Paschen-Back regime. The resultant saturated-absorption spectra exhibit lines that are considerably more spread out, and cross-over resonances disappear because of the decoupling of nuclear and electronic spins. The absolute line positions and the relative separations between them are excellent magnetic-field markers.

Figure 25C:
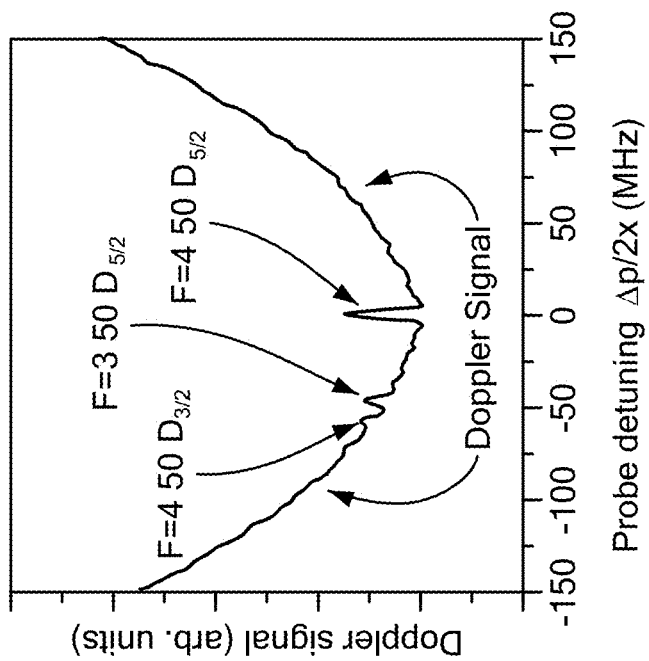
FIGS. 25A-25C schematically depict measuring a strong magnetic field using saturation absorption spectroscopy of a three-level Rydberg quantum system, in accordance with an embodiment of the present invention.
Figure 25B:
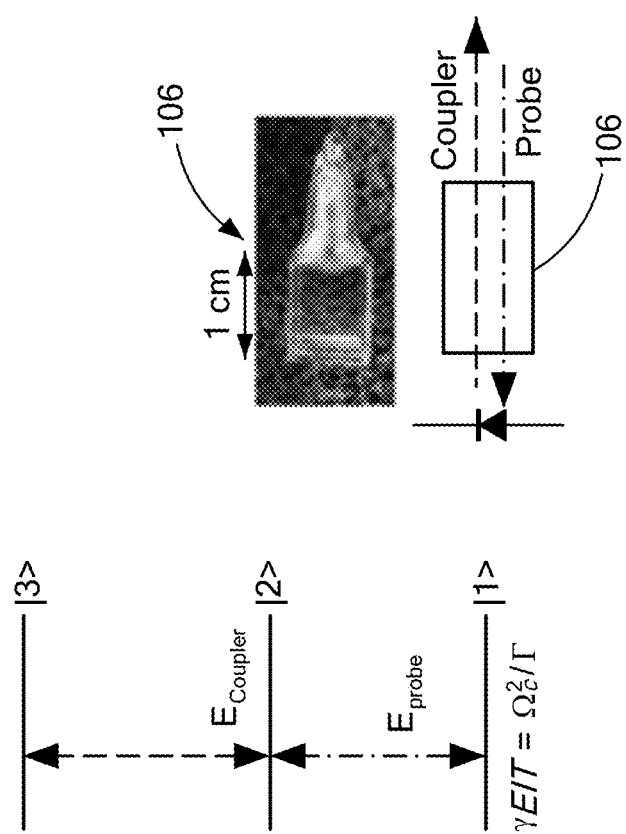
Figure 25A:
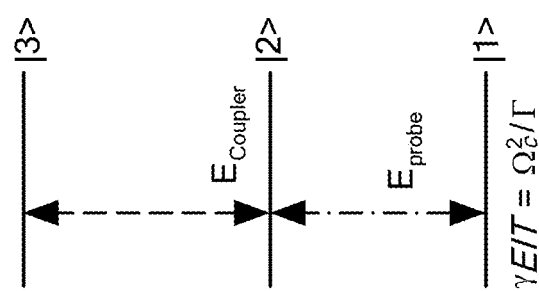

Saturation spectroscopy, depicted in FIG. 25A, is a well-known method to eliminate inhomogeneous line broadening caused by the Doppler effect. It has a vast range of use in science and technology, where it is required to obtain accurate spectroscopic information about atomic and molecular transitions and their shifts caused by external fields. In saturation spectroscopy of alkali atoms in weak magnetic fields, the hyperfine levels of the excited state, symbolically denoted |2> and |2'> in FIG. 25A, are split by less than the Doppler width, leading to multiple saturation peaks and cross-over resonances in the probe-laser spectrum of a given Doppler-broadened absorption line. As known from textbook quantum mechanics, in magnetic fields exceeding a few times 0.1T the hyperfine levels split into multiple Zeeman sublevels and transition from the weak-field (linear Zeeman) regime into the Paschen-Back regime. The resultant saturated-absorption spectra exhibit lines that are considerably more spread out, and cross-over resonances disappear because of the decoupling of nuclear and electronic spins. The absolute line positions and the relative separations between them are excellent magnetic-field markers.

Strong magnetic fields may be measured, in accordance with the present invention, using either standard saturation spectroscopy of Rydberg levels, as depicted in FIGS. 24A-24C, or else using a quantum interference process in which two excitation pathways in a three-level atomic structure destructively interfere and produce an increase in the transmission of one of the utilized laser beams, as shown in FIGS. 25A-25C. In the respective cases, FIG. 24A and FIG. 25A show respective quantum level schemes for the two- and three-level systems, while FIGS. 24B and 25B show coupling of electromagnetic fields into an atomic vapor cell 106. FIG. 24C plots a saturation spectrum of rubidium in a 0.7T magnetic field. The line positions and their relative separations reveal the magnetic field present within the spectroscopic cell.

In the spectroscopic method of EIT depicted in FIGS. 25A-25C, a quantum interference process is used in which two excitation pathways in a three-level atomic structure destructively interfere and produce an increase in the transmission of one of the utilized laser beams. The resultant EIT transmission window presents a convenient optical readout for the atomic energy levels and their response to any external fields (here, a magnetic field). In the Rydberg-EIT cascade scheme, the transparency is formed by a coherent superposition of the ground state and a Rydberg state. Rydberg-EIT has been implemented in both cold atomic gases and in room-temperature vapor cells such as the one depicted in FIG. 1.

The atomic states most relevant to saturation and EIT spectroscopy of rubidium are the $5S_{1/2}$ ground, the $5P_{3/2}$ excited and the $nS_{1/2}$, $nD_{5/2}$ and $nD_{3/2}$ Rydberg states of rubidium. In the magnetic fields of interest, these are all in the Paschen-Back regime of the hyperfine structure. The intermediate state is in the (linear) Zeeman regime of the fine structure, while the Rydberg state typically is in the Paschen-Back regime of the fine structure. Also, the Rydberg state typically has a strong shift due to atomic diamagnetism.

Due to their large size, Rydberg atoms are subject to large diamagnetic shifts. For an S-type Rydberg state the Rydberg-state energy shift is, in atomic units, $$\Delta E_r = m_s B + \frac{B^2}{8} \langle nlm_l | \hat{r}^2 \sin^2 \theta | nlm_l \rangle$$

where n, l, $m_l$, $m_s$ are principal, angular momentum, magnetic orbital and spin quantum numbers, respectively. For S-states, $l=m_l=0$. The coordinates r and q are spherical coordinates of the Rydberg electron (the magnetic field points along z). The shift consists of the spin Zeeman term ($1^{st}$ term on right) and the diamagnetic term ($2^{nd}$ term on right). The respective differential magnetic moments are the negative derivatives with respect to the magnetic field B. Noting that the Bohr magneton is ½, in atomic units, and that the radial matrix element scales as $n^4$, the diamagnetic differential magnetic moment in Bohr magnetons is $n^4 B/2$. In a 1-Tesla field ($4.25 \times 10^{-6}$ in atomic units), the diamagnetic exceeds the paramagnetic (spin) differential dipole moment when n is larger than about 25. At n=50, which is easily accessible, the diamagnetic exceeds the paramagnetic differential dipole moment by a factor of about 16. Hence, in strong magnetic fields the diamagnetic effect of Rydberg atoms affords orders of magnitude of increase in sensitivity to small magnetic field variations. Additional aspects, including the role of quantum-chaotic behavior, are discussed in Ma et al., "*Paschen-Back effects and Rydberg-state diamagnetism in vapor-cell electromagnetically induced transparency*" Phys. Rev. A., vo. 95, 061804(R), (Jun. 27, 2017), incorporated herein by reference.

Figure 21:
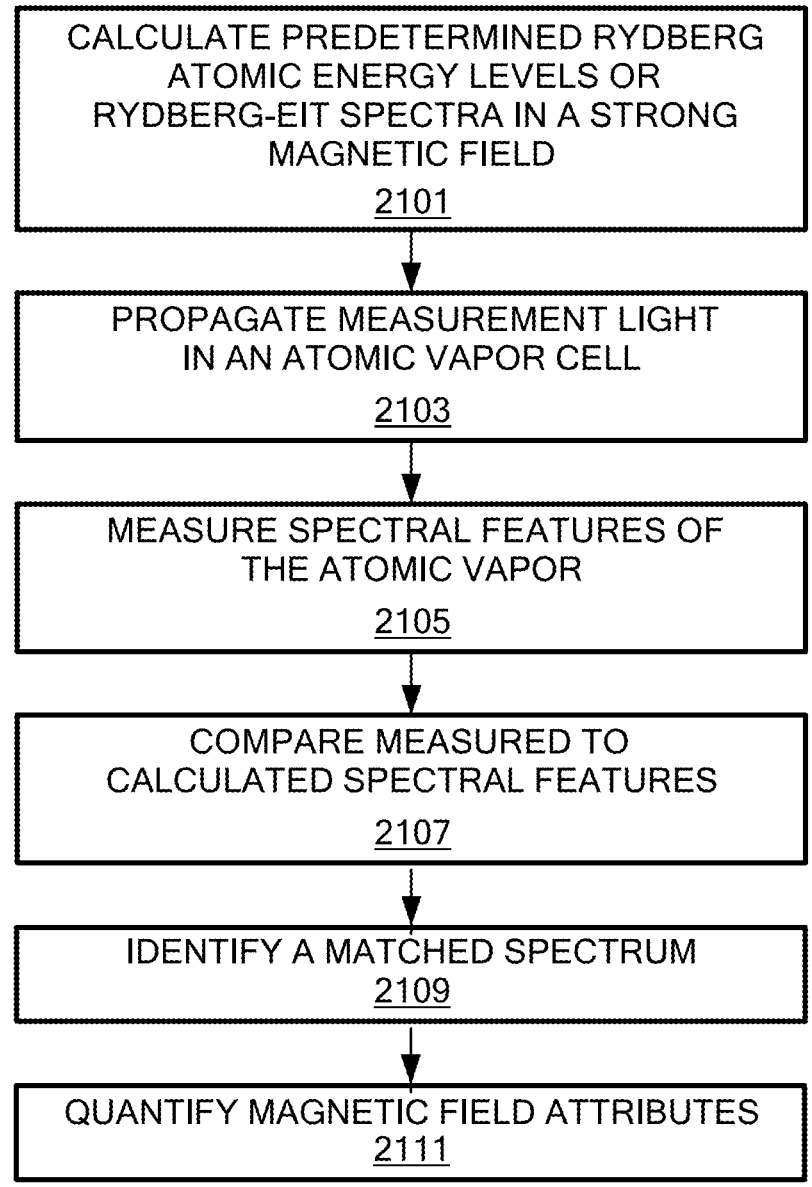
FIG. 21 is a flowchart depicting steps in the Rydberg-EIT measurement of attributes of a magnetic field, made possible for the first time in accordance with an embodiment of the present invention.

Steps in quantifying magnetic field attributes in accordance with an embodiment of the present invention are now described with reference to FIG. 21. In a first step 2101, predetermined Rydberg atomic energy levels or Rydberg-EIT spectra in a strong magnetic field are calculated. FM-modulated measurement light is propagated 2103 in an atomic vapor cell, and spectral features of the atomic vapor are measured 2105. Measured spectral features are compared to calculated spectral features 2107 and a matched spectrum is identified 2109. This provides for quantifying magnetic field attributes 2111.

An Atom-Based Optical RF-Power/Voltage Transducer and Sensor.

Figure 26A:
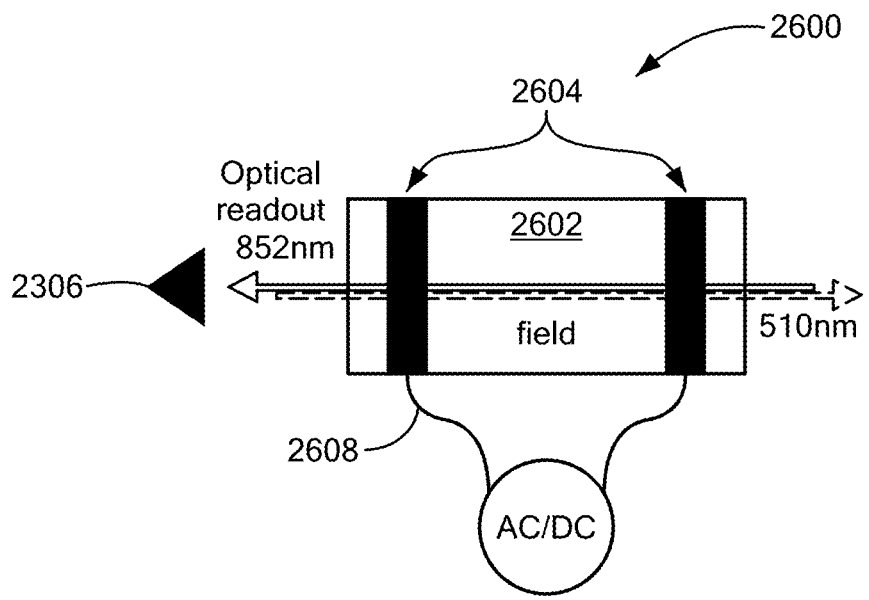
FIG. 26A schematically depicts a hybrid atom-based optical RF-power/voltage transducer and sensor in accordance with an embodiment of the present invention.
Figure 26B:
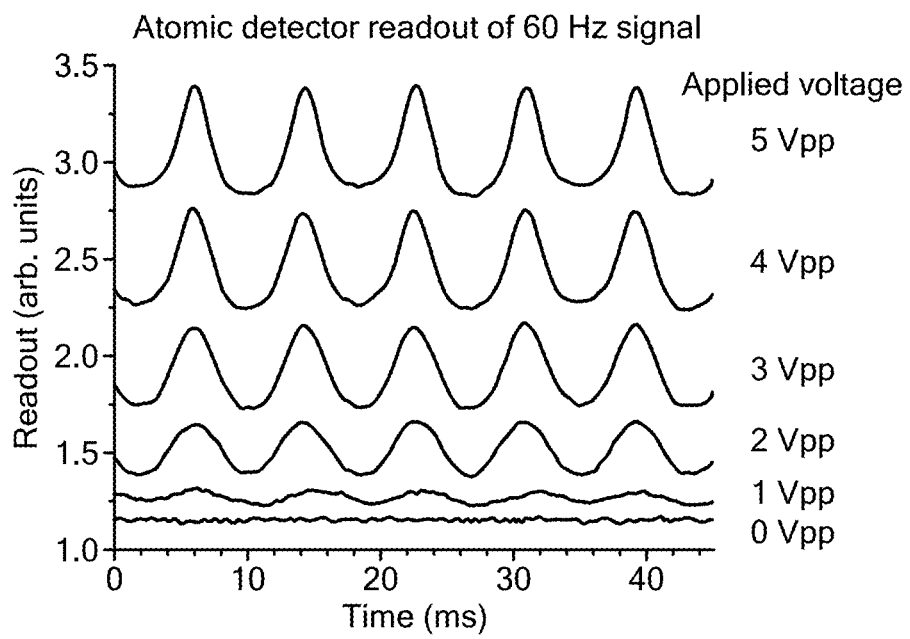
FIG. 26B shows plots of signals obtained at various levels of voltage applied across electrodes of the transducer and sensor.

Another aspect of the present invention is now described with reference to FIGS. 26A and 26B. FIG. 26A schematically depicts a hybrid atom-based optical RF-power/voltage transducer and sensor, designated generally by numeral 2600. Hybrid atom-based optical RF-power/voltage transducer and sensor 2600 employs an atomic vapor cell 2602 with integrated electrodes 2604 that are embedded in an RF receiver or circuit 2608 for the conversion of RF signals of interest into intra-cell electric fields that are measured optically via spectroscopy of field-sensitive atomic states. By direct conversion of RF electrical signals to an atom-mediated optical readout, the atom-based transducer provides high bandwidth (DC to THz) absolute (atomic) measurement of electrical power or voltage. A demonstration of such an atom-based transducer in 60 Hz electrical signal measurement is shown in FIG. 26B and may be advantageously employed as an RF receiver element at the base of an antenna in pick-up of microwaves. In both measurement and receiver cases, the spectroscopic readout of the atomic cell is used to detect and determine the power-equivalent field of the electrical or electromagnetic signal of interest.

FIG. 26B shows plots of readout from the atom-based optical RF power/voltage transducer for a 60 Hz electrical signal applied to the electrodes for six voltage levels. The optical lasers are near-resonant to a field-sensitive atomic Rydberg state and the transmission of the probe laser through the vapor is detected. The field-equivalent power is then determined by comparison of the detected transmission signal to the known atomic response. From the detailed geometry of the chosen electrodes and structure, and the electrical and thermal properties of the chosen materials used, the atomic detector readout may be used for an atomic calibration of the RF power/voltage.

Figure 27A:
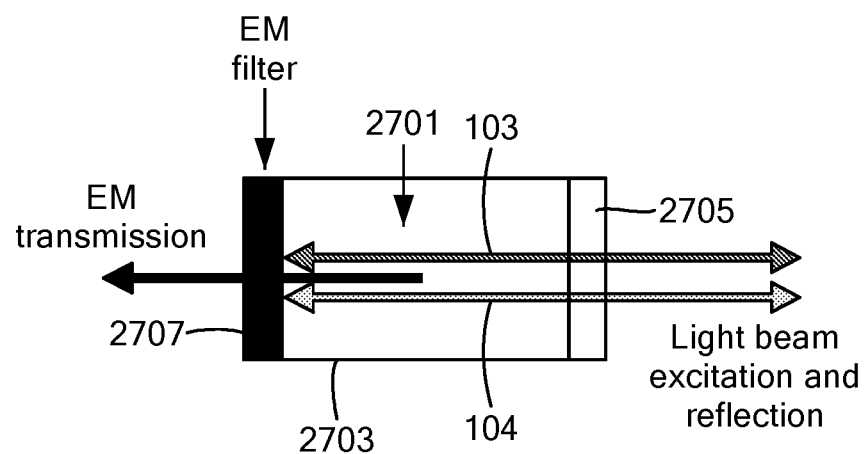
FIG. 27A schematically depicts an atomic vapor-cell compartment with opposing windows for wavelength-selective transmission of electromagnetic waves, in accordance with an embodiment of the present invention.
Figure 27B:
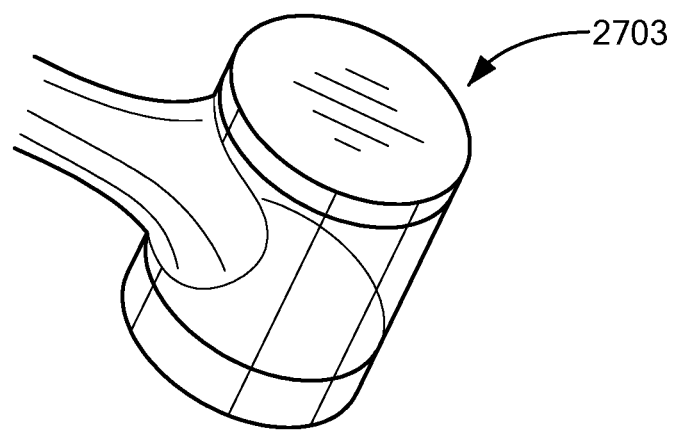
FIG. 27B shows an image of the atomic vapor-cell compartment of FIG. 27A.

An atom-based optical RF-power/voltage transducer and sensor, designated generally by numeral 2700 and described with reference to FIGS. 27A and 27B. Atom-based optical RF-power/voltage transducer and sensor 2700 consists of a small, cylindrical cesium vapor cell with integrated internal conductive plates. The conductive plates, or electrodes, are 0.5 mm thick rings spaced 4 mm apart and each fused to the cell body on one of their sides and to windows on the other. As a result, the total path length through the cell is 5 mm. The inner and outer diameters of the cell are 3.4 mm and 5 mm, respectively, while the inner and outer diameters of the electrode rings are 2 mm and 5 mm, respectively. Thus, two 0.7-mm thick ring electrodes are embedded within the vapor cell to which external electrical connections are made.

An atomic vapor 2701 is contained within an atomic vapor-cell compartment 2703 with a window 2705 that is transparent to optical beams used for excitation of atoms to Rydberg states and another integrated window 2707 that is transparent to EM fields generated by the optically excited atomic medium for extraction of the generated EM field. An EM filter 2710 precludes transmission of Rydberg EIT probe and coupler beams 103 and 104.

Embodiments of the invention described herein are intended to be merely exemplary; variations and modifications will be apparent to those skilled in the art. All such variations and modifications are intended to be within the scope of the present invention as defined in any appended claims.

Additional teachings relating to the subject matter of the present invention may also be found in the following publications, incorporated herein by reference:

Anderson et al., "*A vapor-cell atomic sensor for radio-frequency field detection using a polarization-selective field enhancement resonator,*" *Appl. Phys. Lett.*, vol. 113, 073501 (2018)

Simons et al., "*Electromagnetically Induced Transparency (EIT) and Autler-Townes (AT) splitting in the presence of band-limited white Gaussian noise,*" *J. Appl. Phys.*, vol. 123, 203105 (2018).

We claim:

1. A sensor for at least one of detecting and measuring a parameter characterizing a first electromagnetic field, the sensor comprising:
   a. an excitation source;
   b. an enclosure containing a gas of atoms and/or molecules of which at least a subset may be excited by the excitation source into a distribution of Rydberg states;
   c. a detector, disposed to detect a probe beam after traversal of the gas by the probe beam, for generating a phase-sensitive detector signal; and
   d. a processor configured to derive a parameter characterizing the first electromagnetic field based on an effect of the parameter on the distribution of Rydberg states.

2. A sensor in accordance with claim 1, wherein the phase-sensitive detector signal is sensitive to a phase characterizing the first electromagnetic field.

3. A sensor in accordance with claim 1, wherein the phase-sensitive detector signal is sensitive to a phase of transitions between Rydberg states characterized by a specified Rabi frequency.

4. A sensor in accordance with claim 1, wherein the parameter varies continuously in time.

5. A sensor in accordance with claim 1, wherein the gas includes a molecular vapor.

6. A sensor in accordance with claim 1, wherein the excitation source is specially configured to induce transitions between Rydberg states at a specified Rabi frequency.

7. A sensor in accordance with claim 1, wherein the atoms are chosen from a group of atoms including rubidium, cesium, alkali, and alkali earth atoms.

8. A sensor in accordance with claim 1, wherein the parameter of the first electromagnetic field is the propagation direction.

9. A sensor in accordance with claim 1, wherein the parameter of the first electromagnetic field is at least one of an amplitude, frequency, phase, or polarization.

10. A sensor in accordance with claim 1, wherein the parameter of the first electromagnetic field is the modulation of at least one of amplitude, frequency, phase, or polarization.

11. A sensor in accordance with claim 1, wherein the parameter of the first electromagnetic field is the phase of the first electromagnetic field relative to a fiduciary phase.

12. A sensor in accordance with claim 1, further comprising a second electromagnetic field placed into interferometric relation with the first electromagnetic field.

13. A sensor in accordance with claim 1, wherein the phase of the first electromagnetic field is relative to an RF modulated optical beam.

14. A sensor in accordance with claim 1, wherein the parameter of the first electromagnetic field is a time-varying electric field amplitude.

15. A sensor in accordance with claim 1, wherein traversal of the enclosure by the probe beam includes reflection of the probe beam.

16. A sensor in accordance with claim 15, wherein traversal of the enclosure by the probe beam includes retro-reflection of the probe beam.

17. A sensor in accordance with claim 1, wherein the source of excitation for exciting atoms of the gas into a Rydberg state comprises at least one light beam.

18. A sensor in accordance with claim 1, wherein the light beams establish one of an electromagnetically induced transparency and electromagnetically induced absorption in the gas.

19. A sensor in accordance with claim 1, wherein the probe beam is a light beam.

20. A sensor in accordance with claim 19, wherein the probe beam is a laser beam.

21. A sensor in accordance with claim 1, wherein the probe beam enters and exits an identical side of the enclosure.

22. A sensor in accordance with claim 1, wherein the enclosure includes a vapor cell comprising a dielectric material.

23. A sensor in accordance with claim 22, wherein the dielectric material is glass.

24. A sensor in accordance with claim 1, wherein the sensor further comprising a light-absorbing surface thermally coupled to the gas.

25. A sensor in accordance with claim 1, wherein the first electromagnetic field is an incoherent field.

26. A sensor in accordance with claim 1, wherein the parameter of the first electromagnetic field is noise.

27. A sensor in accordance with claim 1, wherein the enclosure is compartmented.

28. A sensor in accordance with claim 27, wherein the enclosure is linearly compartmented.

29. A sensor in accordance with claim 27, wherein the enclosure is arealy compartmented.

30. A sensor in accordance with claim 1, wherein the sensor further comprises a first waveguide for coupling at least one beam into the gas and a second waveguide for collecting the probe beam after interaction of the probe beam with the gas.

31. A sensor in accordance with claim 30, wherein the second waveguide and the first waveguide are identical.

32. A sensor in accordance with claim 30, wherein at least one of the first and second waveguides is an optical fiber, optical waveguide, or metamaterial waveguide.

33. A sensor in accordance with claim 30, wherein the first waveguide couples the probe beam and radiation from the source of excitation into the atomic vapor.

34. A system for imaging a parameter of an RF field, the system comprising:
  a. an excitation source;
  b. an enclosure containing a gas of atoms and/or molecules configured to interact with the RF field, of which at least a subset may be excited by the excitation source into a distribution of Rydberg states;
  c. a detector, disposed to detect a probe beam after traversal of the gas by the probe beam, for generating a position-sensitive detector signal; and
  d. a processor configured to analyze the parameter of the RF field based on effects of the RF-field on the distribution of Rydberg states.

35. A system in accordance with claim 34, wherein the parameter of the RF field is one of amplitude, frequency, modulation, polarization and phase of the RF field.

36. A system in accordance with claim 34, wherein the RF field includes an incoherent RF field characterized by a spatial distribution.

37. A system in accordance with claim 36, wherein the incoherent RF field includes noise.

38. A system in accordance to claim 34, wherein the RF field is an RF signal or an RF waveform characterized by more than one frequency, phase, amplitude, polarization, direction, modulation, or time-varying parameter.

39. A system in accordance with claim 34, wherein the detector is an optical detector.

40. A system in accordance with claim 34, wherein the detector is a camera.

41. A method in accordance with claim 34, wherein the enclosure is compartmented.

42. A method in accordance with claim 41, wherein the enclosure is linearly compartmented.

43. A method in accordance with claim 41, wherein the enclosure is arealy compartmented.

44. A system in accordance with claim 34, wherein traversal of the enclosure by the probe beam includes reflection of the probe beam.

45. A system in accordance with claim 44, wherein traversal of the enclosure by the probe beam includes retro-reflection of the probe beam.

46. A monolithic sensor for detecting and/or measuring a parameter characterizing an electromagnetic field, the sensor comprising:
  a. an atomic vapor contained within an enclosure that includes a dielectric material;
  b. a source of excitation for exciting atoms of the atomic vapor into a distribution of Rydberg states; and
  c. a first waveguide for coupling a beam into the atomic vapor a second waveguide for collecting the beam after interaction of the beam with the atomic vapor.

47. A monolithic sensor in accordance with claim 46, wherein the second waveguide is the first waveguide.

48. A monolithic sensor in accordance with claim 46, wherein the beam coupled into the atomic vapor includes a probe beam.

49. A monolithic sensor in accordance with claim 46 wherein a plurality of beams are coupled into the atomic vapor by the first waveguide.

50. A monolithic sensor in accordance with claim 46, wherein the enclosure is compartmented.

51. A monolithic sensor in accordance with claim 46, wherein the enclosure is linearly compartmented.

52. A monolithic sensor in accordance with claim 46, wherein the enclosure is arealy compartmented.

53. A monolithic sensor in accordance with claim 46, wherein a distinct probe beam is coupled into each of an array of compartments.

54. A monolithic sensor in accordance with claim 53, wherein the distinct probe beam is coupled into each of the array of compartments via an array of optical elements.

55. A monolithic sensor in accordance with claim 53, wherein the distinct probe beam is collected after interaction with the atomic vapor and coupled to a detector element via the array of optical elements.

56. A monolithic sensor in accordance with claim 46, wherein the enclosure includes a light-absorbing surface, and further comprises a temperature regulator.

* * * * *